United States Patent
McGowan et al.

(10) Patent No.: US 9,170,002 B2
(45) Date of Patent: Oct. 27, 2015

(54) HOLDER AND LED MODULE USING SAME

(71) Applicant: Molex Incorporated, Lisle, IL (US)

(72) Inventors: Daniel B. McGowan, Glen Ellyn, IL (US); Gregory P. Meyer, Elk Grove Village, IL (US)

(73) Assignee: Molex, LLC, Lisle, IL (US)

( * ) Notice: Subject to any disclaimer, the term of this patent is extended or adjusted under 35 U.S.C. 154(b) by 129 days.

(21) Appl. No.: 13/733,998

(22) Filed: Jan. 4, 2013

(65) Prior Publication Data

US 2013/0176732 A1   Jul. 11, 2013

Related U.S. Application Data

(60) Provisional application No. 61/583,270, filed on Jan. 5, 2012, provisional application No. 61/585,325, filed on Jan. 11, 2012, provisional application No. 61/587,997, filed on Jan. 18, 2012, provisional application No. 61/672,084, filed on Jul. 16, 2012, provisional application No. 61/732,754, filed on Dec. 3, 2012.

(51) Int. Cl.
| | |
|---|---|
| *F21V 21/00* | (2006.01) |
| *H05K 1/11* | (2006.01) |
| *H05K 3/00* | (2006.01) |
| *F21V 19/00* | (2006.01) |
| *F21V 29/77* | (2015.01) |
| *F21Y 101/02* | (2006.01) |

(52) U.S. Cl.
CPC ............... *F21V 21/00* (2013.01); *F21V 19/003* (2013.01); *F21V 19/0055* (2013.01); *F21V 29/77* (2015.01); *H05K 1/111* (2013.01); *H05K 3/0061* (2013.01); *F21Y 2101/02* (2013.01); *H05K 2201/09027* (2013.01)

(58) Field of Classification Search
CPC ... F21V 21/00; F21V 19/0025; F21V 19/003; F21V 19/004; F21V 29/77
See application file for complete search history.

(56) References Cited

U.S. PATENT DOCUMENTS

| | | | |
|---|---|---|---|
| 8,926,135 B2* | 1/2015 | Zaderej et al. | 362/249.05 |
| 2007/0230182 A1* | 10/2007 | Tai et al. | 362/294 |
| 2008/0062698 A1* | 3/2008 | Tai et al. | 362/294 |
| 2008/0144320 A1 | 6/2008 | Tokunaga | |
| 2010/0002450 A1* | 1/2010 | Pachler et al. | 362/311.02 |
| 2011/0147785 A1* | 6/2011 | Kim | 257/99 |
| 2012/0206921 A1* | 8/2012 | Chang et al. | 362/311.02 |
| 2013/0334953 A1* | 12/2013 | Keser et al. | 313/46 |
| 2015/0109801 A1* | 4/2015 | McGowan et al. | 362/370 |

FOREIGN PATENT DOCUMENTS

JP        10-163261 A    6/1998

* cited by examiner

*Primary Examiner* — Gary Paumen

(57) ABSTRACT

A holder is provided that include a base with an aperture. An LED array with an LED emitter can be positioned so that the LED emitter is in the aperture. The holder includes pads that can be soldered to surface contacts on the LED array. The holder further includes contacts that are electrically connected to the pads. The pads and contacts can be provided by terminals that insert molded into the base. The base can include an integrated connector that has the contacts of the terminals extend therein.

12 Claims, 55 Drawing Sheets

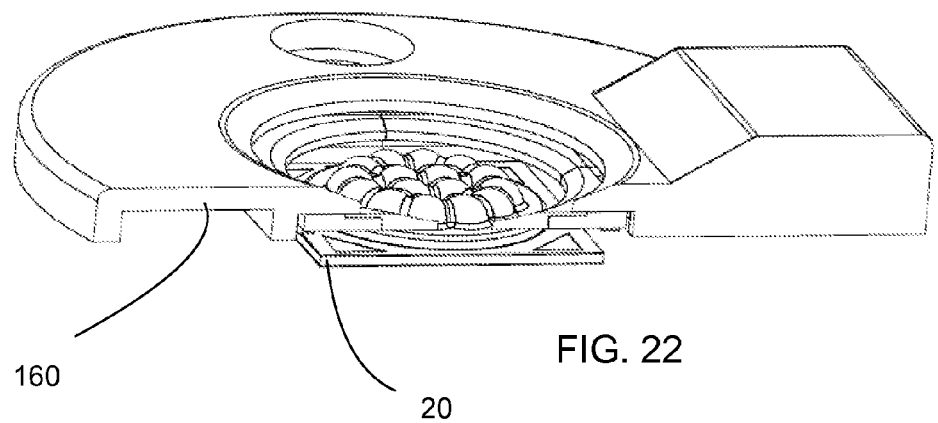
FIG. 22
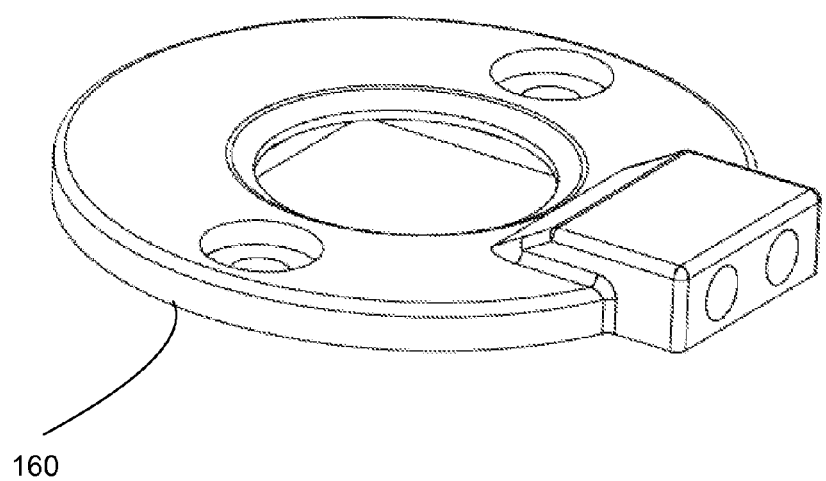
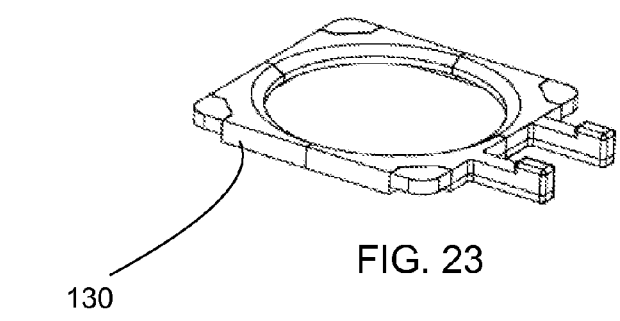
FIG. 23

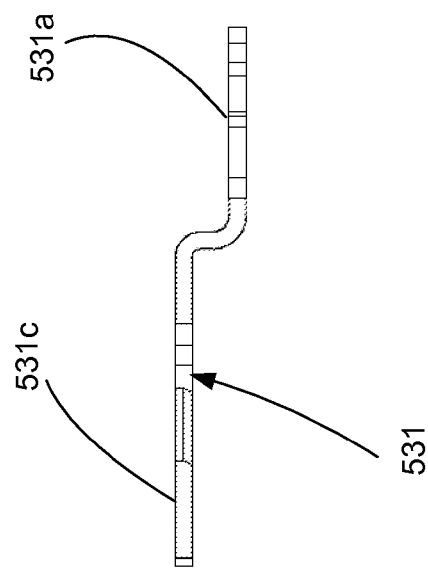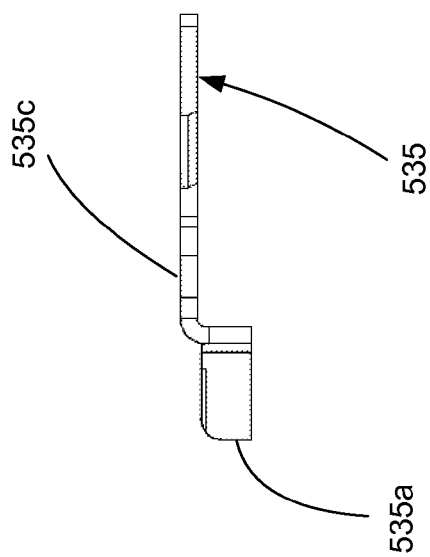
FIG. 65

HOLDER AND LED MODULE USING SAME

RELATED APPLICATIONS

This application claims priority to U.S. Provisional Application Nos. 61/583,270, filed Jan. 5, 2012; 61/585,325, filed Jan. 11, 2012; 61/587,997, filed Jan. 18, 2012; 61/672,084, filed Jul. 16, 2012, and 61/732,754, filed Dec. 3, 2012 all of which are incorporated herein by reference in their entirety.

FIELD OF THE INVENTION

The present invention relates to the field of light emitting diode (LED) technology, more specifically to designs suitable for use in high volume applications.

DESCRIPTION OF RELATED ART

LED arrays have been provided by a number of companies. For example, BRIDGEUX provides a number of LED arrays that can meet a wide range of illumination needs. However, one issue that remains is the cost of LED array is still expensive due to manufacturing constraints. This causes the resultant system (such as a bulb) to be priced at a level that makes it unattractive to consumers. Therefore substantial efforts are underway to reduce the cost of the LED array.

One feature that tends to make LED arrays expensive is the substrate that supports the LEDs. The substrate provides a number of benefits for the LED array and is necessary to support the LEDs. However, the substrate creates some problems from an application standpoint because it is expensive when made large but difficult to handle when made small. In addition, existing holders often tend to either require a bare wire be inserted into a wire trap to receive a wire or require that a wire be soldered to the LED array. While these configurations are acceptable for certain applications, other applications would benefit from easier ways to make an electrical connection to the LED array. Thus certain individuals would appreciate improvements to a holder that can support an LED array.

BRIEF SUMMARY

A holder is provided that can be soldered directly to an LED array. The holder includes two or more terminals that have pads configured to be soldered to contacts on an LED array and contacts configured to be connected to a power source. The contacts can be configured to be soldered to and can also be configured to engage a mating connector. The holder can include an integrated connector with two contacts. If desired the integrated connector can include a recess and the two contacts can extend into the recess.

A LED module includes an LED array and a holder soldered to the LED array. The holder can include contacts that allow the LED module to be readily mounted in a receptacle. The holder can also include an integrated connector. If the LED array has contacts arranged on a top surface of the LED array, the holder can include contacts aligned in other areas so as to allow different connection configurations. The holder can include an integrated connector that allows for

BRIEF DESCRIPTION OF THE DRAWINGS

The present invention is illustrated by way of example and not limited in the accompanying Figs. in which like reference numerals indicate similar elements and in which:

FIG. 22 illustrates another perspective view of the embodiment depicted in FIG. 21.

FIG. 23 illustrates a partially exploded perspective view of an embodiment of a cover and a holder.

FIG. 65 illustrates an elevated side view of the terminals depicted in FIG. 64.

DETAILED DESCRIPTION

Figure 1:
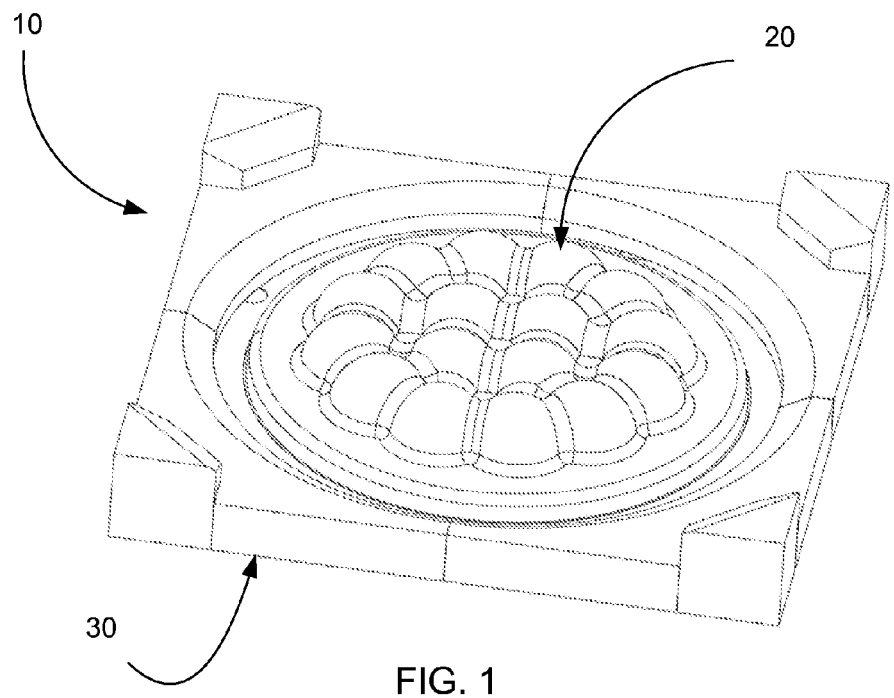
FIG. 1 illustrates a perspective view of an embodiment of a LED module.

The detailed description that follows describes exemplary embodiments and is not intended to be limited to the expressly disclosed combination(s). As can be appreciated, certain features are shown in conjunction with particular embodiments but are not so limited in application. Therefore, unless otherwise noted, features disclosed herein may be combined together to form additional combinations that were not otherwise shown for purposes of brevity.

LED modules and potential applications are discussed below. As can be appreciated, LEDs are becoming more and more efficient and with the use of an array it is becoming straightforward to obtain enough light from a LED array so as to provide illumination for a number of applications such as down lights and conventional bulbs. It has been determined, however, that as efficiency continues to improve the potential size of the LED becomes problematic because the array will become small enough to make handling challenging. In addition, even with relatively high efficiencies it is expected that 6-8 watts of power will be required to provide an output in the range of 800 lumens. Thus it is unlikely that a design can be provided that does not include a robust thermal solution.

It should also be noted that any desired LED array could be used. In practice it has been determined that smaller LED arrays (those smaller than 15 mm×15 mm) benefit the most for the depicted holders. This is because such small LED arrays are problematic to handle in conventional light fixture environment and are more difficult to integrate into larger assemblies. Thus, while the features are not limited to particularly sized LED arrays unless otherwise noted, it is expected that the greatest benefit will be appreciated by smaller LED arrays.

As can be appreciated, an LED module comprises an LED array and a holder that provides connectivity and allows the LED array to be mounted in a desired location in a simple and straightforward manner. For certain applications, the LED module can be soldered into position. In other applications it may be more desirable to have an LED module that can be mounted in a receptacle without the need to solder wires.

FIGS. 1-9 illustrate details of an embodiment of a LED module 10 with a LED array and a holder 30. As can be appreciated, the details that are provided regarding the LED array 20 are exemplary. Thus, the depicted solution is not limited to the LED array depicted but instead is applicable to any LED array that includes a plate 22 with an insulative layer 24 that includes contacts 28a, 28b (which may also be referred to as surface contacts) and an LED emitter 26 (which will includes one or more LED chips and may be covered by a phosphorus layer). As can be appreciated, the design is well suited for use LED array that has top mounted contacts. A thermal layer 23 can be added to the plate 22 so as to reduce thermal resistance between the plate 22 and a supporting surface (which may function as a heat sink). Indeed, in most applications the thermal layer will be desirable and while not discussed with respect to the other embodiments, it is contemplated that a thermal layer would often be included with a resulting module. The thermal layer 23 can be configured to provide a low thermal resistance between the plate 22 and a supporting surface. In addition, the thermal layer 23 can be insulative so as provide electrical isolation. In many applications the thermal layer can be sized slightly larger than the plate so as to ensure suitable creepage/clearance. For ease of installation, the thermal layer can include an adhesive side that readily secures the thermal layer to the plate.

The holder 30 includes a base 32, which can be formed of an insulative material such as a desirable resin, with an outer edge 32a and an aperture 33 that is aligned with the LED emitter 26. The aperture 33 may include an angled surface. The holder includes terminals 35 that are electrically connected to contacts on the LED array 20 via pads 35b. Terminal 35 is a form of a terminal that is plated onto the base 32 and includes contacts 35a, 35c and the pad 35b that are connected by bridge 35d. Alternative embodiments, as will be discussed below, can include more convention terminal designs. As can be appreciated, however, a number of the depicted embodiments include a holder that includes integral terminals (either formed directly on the surface of the holder or insert molded into the holder). The ability to integrate the terminals into the holder while providing an aperture that allows for compact securing of the LED array is beneficial in a number of applications. One benefit is that the holder can be configured so as to include an integral connector system that is configured to mate with another connector. Such a configuration can substantially improve the ability to package the LED module 10 in an application.

Figure 3:
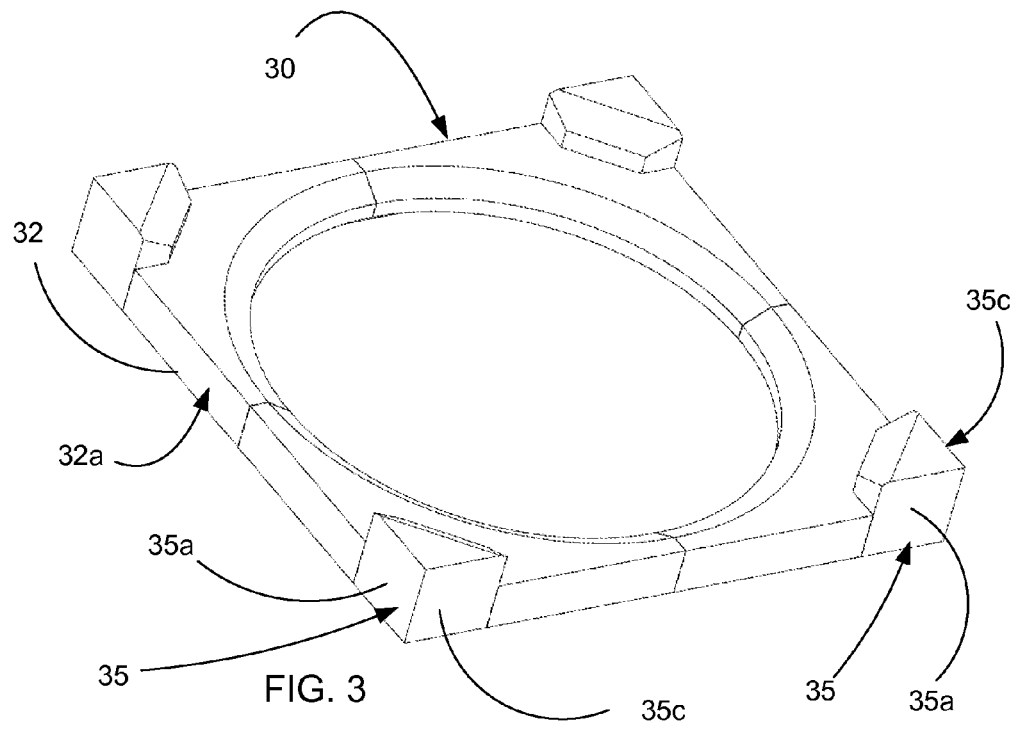
FIG. 3 illustrates a perspective view of an embodiment of a holder.
Figure 2:
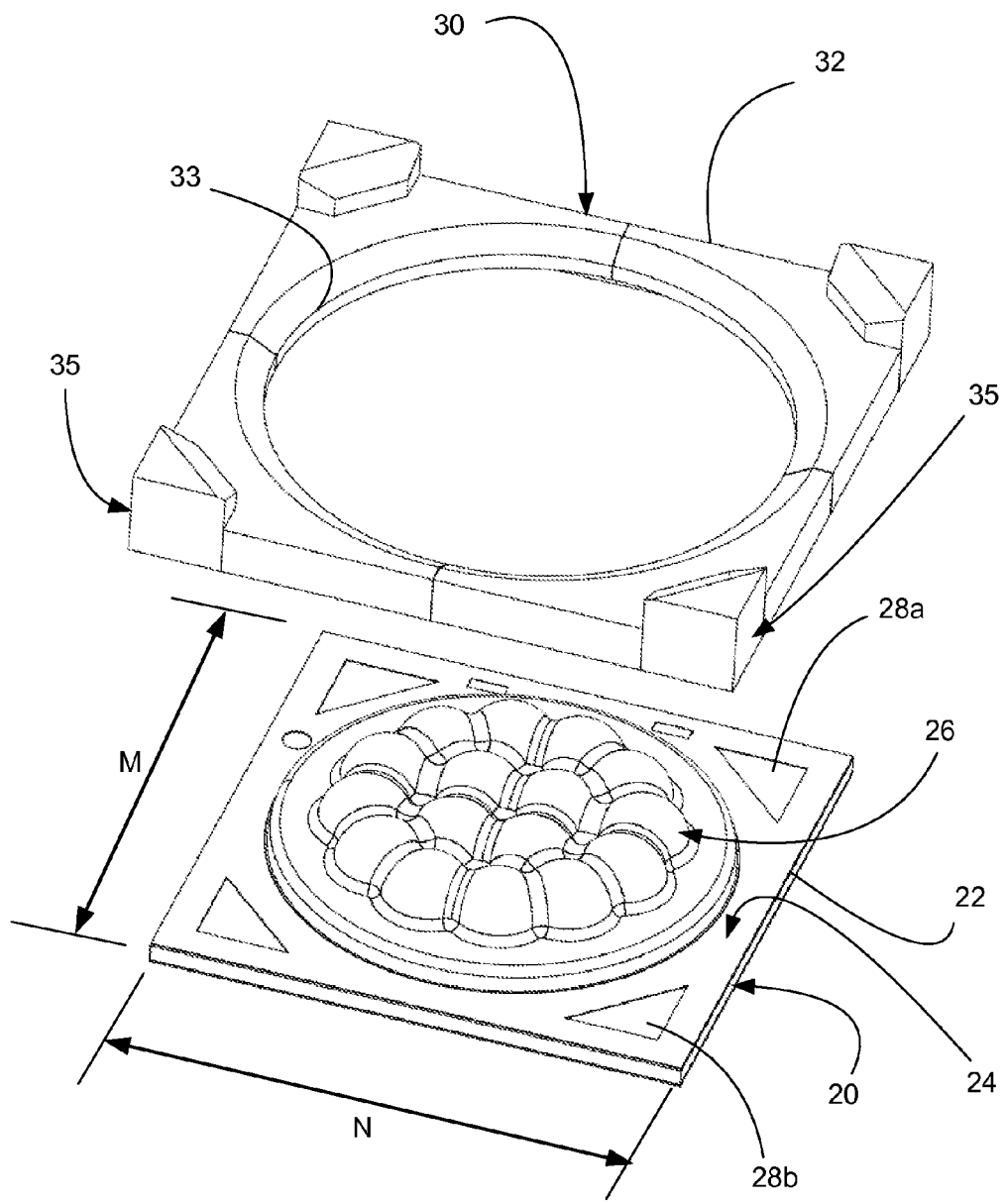
FIG. 2 illustrates a perspective partially exploded view of the embodiment depicted in FIG. 1.
Figure 4:
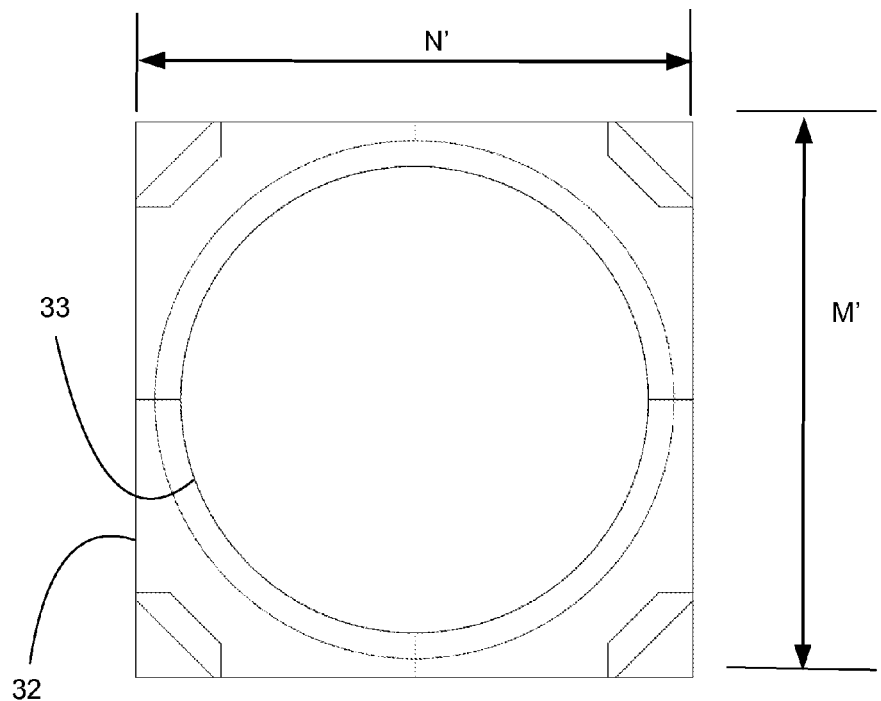
FIG. 4 illustrates a top view of the holder depicted in FIG. 3.
Figure 5:
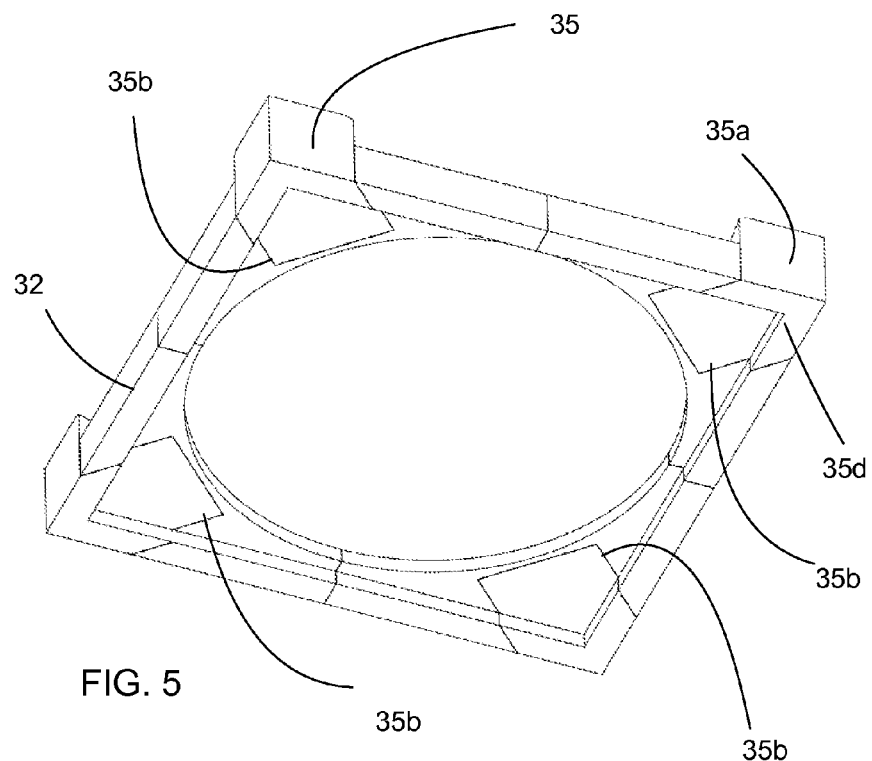
FIG. 5 illustrates another perspective view of the embodiment depicted in FIG. 3.
Figure 6:
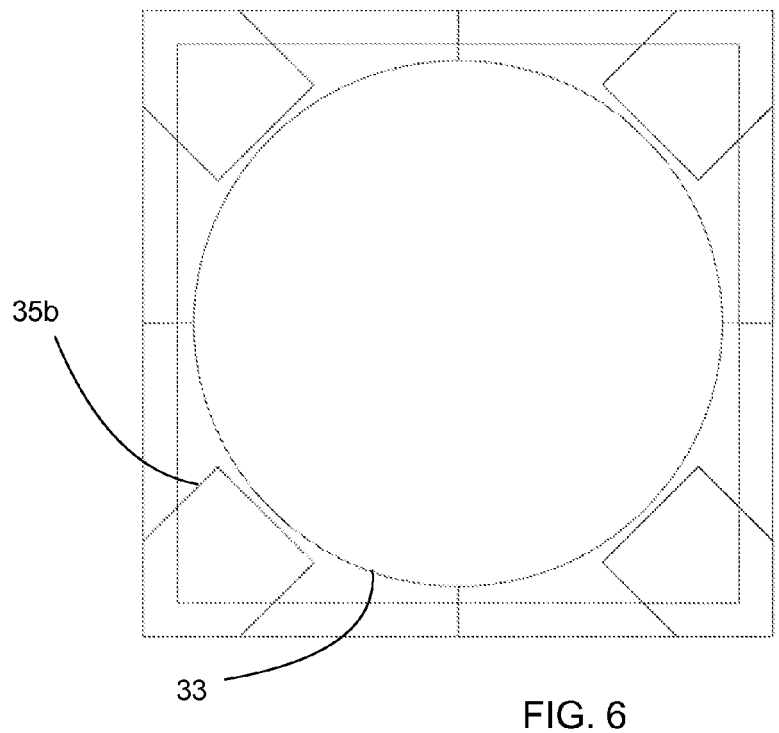
FIG. 6 illustrates a bottom view of the holder depicted in FIG. 3.
Figure 7:
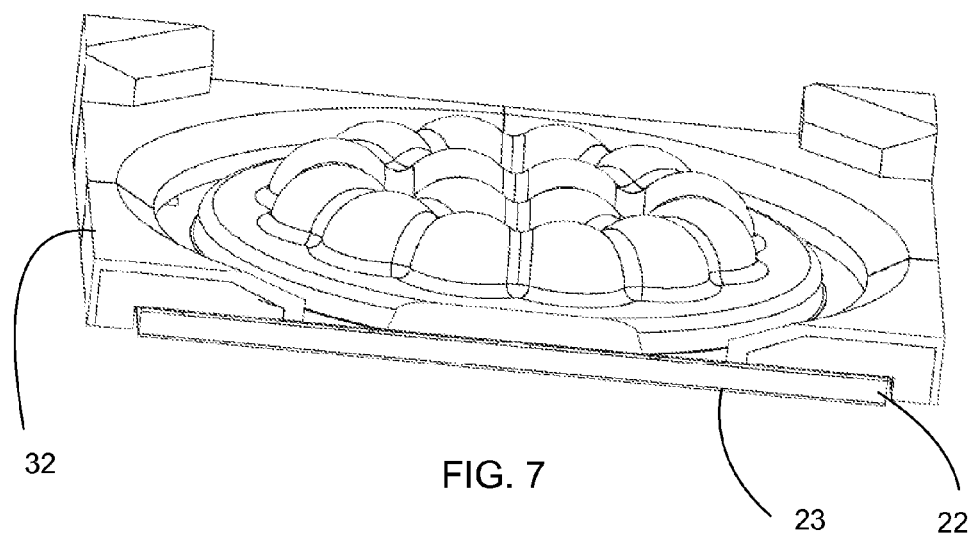
FIG. 7 illustrates a perspective view of an cross section of the embodiment depicted in FIG. 1.
Figure 8:
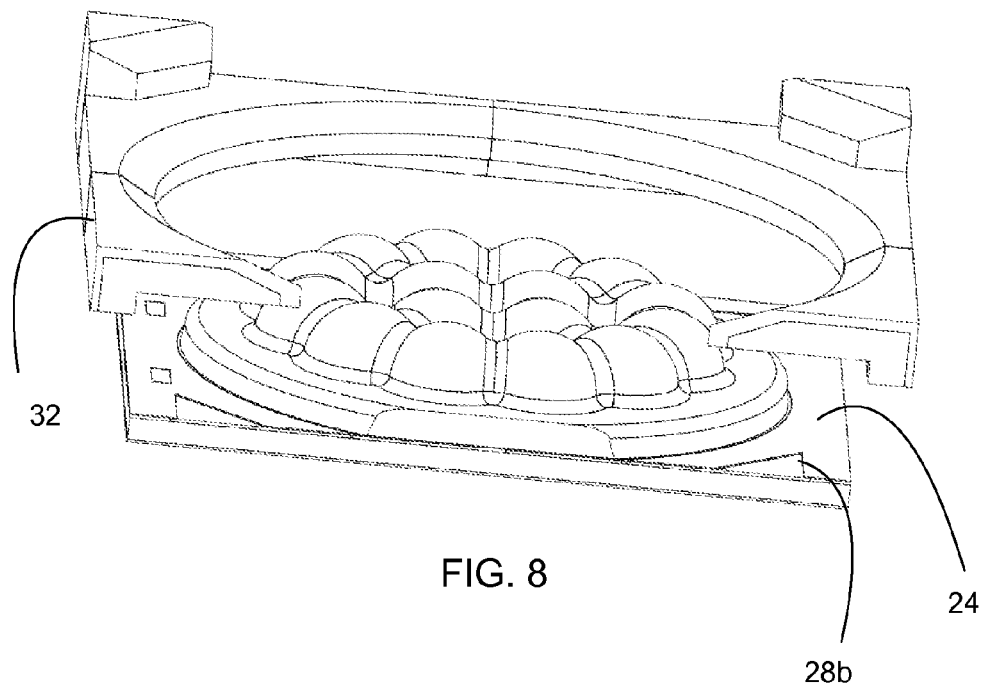
FIG. 8 illustrates a partially exploded perspective view of the embodiment depicted in FIG. 7.
Figure 9:
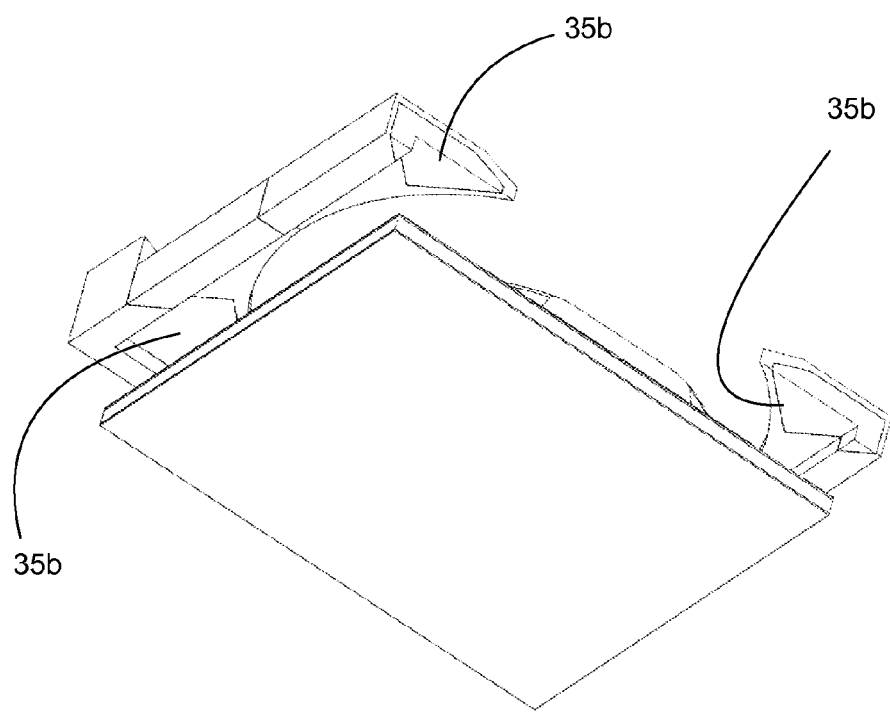
FIG. 9 illustrates another perspective view of the embodiment depicted in FIG. 8.

As can be appreciated from FIGS. 1-3, if the contacts on the LED array 20 are considered as being horizontal, the holder 30 can provide vertical contacts (e.g., the contacts on the array can be perpendicular to the contacts on the holder). One benefit of this is that it allows the holder to be inserted vertically into a receptacle, which is beneficial for automated operations and to address other packaging constraints. This allows a relatively compact package (where the area defined N×M is less than 150 mm$^2$) such that the area N'×M' can be less than 200 mm$^2$. For larger modules, such as the star packages discussed below, the LED array, including the integrated connector, can be less than 500 mm$^2$. Naturally, increasing the size of the module may desirable and will be necessary for larger LED arrays.

Figure 10:
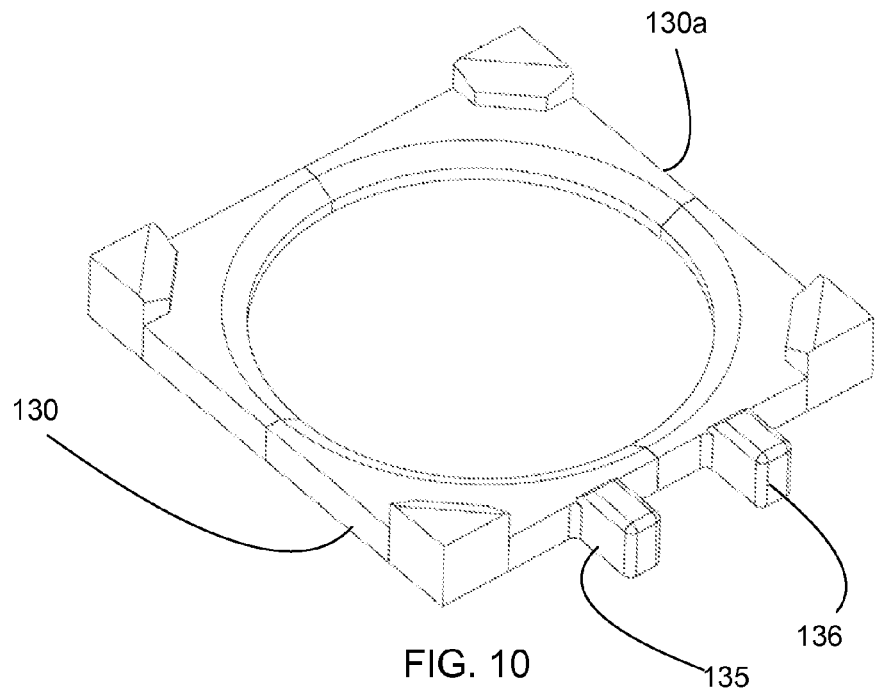
FIG. 10 illustrates a perspective view of another embodiment of a holder.
Figure 11:
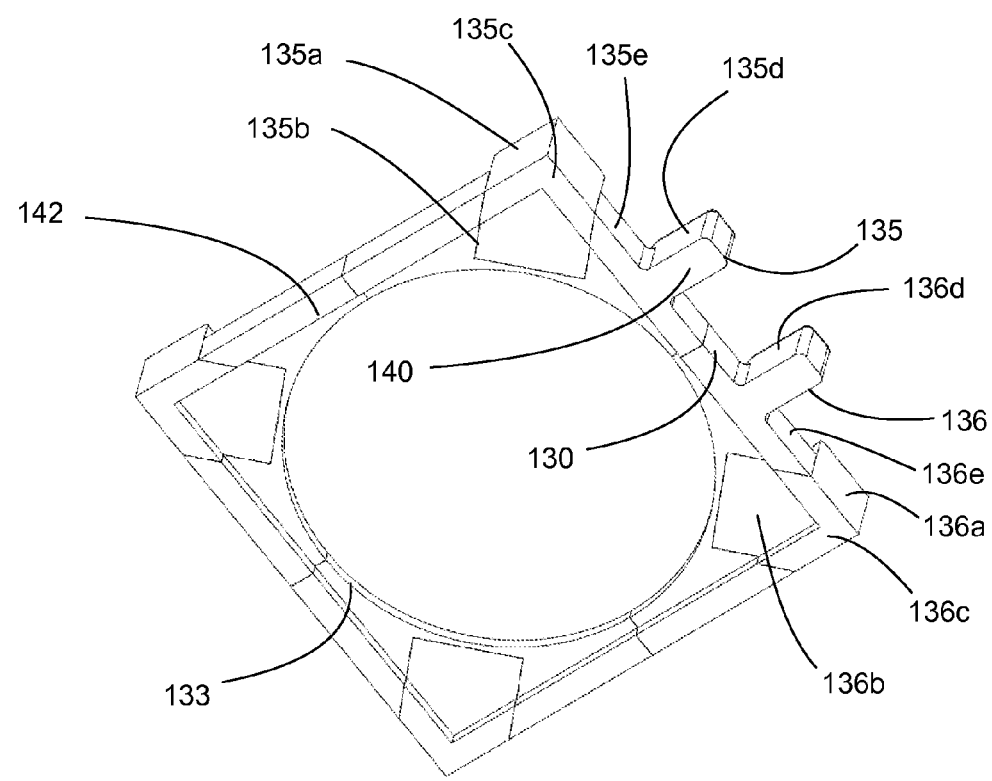
FIG. 11 illustrates another perspective view of the embodiment depicted in FIG. 10.

FIGS. 10 and 11 illustrate an embodiment of a holder 130 that includes projecting terminals 135, 136 that are suitable for vertical engagement with a mating connector. In certain views the holder (as well as other holder embodiments) is depicted as being the combination of four quarters. While such a construction is possible, in most applications the holder will be a one-piece construction formed via a molding process and thus the parting lines, unless otherwise noted, may be ignored.

Figure 27:
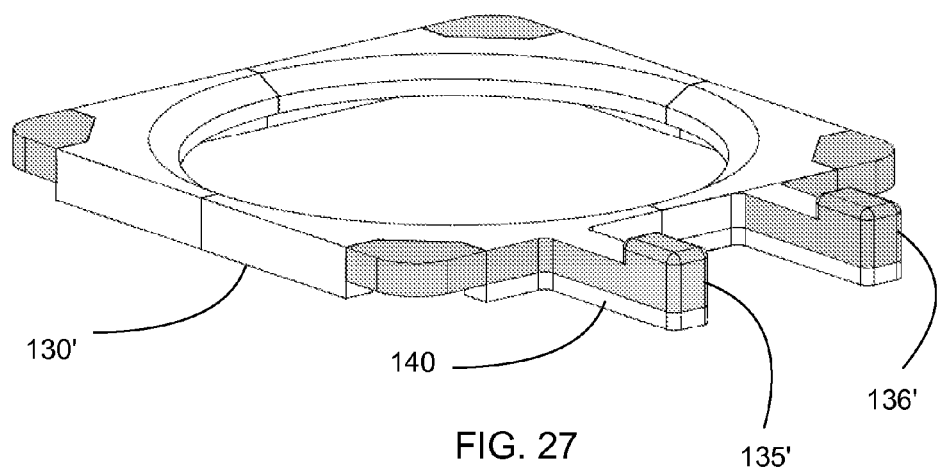
FIG. 27 illustrates a perspective view of an embodiment of a holder.
Figure 28:
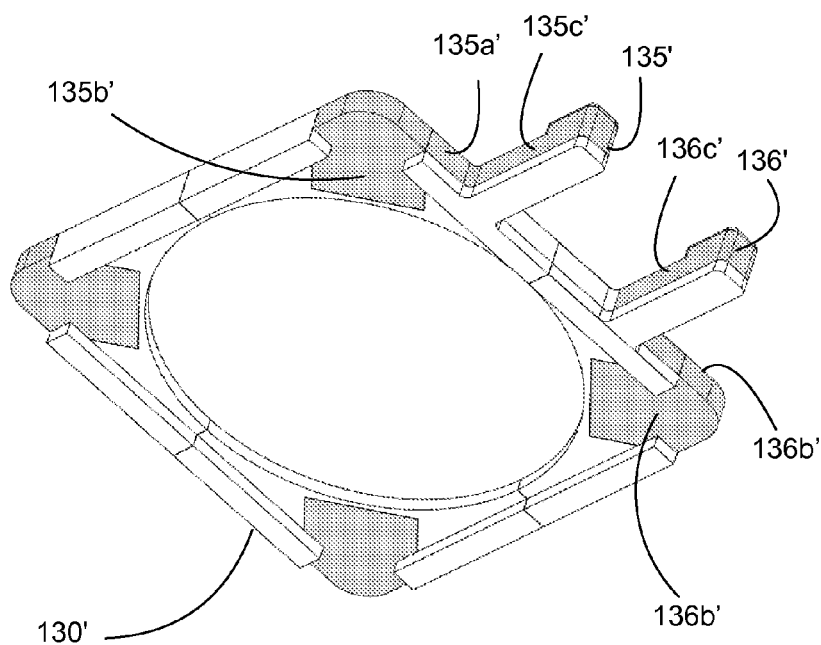
FIG. 28 illustrates another perspective view of the holder depicted in FIG. 27.
Figure 29:
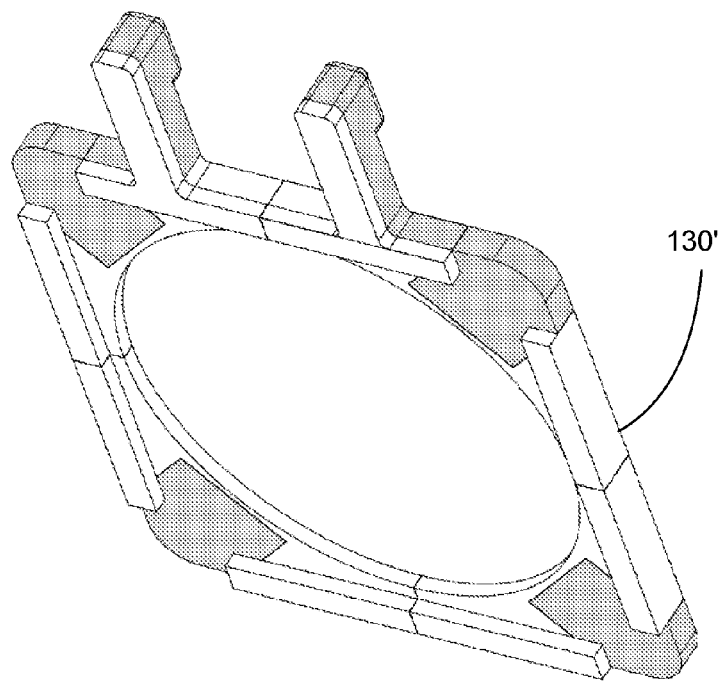
FIG. 29 illustrates another perspective view of the holder depicted in FIG. 27.
Figure 30:
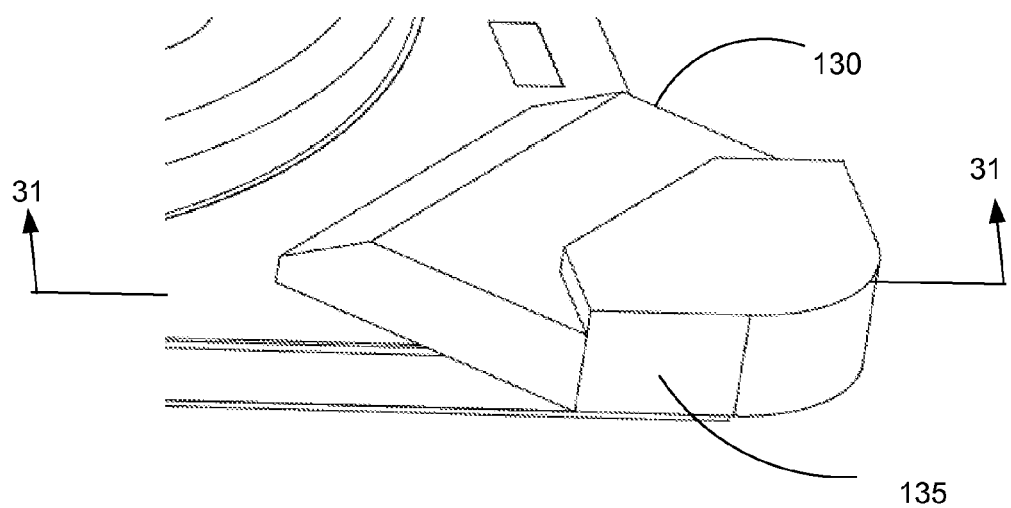
FIG. 30 illustrates a simplified perspective view of an embodiment of a holder and LED array.
Figure 31:
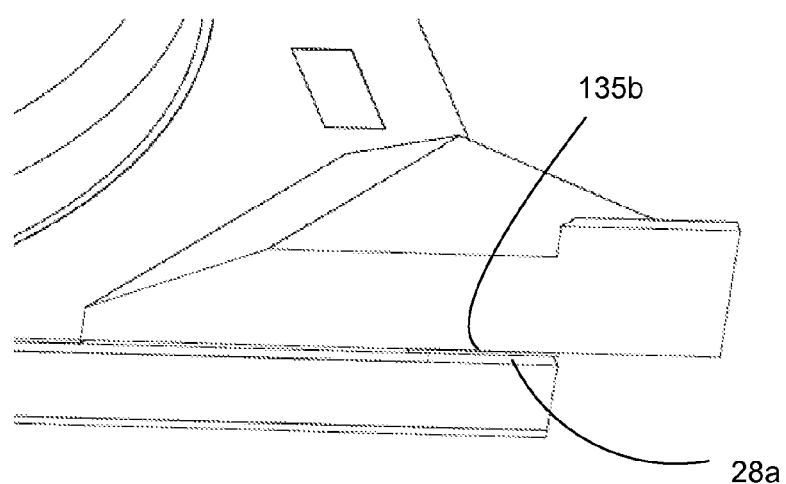
FIG. 31 illustrates a perspective view of a cross-section of the embodiment depicted in FIG. 30, taken along line 31-31.
Figure 32:
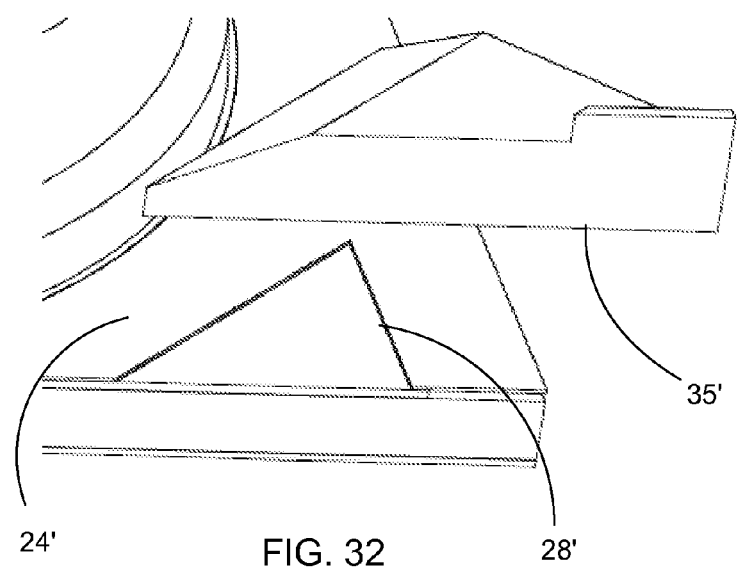
FIG. 32 illustrates a partially exploded perspective view of the embodiment depicted in FIG. 31.

As can be appreciated, the holder 130 includes a base 130a with an apperture 133 that can include an angled surface. Terminals 135, 136 are provided on the base 130a and respectively include first vertical contacts 135a, 136a pads 135b, 136b, bridges 135b, 136c, second vertical contacts 135d, 136d and connecting bridges 135e, 136e. The second vertical contacts 135d, 136d are positioned on projections 140. As can be appreciated, such a configuration is beneficial for applications where it is desirable to have the mating contacts positioned in recesses (e.g., the receptacle is touch safe). The projections can be plated with a conductive material (as illustrated in FIGS. 27-29). As can be appreciated, however, the plating can be applied selectively (either through the use of laser direct structuring or a two-shot molding process) and need not be provided in all the locations depicted in FIGS. 27-29. In addition, if desired, the plating could be replaced with terminals that are insert molded into the base 130a. The holder 130 further includes a lip 142 that is intended extend around a perimeter of a mating LED array.

Figure 12:
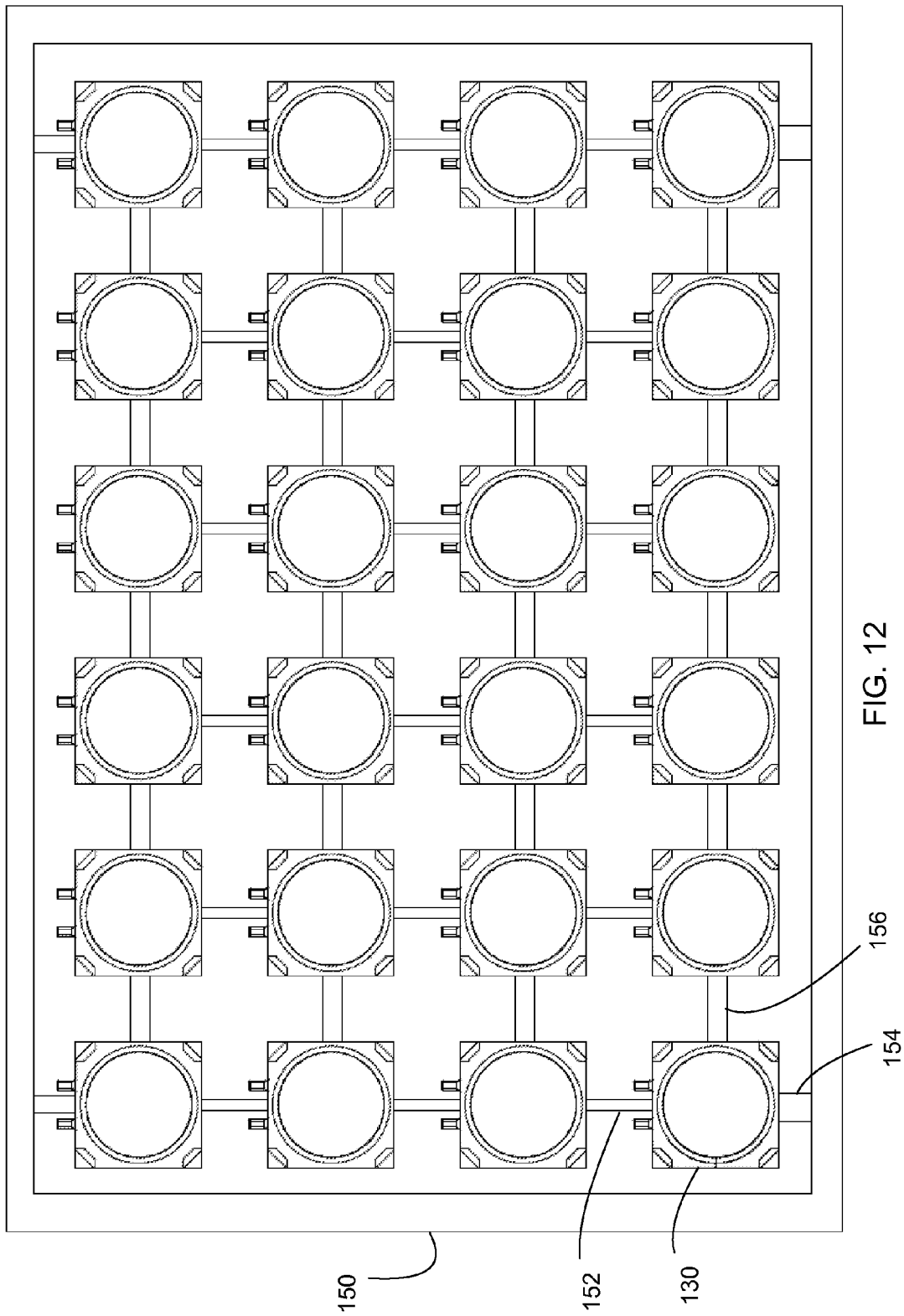
FIG. 12 illustrates a top view of an embodiment of a sheet of LED modules.
Figure 13:
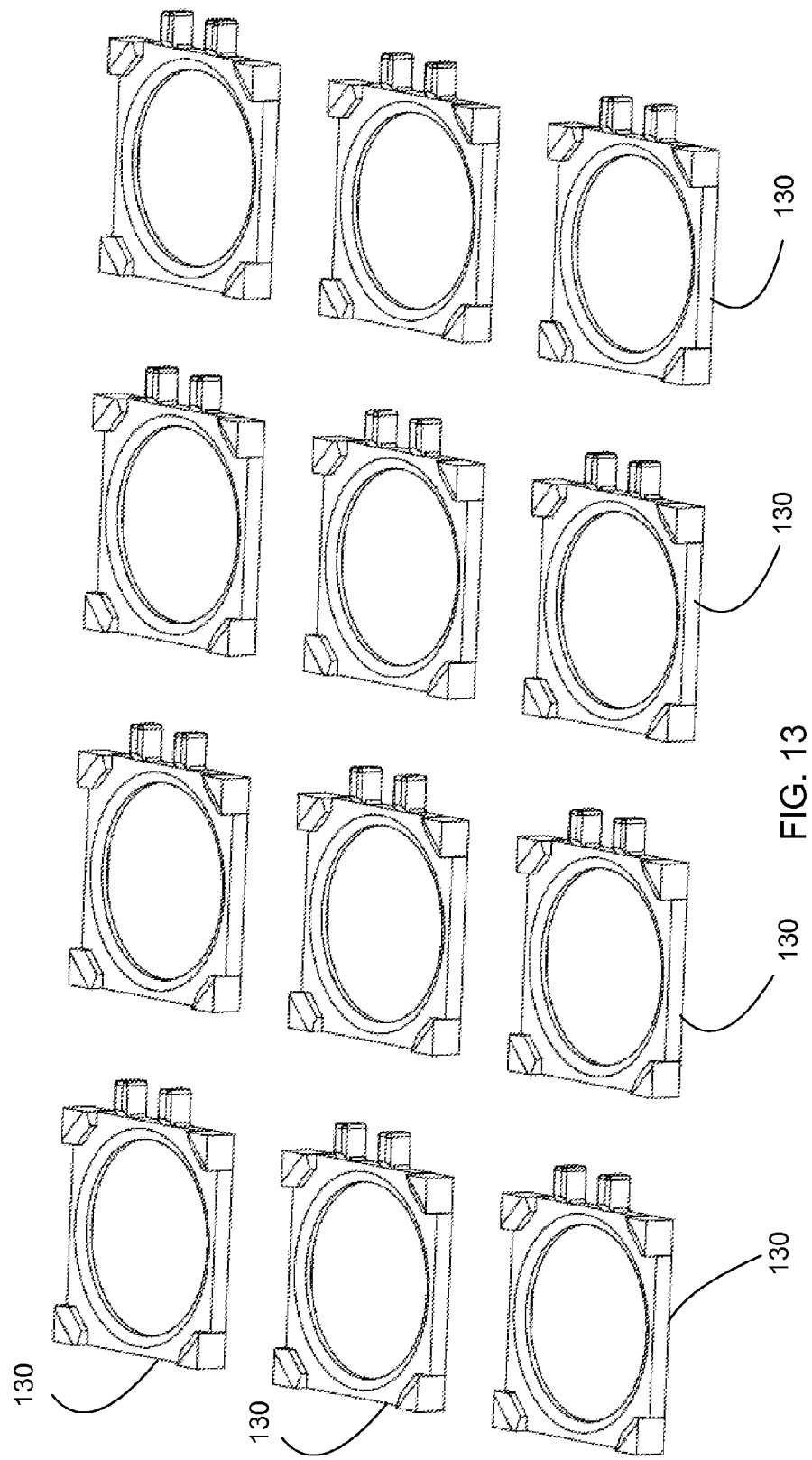
FIG. 13 illustrates a perspective simplified view of the embodiment depicted in FIG. 12.

FIGS. 12 and 13 illustrate embodiments where a plurality of holders 130 are provided and processed in a batch as sheet 150 (with the frame being omitted from FIG. 13 for purposes of brevity). The sheet 150 includes members 154, 152 and 156 to support the holders 130 as they are processed. One advantage of processing the sheet 150 is that that it can be more economical to solder a number of LED arrays to respective holders at the same time. However, if desired the design could also be optimized for a reel to reel process (and thus holders could be processed in series rather than parallel).

Figure 14:
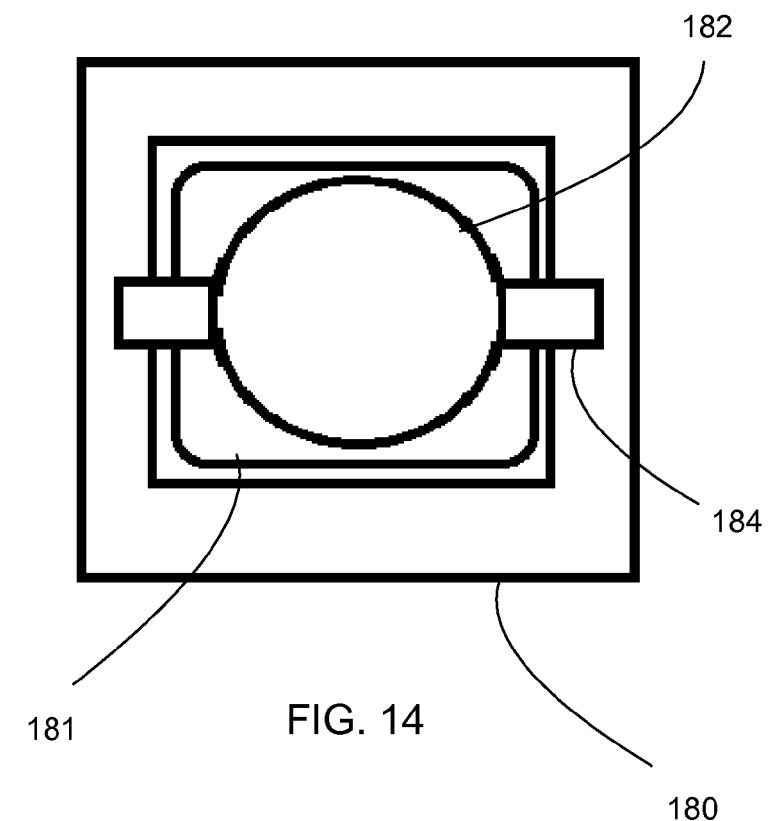
FIG. 14 illustrates a top view of a schematic representation of an embodiment of an LED module.
Figure 15:
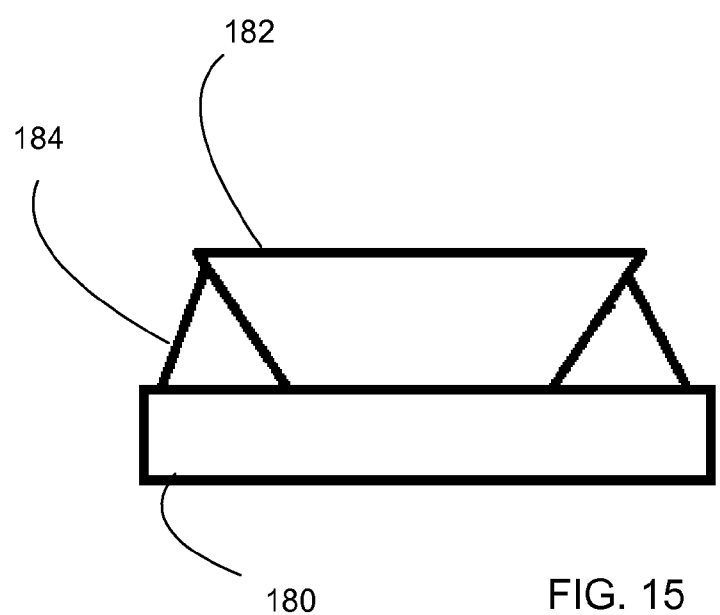
FIG. 15 illustrates an elevated side view of the embodiment depicted in FIG. 14.
Figure 16:
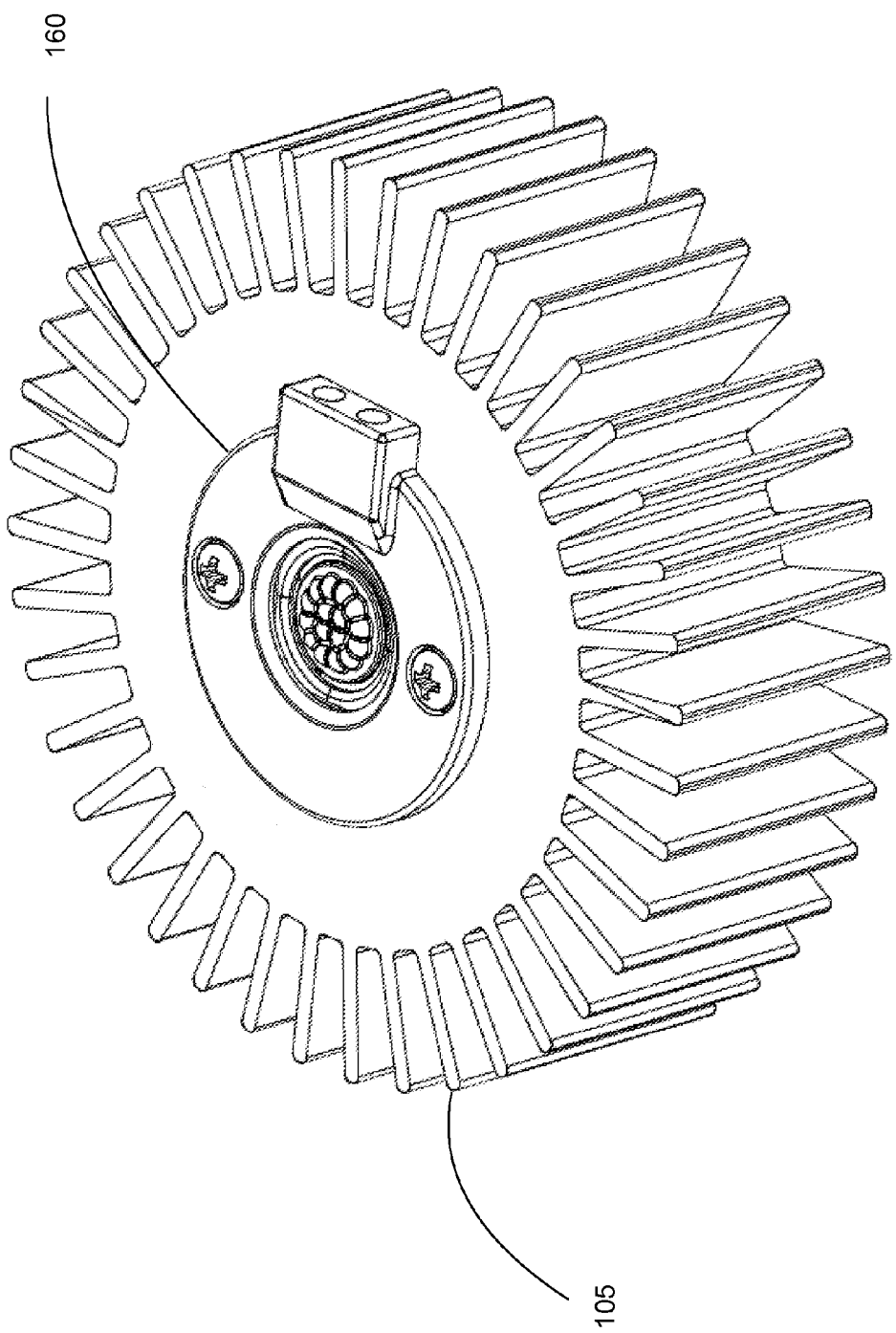
FIG. 16 illustrates a perspective view of an embodiment of a LED assembly.
Figure 17:
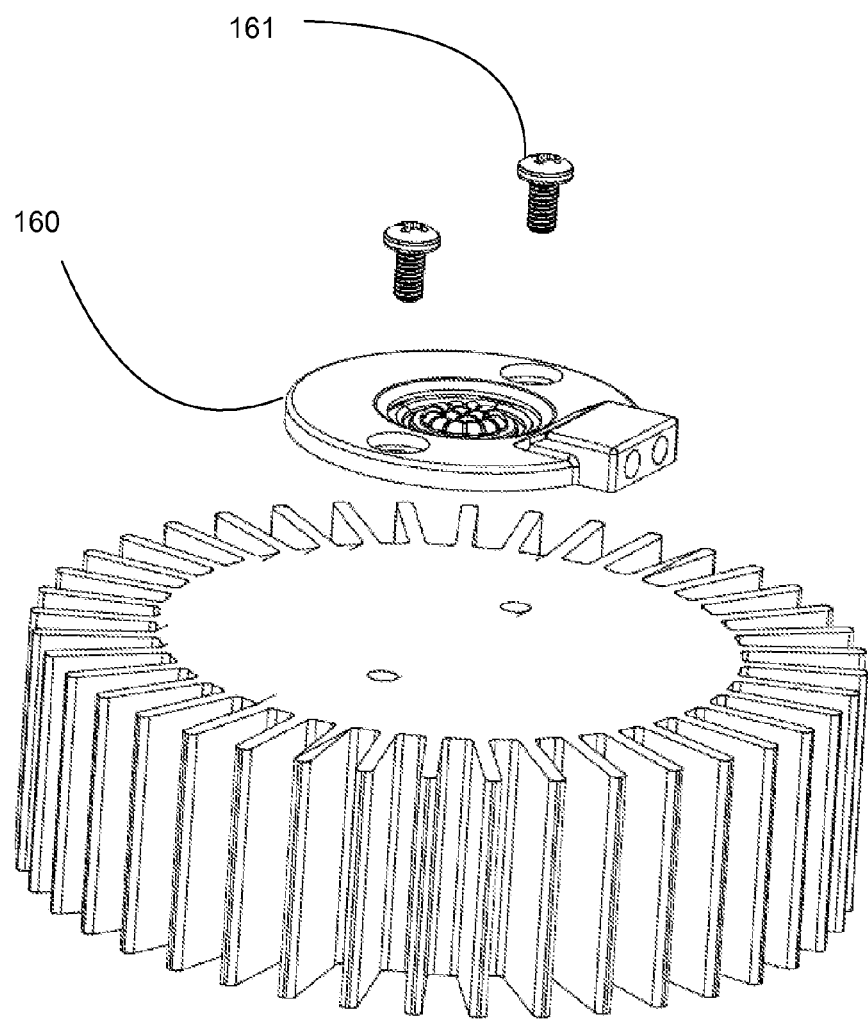
FIG. 17 illustrates a partially exploded perspective view of the embodiment depicted in FIG. 16.
Figure 18:
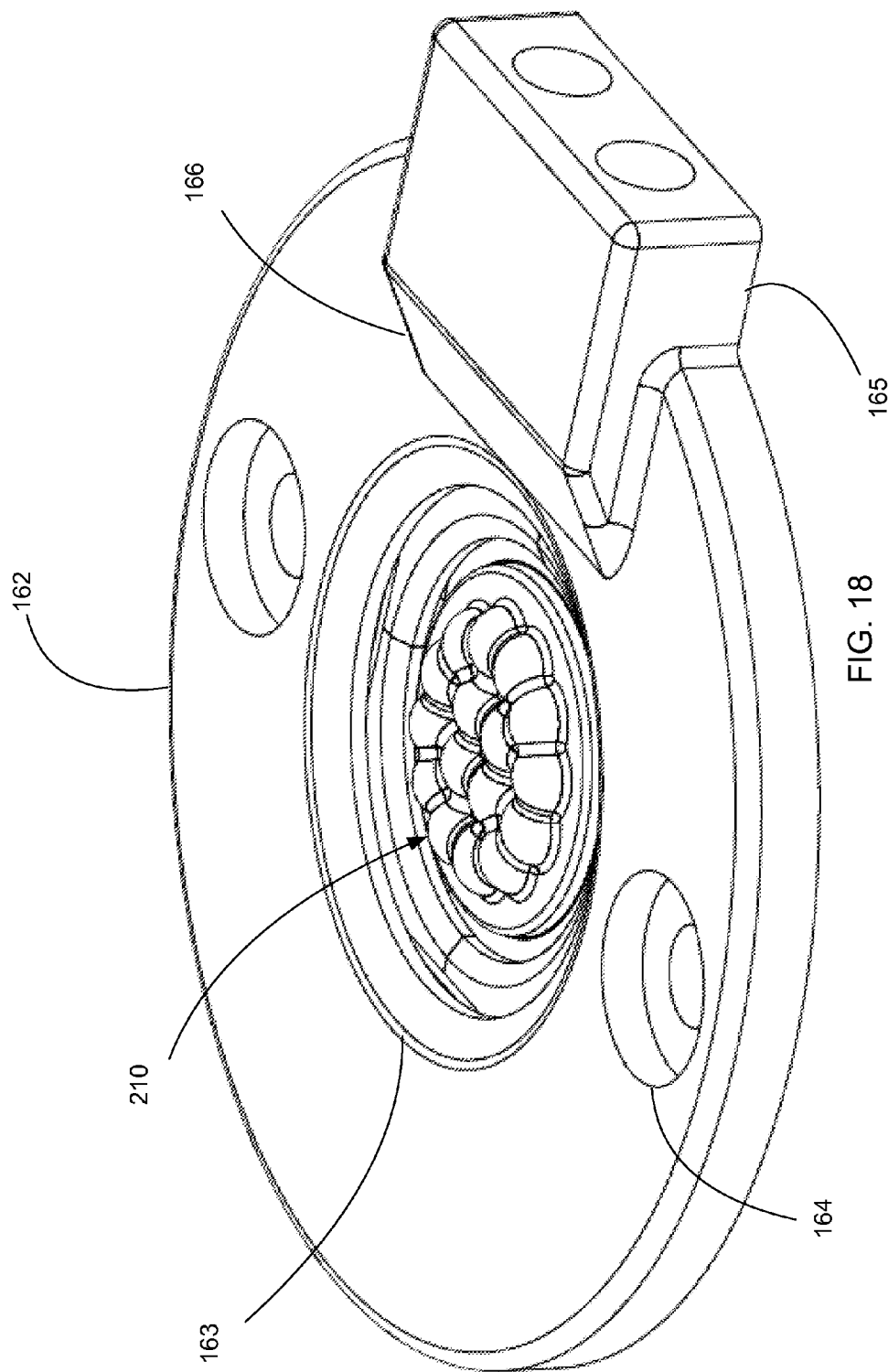
FIG. 18 illustrates a perspective view of an embodiment of a cover and a LED module.
Figure 19:
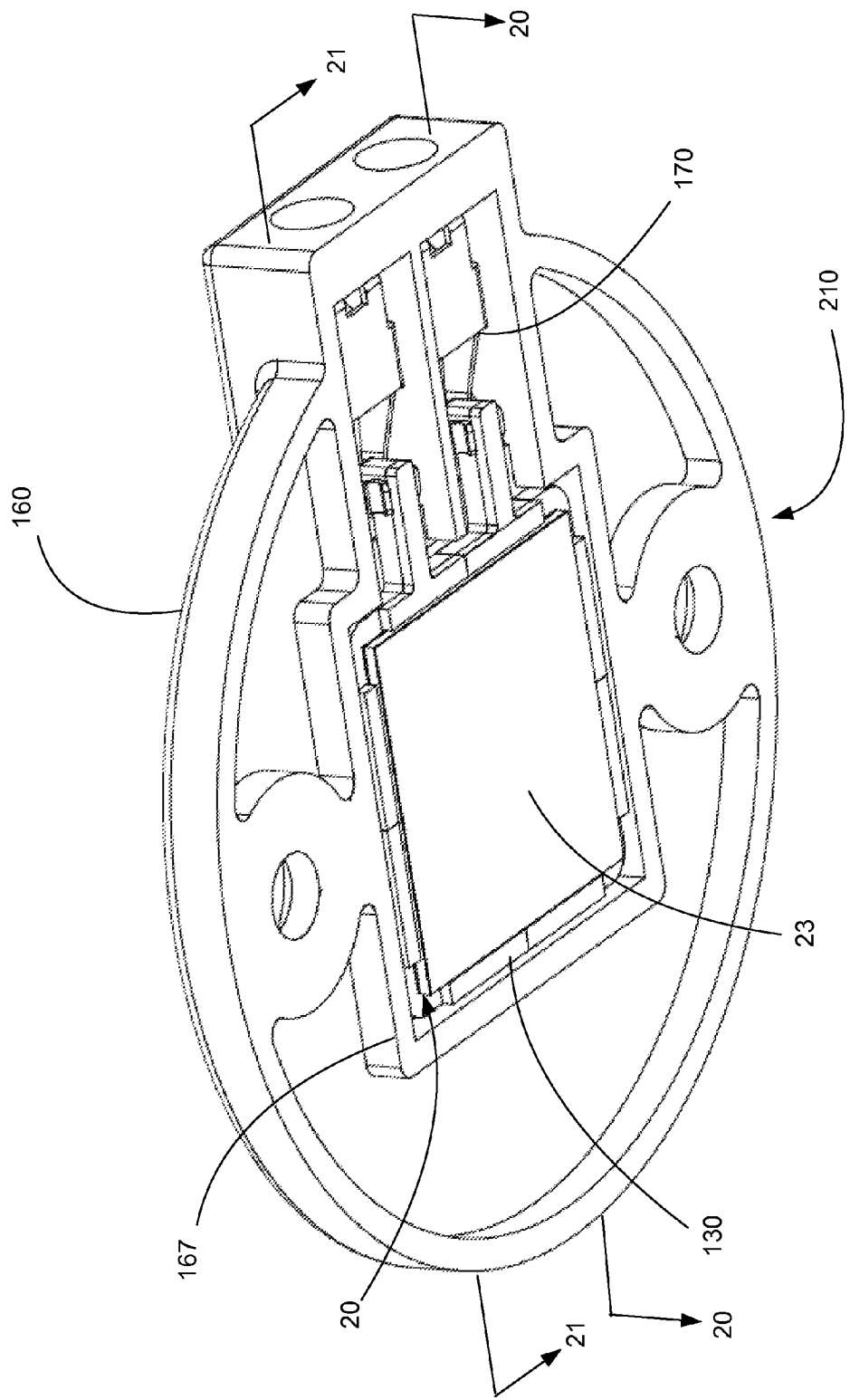
FIG. 19 illustrates another perspective view of the embodiment depicted in FIG. 18.
Figure 20:
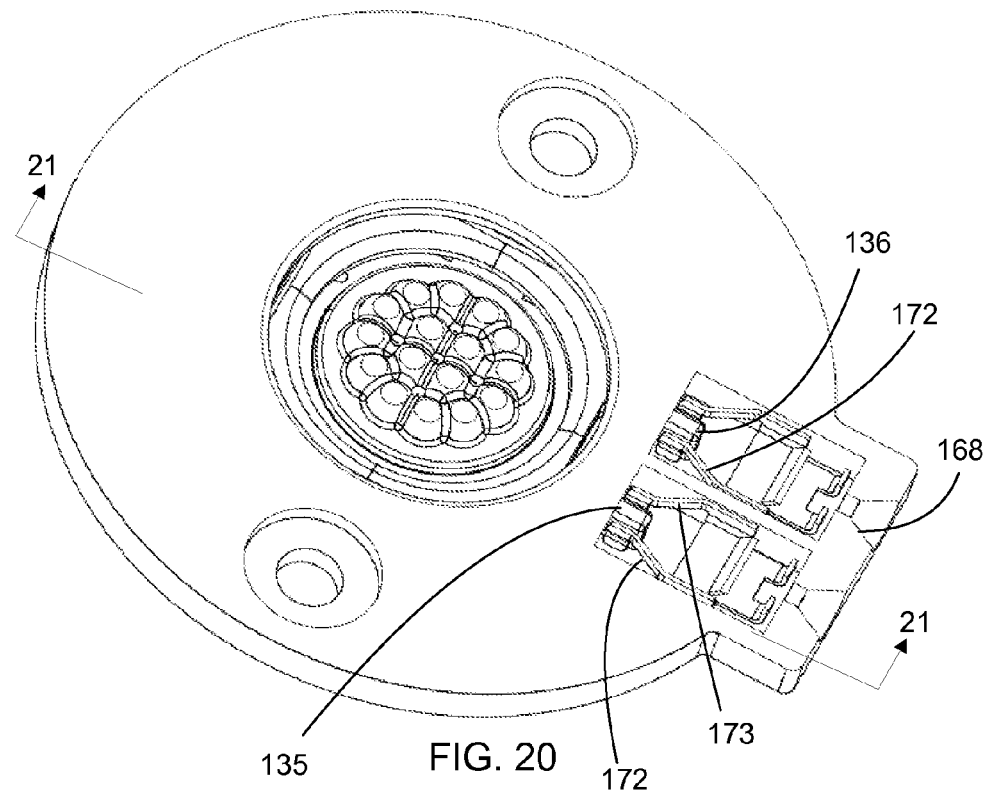
FIG. 20 illustrates a perspective view of a cross-section of the embodiment depicted in FIG. 19, taken along line 20-20.
Figure 21:
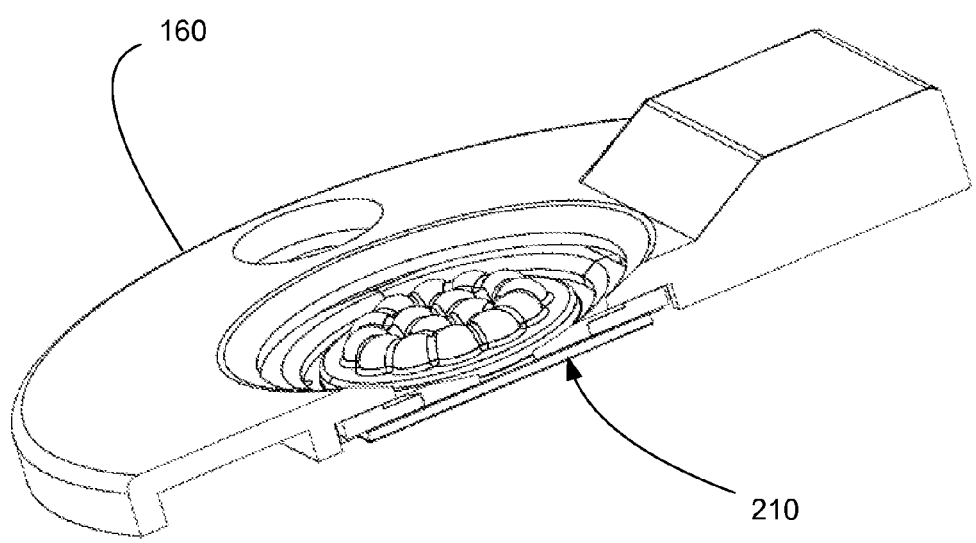
FIG. 21 illustrates a perspective view of a cross-section of the embodiment depicted in FIG. 19, taken along line 21-21.
Figure 24:
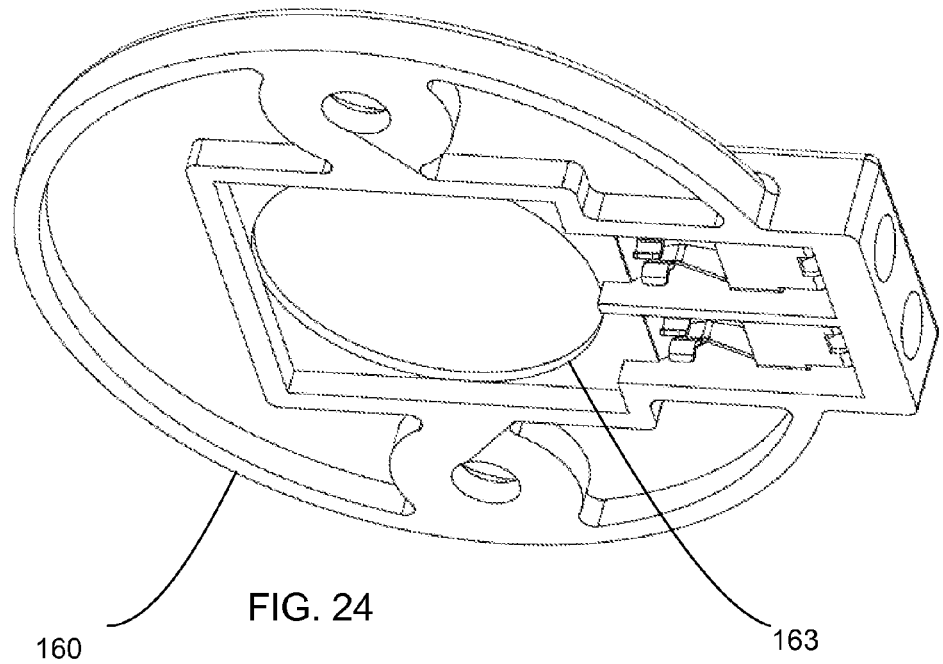
FIG. 24 illustrates a perspective view of an embodiment of a cover.
Figure 25:
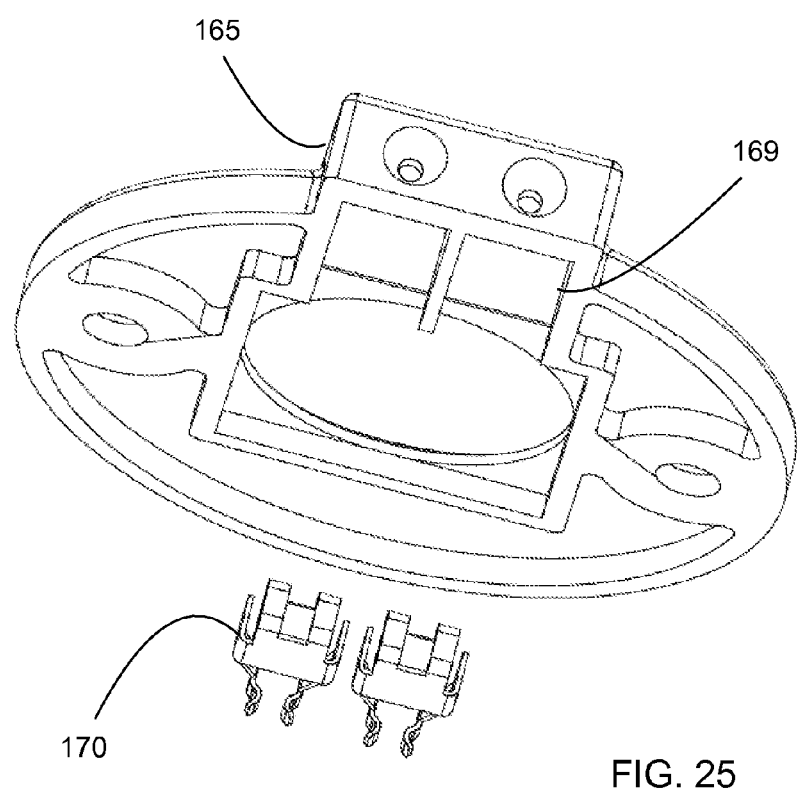
FIG. 25 illustrates a partially exploded perspective view of the embodiment depicted in FIG. 24.
Figure 26:
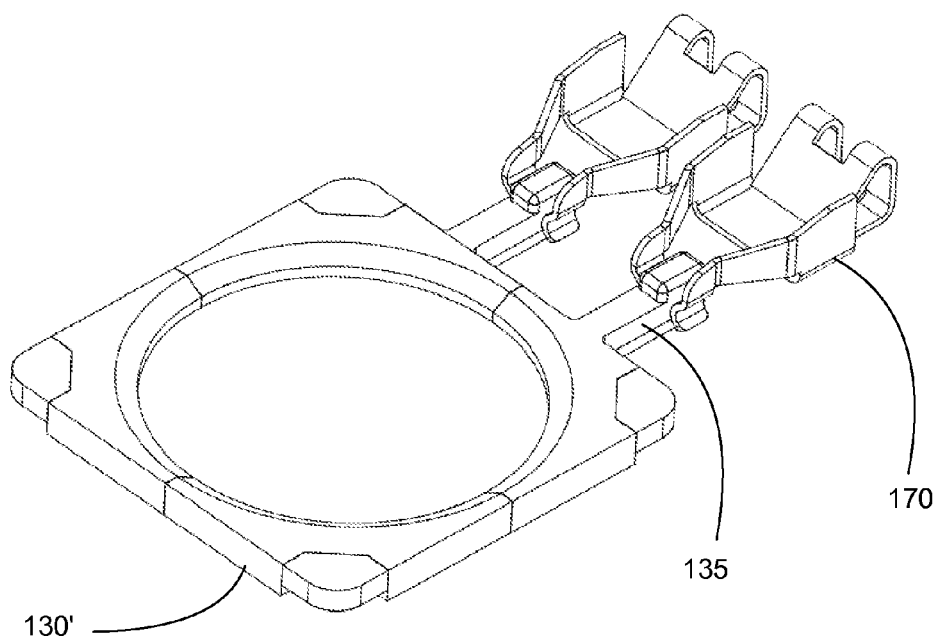
FIG. 26 illustrates a simplified perspective view of an embodiment of a holder and cover.

As can be appreciated, it has been determined that in main circumstances it will be advantageous to have a simple LED module that allows for substantial flexibility. However, if desired the LED module could also include an optic (which could be a lens, a reflector, a simple cover or some combination thereof). FIGS. 14 and 15 illustrate such a design in schematic fashion. Specifically, a holder 180 includes a reflector 125 that is positioned over an aperture 183. To help support the reflector 182, shoulders 184 are provided.

FIGS. 16 through 25 illustrate an embodiment of a cover 160 that is intended to mount over the LED module (such as LED module 110—which includes the holder 130) and secure it to a heat sink 105. It should be noted that heat sinks are available in a wide range of shapes and sizes and the depicted heat sink 105 is merely representative of the concept and is not intended to be limiting. Instead, as can be readily appreciated, the heat sink could have any desirable shape (such as an internal surface of a fixture or bulb) so long as the heat sink provided the necessary heat dissipation for the LED array.

The cover 160 can be fastened to the heat sink with one or more fasteners 161. The cover 160 may include wire traps that allow the end user to simply poke in wires to make an electrical connection to the LED module. As can be appreciated, the cover 160 is configured to press a module 210 against the heat sink, helping to ensure low thermal resistance (preferably less than 3 C/W and more preferably less than 2 C/W) between the LED array and the supporting surface (e.g., the heat sink). The cover 160 includes a base 162 with an aperture 163. Fastener openings 164 are configured to receive the corresponding fasteners and the cover 160 also includes a terminal housing 165 with a pocket 169 that can receive a terminal 170 and is in communication with a wire access hole 168 and the terminal housing 165 can include an angled surface 166 that is aligned with the aperture 163 so as to improve optical performance. The terminal housing supports mating terminals 170 that are configured to engage terminals supported by the module 210. The module 210 includes a holder 130 and a LED array 20. To improve thermal performance, a thermal layer 23 can be included. As can be appreciated, the terminals 170, which include opposing arms 172, 173, are configured to engage vertical contacts of terminals 135, 136 on the LED module 210 in a sliding fashion so as to help ensure reliable electrical contact.

One benefit of the depicted design is that a compact LED module can be securely mounted on a heat sink with the cover and coupled to a power source without the need for additional soldering (which can be challenging if the heat sink is large enough) while keeping the cost quite reasonable. This design is therefore well suited for applications where the LED array cost is reduced and there is a desire to lower the cost of the entire solution.

FIGS. 27-29 illustrate embodiments of a holder 130' that includes terminals 135', 136'. As can be appreciated, the terminals 135', 136' are provided on the projection 140 and each includes a base 135a', 136a'; a pad 135', 136' and vertical contacts 135c', 136c'. As mentioned above, in practice it is expected that the holder 130' will be a one-piece design and the parting lines shown will likely not be included in a final assembly.

Figure 33:
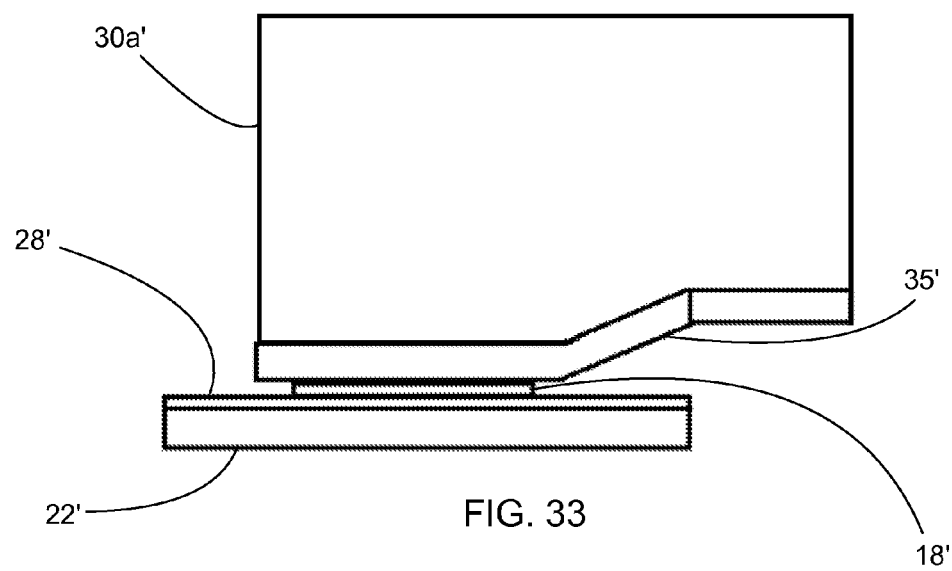
FIG. 33 illustrates a schematic representation of a holder and LED array interface.

FIGS. 30-33 illustrate features of how a holder can be mounted to an LED array. As can be appreciated, a holder 130 includes a terminal 135 with a pad 135b that is configured to be secured to a contact 28a on an LED array. More generically, a terminal 35' that is supported by base 30a' is joined to contact 28' via solder layer 18'. It is expected that an insulative layer will be placed between the contact 28' and the plate 22 that supports the contacts, thus the pad on the holder can be soldered directly to the contact on the plate. As can be appreciated, the pad is electrically connected to the vertical contacts and in an embodiment can be a trace that extends therebetween, thus a trace may extend along the top surface of the LED array. In some embodiments the LED array can have an insulative coating 24' that extends on the sides of the plate so as to ensure electrical isolation. Alternatively, the holder can have a contoured surface that allows the trace to be positioned away from the edge of the LED array (as schematically depicted in FIG. 33).

Figure 34:
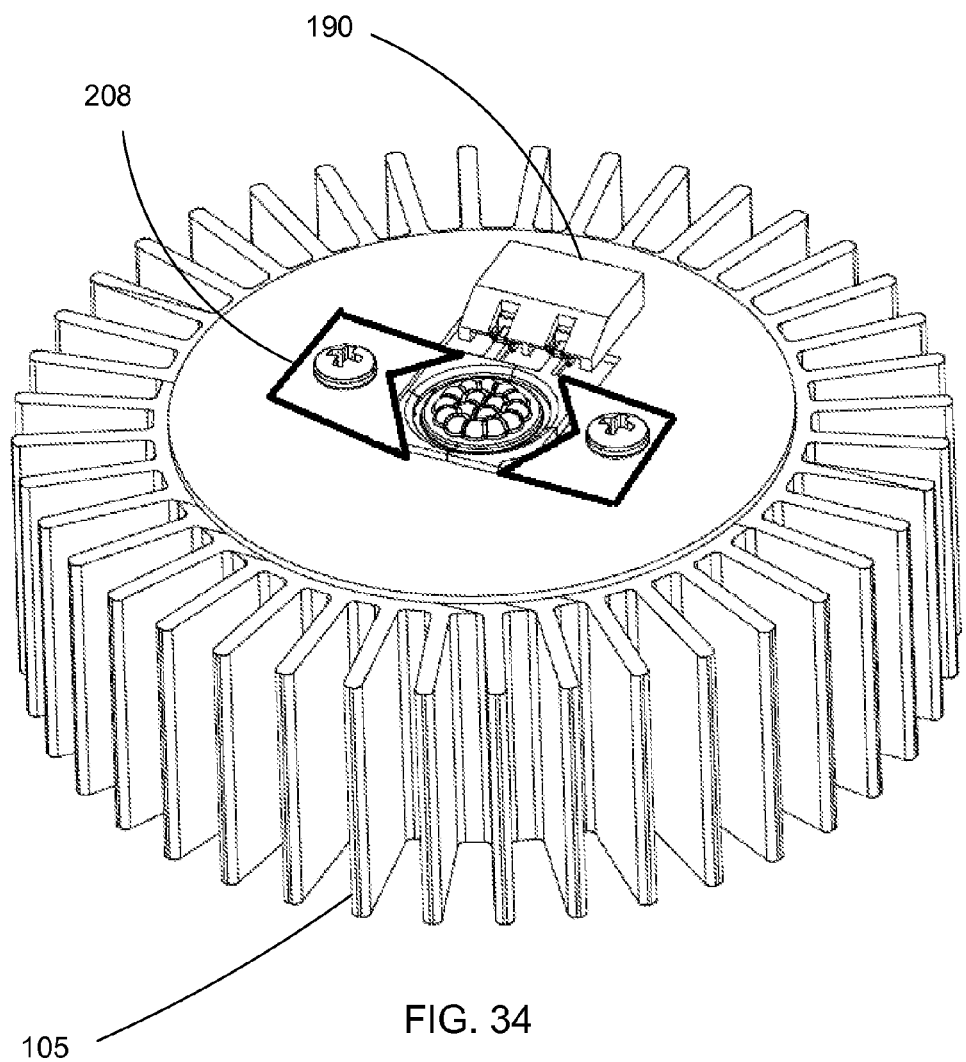
FIG. 34 illustrates a perspective view of an embodiment of a LED assembly.
Figure 35:
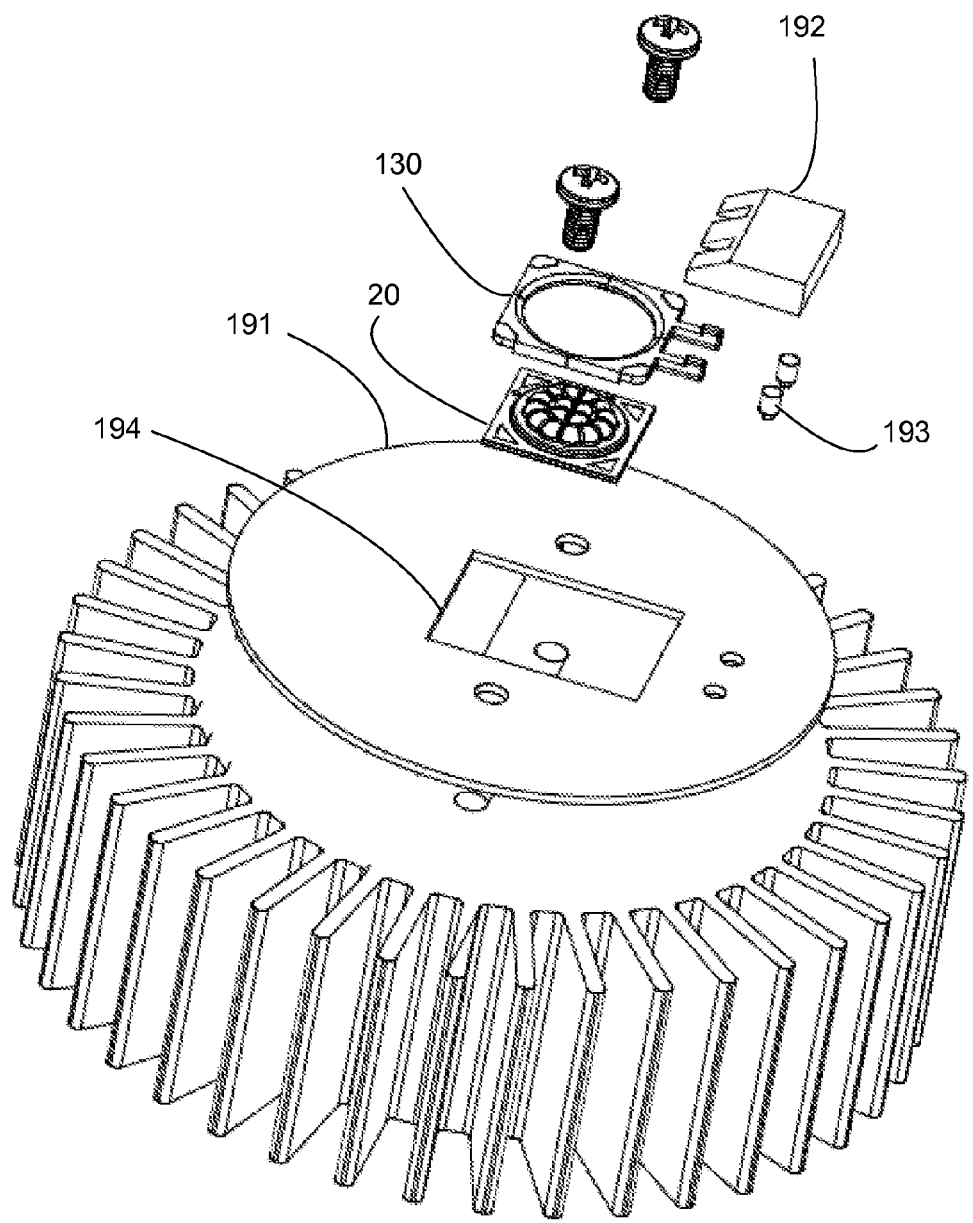
FIG. 35 illustrates a partially exploded perspective view of the embodiment depicted in FIG. 34.
Figure 36:
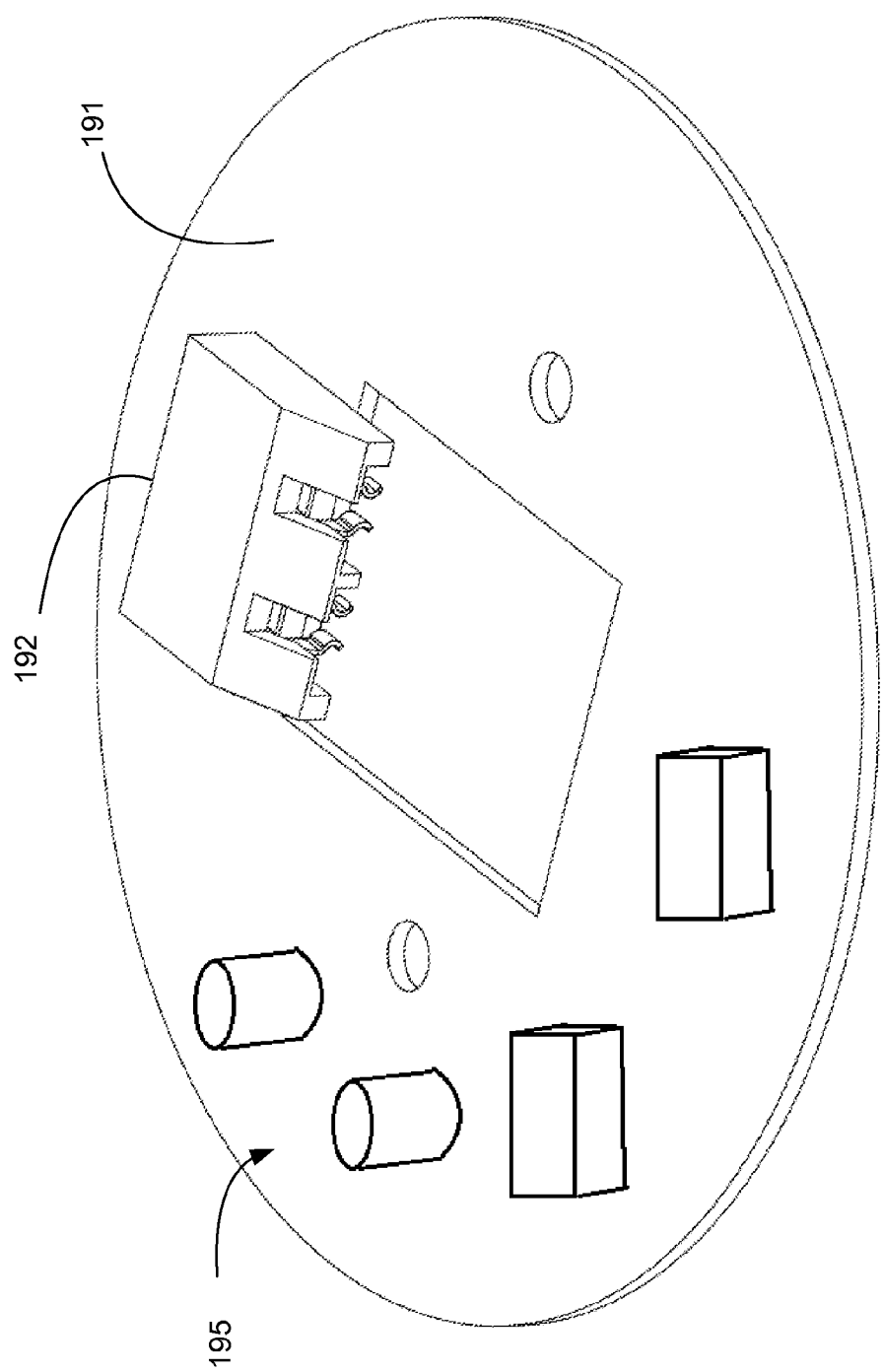
FIG. 36 illustrates a perspective view of an embodiment of a circuit board assembly.

FIGS. 34-36 illustrate an embodiment of a receptacle 192 that is electrically coupled to a circuit board 191 (while SMT attach is shown via members 193, attachment could also be via solder through-hole or press fit can be used) so as to provide an assembly 190 that is attached to the heat sink and can engage a holder 130 (and the corresponding LED array 20). As can be appreciated, if the circuit board is intended to provide power conversion and/or control functionality then circuitry 195 can be mounted on the circuit board and routed to receptacle terminals. Clips 208 (or a frame) can be used to secure the LED module and the circuit board to the heat sink.

Figure 37:
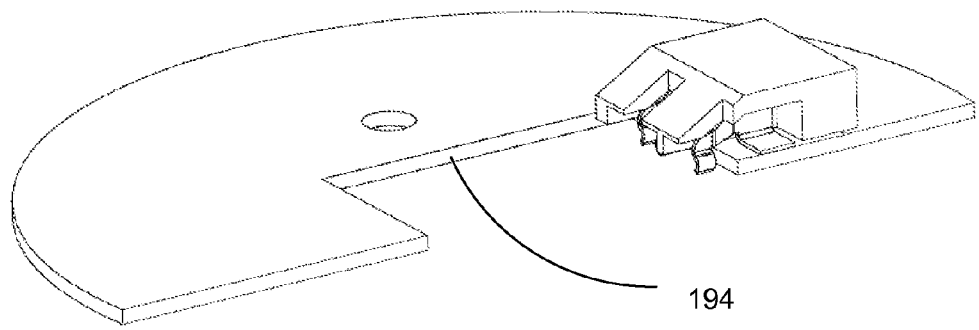
FIG. 37 illustrates a perspective view of a cross-section of an embodiment of a circuit board assembly.
Figure 38:
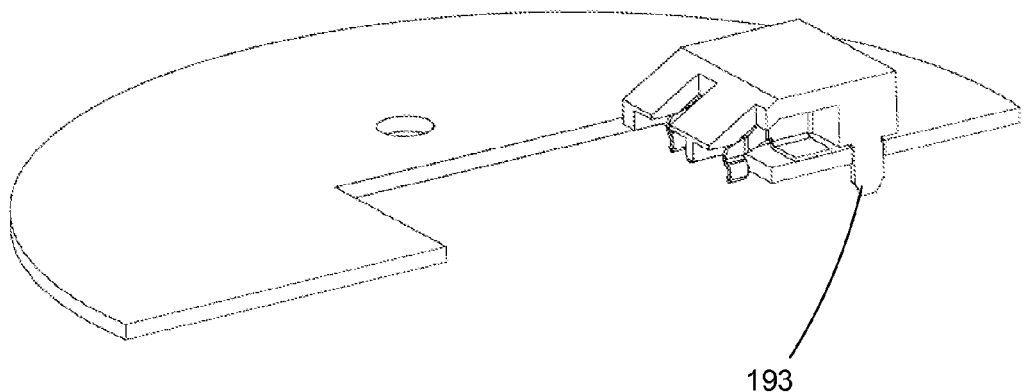
FIG. 38 illustrates a perspective view of a cross-section of another embodiment of a circuit board assembly.
Figure 39:
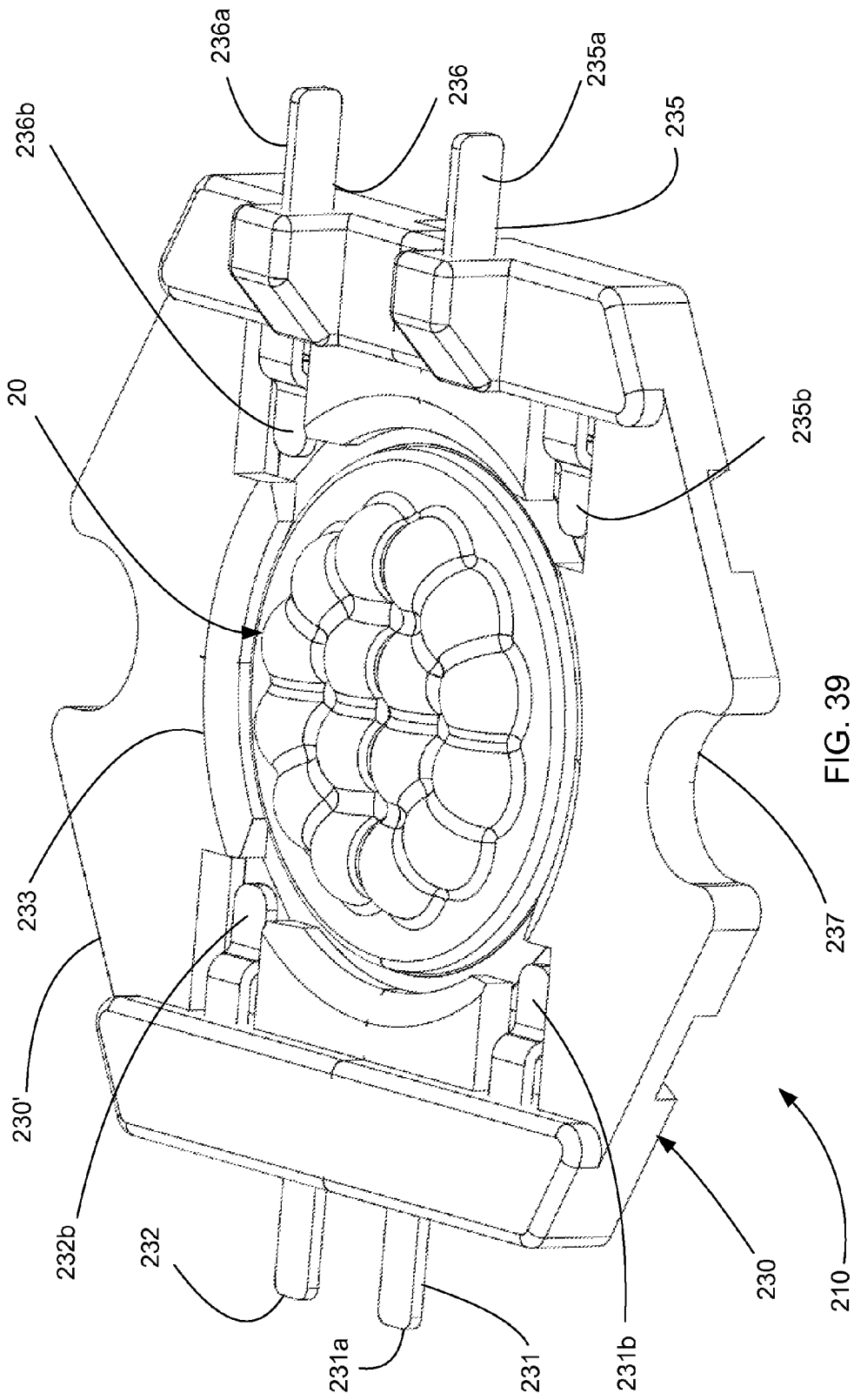
FIG. 39 illustrates a perspective view of an embodiment of an LED module.
Figure 40:
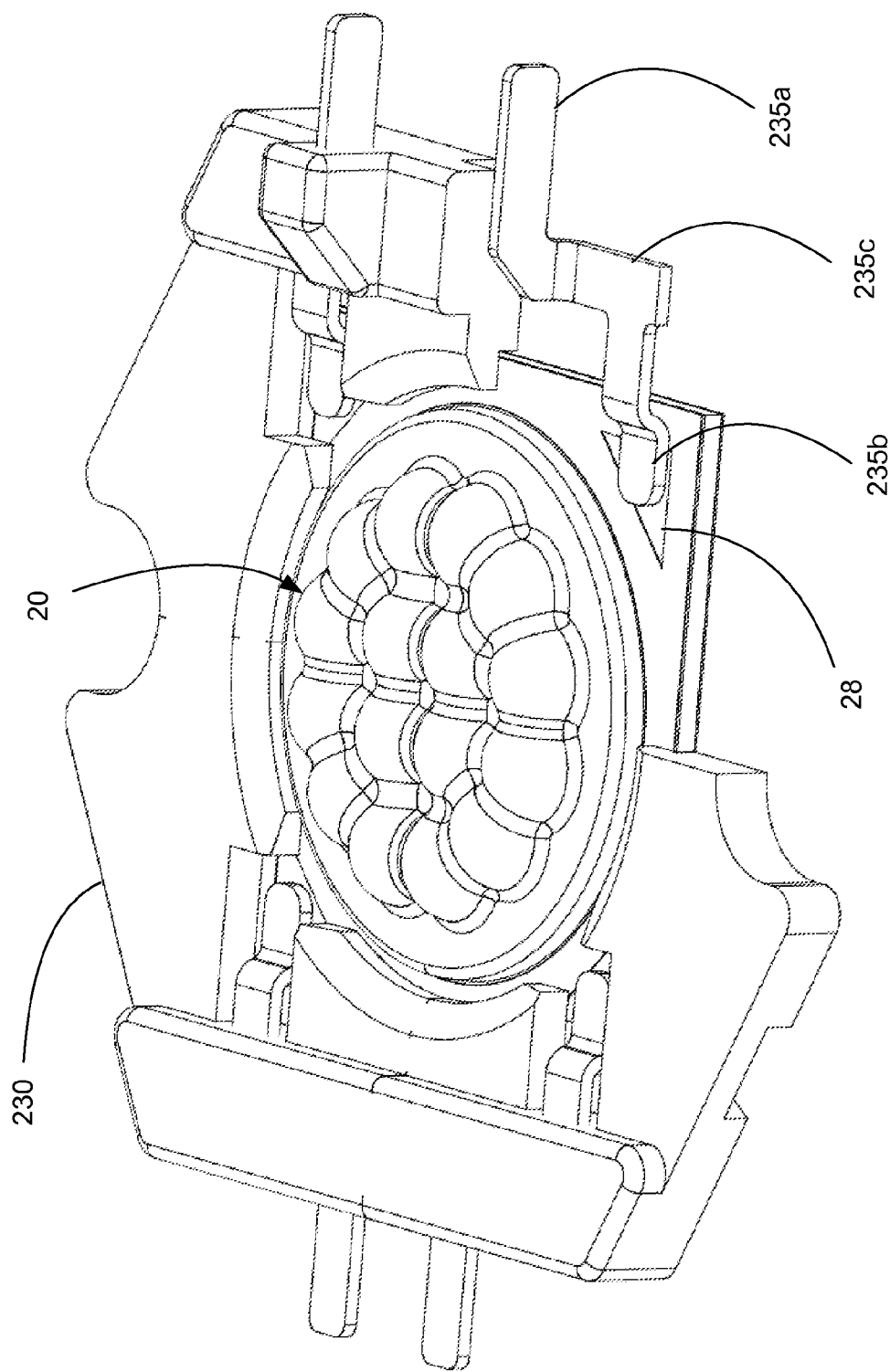
FIG. 40 illustrates a perspective simplified view of the embodiment depicted in FIG. 39.
Figure 41:
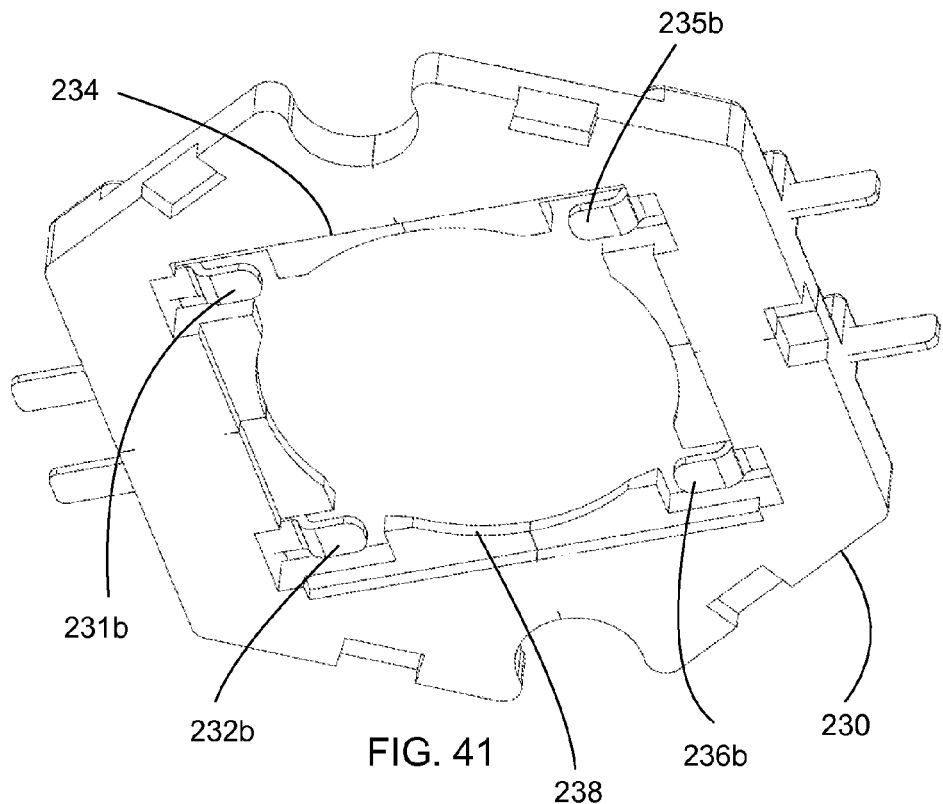
FIG. 41 illustrates a perspective view of an embodiment of a holder that could be used in the LED module depicted in FIG. 39.

FIGS. 37 and 38 illustrate additional features of a receptacle mounted on a circuit board. As can be appreciated, FIG. 37 provides a SMT attach that allows the terminals to be attached directly to the circuit board and can provide a circuit board assembly that is suitable for mounting on a flat surface. FIG. 38 is similar but includes one or more projections 193 in the housing that are inserted into the circuit board and can help retain the housing in position. It should be noted that the embodiment in FIG. 38 has the projection 193 projects below the bottom surface of the circuit board and thus may also be used to provide orientation and/or polarity and/or poka-yoke control of the circuit board to heat sink interface.

FIGS. 39-42 illustrate feature of an alternative embodiment of a LED module 210 that includes a LED array 20 (which may be any desirable LED array) and a holder 230 with terminals 231, 232, 235, 236 that are insert molded into a base 230' of the holder 230. The terminal 231 includes a contact 231a and a pad 231b where the pad 231b soldered to a corresponding contact 28 of the LED array. The terminal 232 includes a contact 232a and a pad 232b where the pad 232b soldered to a corresponding contact 28 of the LED array 20. The terminal 235 includes a contact 235a and a pad 235b where the pad 235b soldered to a corresponding contact 28 of the LED array 20. The terminal 236 includes a contact 236a and a pad 236b where the pad 236b soldered to a corresponding contact 28 of the LED array 20. Thus, the depicted embodiment includes pads 231b, 232b, 235b and 236b on the respective terminals that are soldered to corresponding contacts 28 of the LED array 20.

As can be appreciated, two versions of terminals are depicted, terminals 235, 236 that provide vertical blades (suitable for use in receptacles with mating terminals similar to the receptacles depicted above) and terminals 231, 232 that are suitable for use in a wire-solder application. In practice, just one set of terminals may be configured to extend beyond the base and it is likely that one type or the other will be used (because it is generally not necessary and may not be particularly desirable to have both sets of terminals extend beyond the base 230'). As can be appreciated, the base 230' could be enlarged so that neither set of terminals extend beyond the base 230'. The holder 230 includes fastener apertures 237 that can be used to secure the LED module 210 to a supporting surface (such as a heat sink). As can be appreciated, while just two terminals can be used to provide electrical power, in certain embodiments it may be desirable to have more than two pads so that there are multiple solder connectors between the holder 230 and the LED array 20. In other embodiments, however, just two solder joints can be used.

It should be noted that the pad of the terminal and the contact on the LED array need not have the same shape. Thus, the shape of the pad and the contact can be adjusted so to provide the desired performance and in certain cases it may be desirable that one is larger than the other so as to provide more tolerance to soldering the two parts together. If only one set of terminals is going to be used to provide power then the other terminal can be configured so that it is substantially contained within the base (e.g., substantially not exposed) while still providing the pads that can be used to help secure the LED array to the holder.

Figure 42:
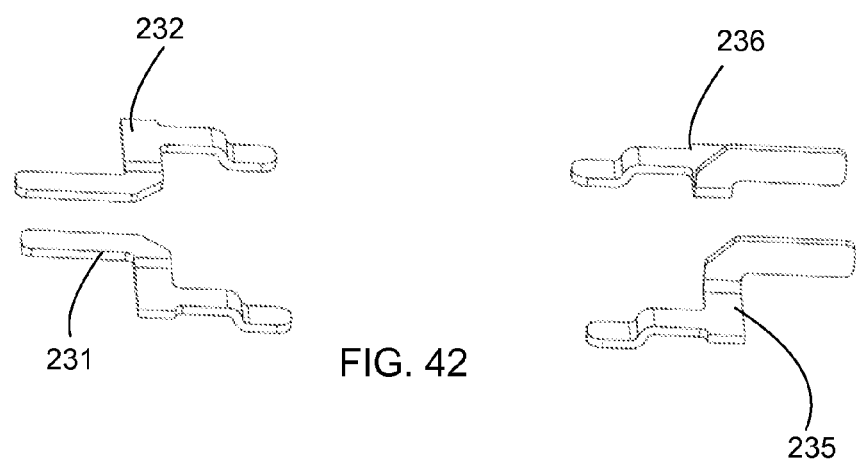
FIG. 42 illustrates a perspective view of an embodiment of terminals that can be used in an LED holder.
Figure 42A:
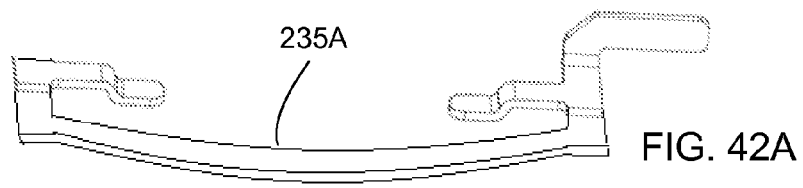
FIG. 42A illustrates a perspective view of another embodiment of terminal suitable for use in an LED holder.
Figure 43:
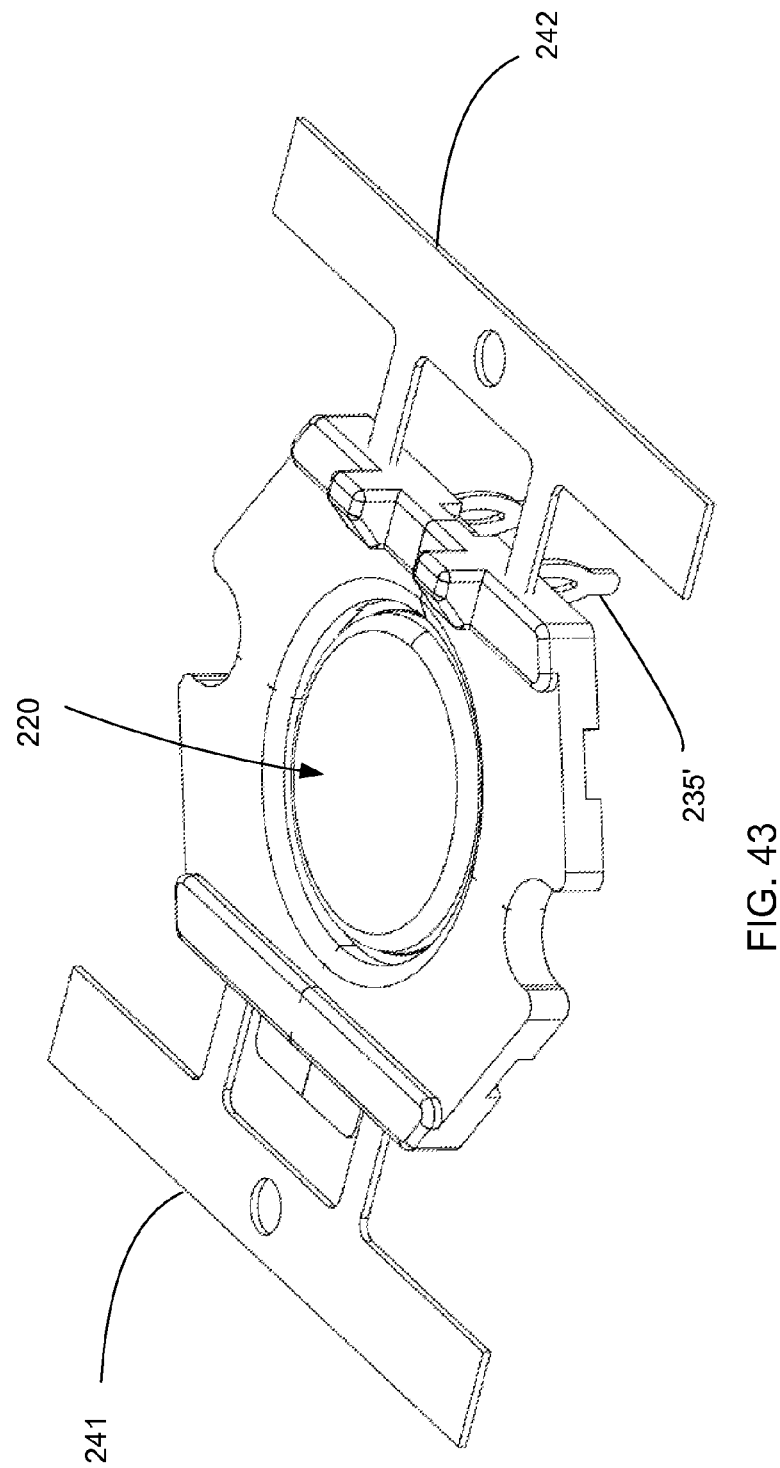
FIG. 43 illustrates a perspective view of an embodiment of a LED module being formed with the use of a carrier.
Figure 52:
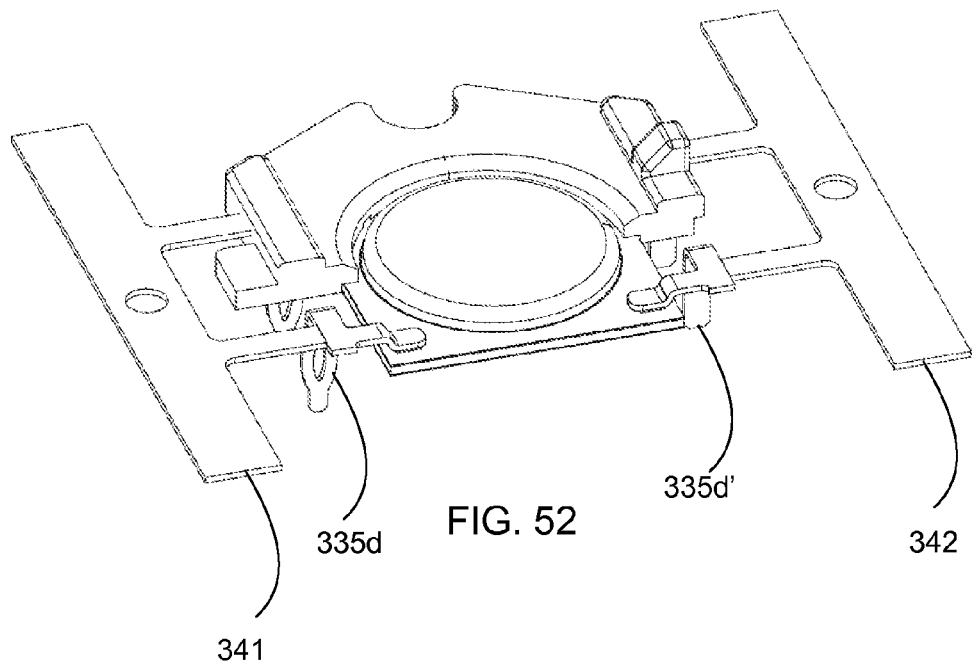
FIG. 52 illustrates a perspective partial view of an embodiment of a LED module being formed with the use of a carrier.
Figure 53:
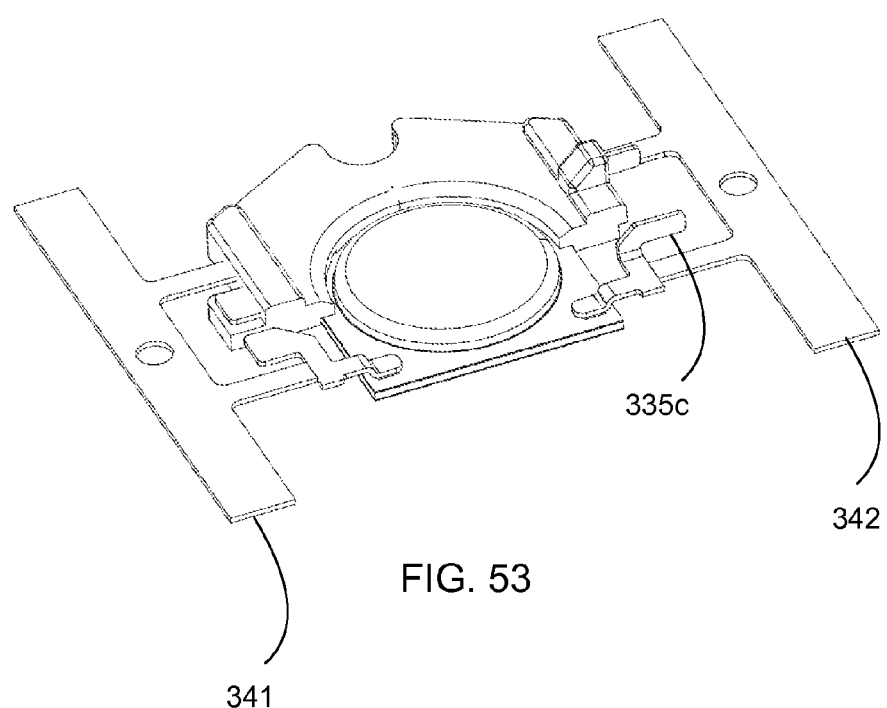
FIG. 53 illustrates a perspective partial view of an embodiment of a LED module being formed with the use of a carrier.

As can be appreciated from FIGS. 43 and 52-53, a carrier with strips 241, 242 can be used to help process the holder. In an embodiment, the terminals can be formed, plated and then insert molded into the base to form the holder. The holder 230 can be solder attached to LED array 220, which includes an emission area 226. The emission area 226 includes one or more LED die covered by a conversion element (commonly a phosphorous based material but not so limited). The joining of the LED array 220 and the holder 230 results in the LED module 210 and at that point the LED module 210 can be singulated from the carrier. As can be appreciated, therefore, the design allows for process that can have the LED array and the holder be joined in a continuous manner (e.g., in a reel-to-reel manner). As can be appreciated from FIG. 43, if four points of contact are desired with the LED array 220 but only two points of electrical connection are desired, the terminals on one side can be dummy terminals (e.g., not configured to engage with external terminals or make an electrical connection) that are supported by carrier 241. In addition, if desired, terminals on opposite sides could also be dummy terminals (e.g., the left front terminal and the right rear terminal could be dummy terminals). The advantage of such a design is that solder connection with the contacts on both sides of the LED array are maintained. Naturally, if the LED array had just two contacts (located on opposite sides of the LED array) then dummy terminals would not be as beneficial and could be omitted. In addition, a single terminal on each side could include multiple pads (e.g., the pads of terminals 231 and 235 could be part of one terminal 235A, as depicted in FIG. 42A, that includes two pads on one terminal). Naturally, some other number of terminals could be used (such as three terminals on a side) and a single terminal could have more than one pad (such as three or more pads, depending on the LED array being used). Thus, a number of different combinations of terminals could be used in the embodiments depicted herein and the particular terminal configuration is not intended to be limiting unless otherwise noted.

While a large degree of variation is possible, it has been determined that for reel-to-reel processes it is beneficial to have a terminal (dummy or not) on opposing sides of the holder so that a carrier with two strips can be used. As can be appreciated, the use of two carrier strips can be used in any holder (disclosed or formed of a combination of features disclosed) that has an insert molded base around two or more terminals (although the two terminals may be joined during the insert molding process) and thus this benefit is not intended to be limiting unless otherwise noted.

Figure 44:
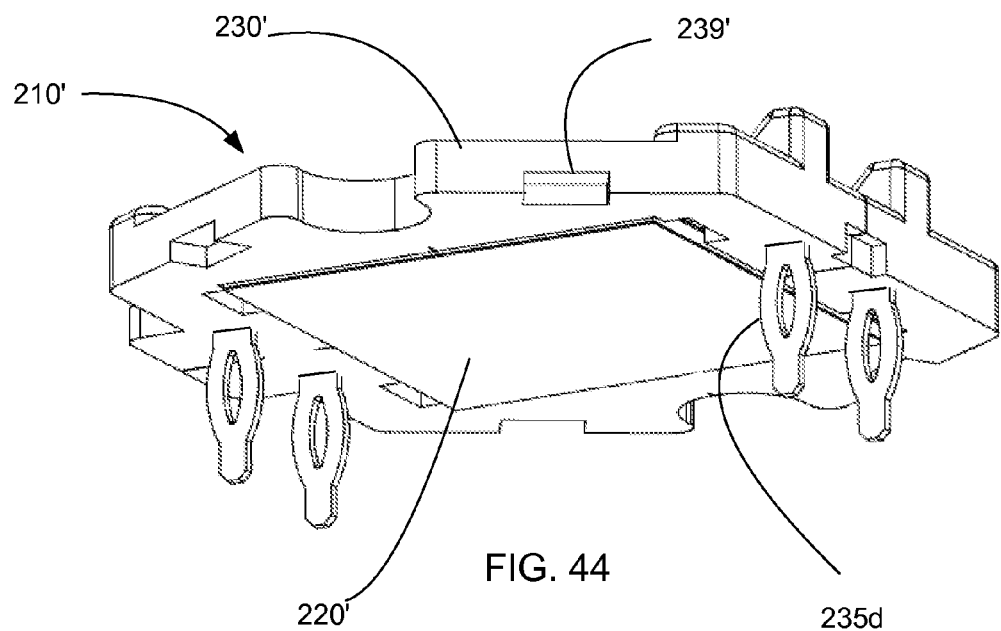
FIG. 44 illustrates a perspective view of an embodiment of an LED module.
Figure 45:
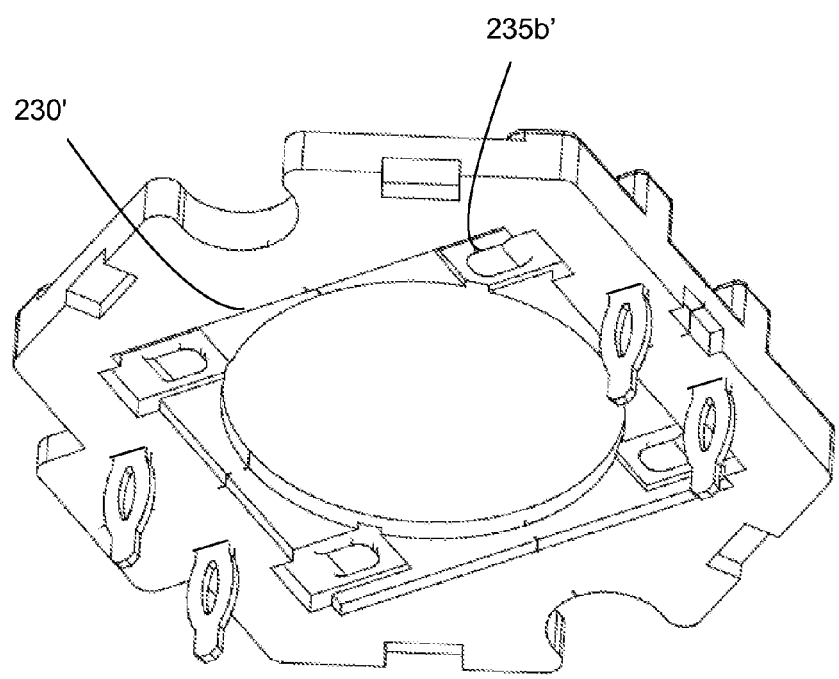
FIG. 45 illustrates a perspective view of the embodiment depicted in FIG. 44 with the LED array removed.

As can be appreciated from FIGS. 43-45, the base 230' can be configured to cover the solder portion (so as to help make the top of the base touch-safe). One benefit of allowing the solder portions to be visible is that verifying of the solder process can be done visually rather than with the use of scanning devices (e.g., an x-ray scanner). Thus, as many applications are low voltage, the benefits of having a touch safe design might be outweighed by the benefits of ease of manufacturing provided with the visible connections. The use of a full cover, however, does provide a more attractive finish and thus may be desirable in certain circumstances.

Figure 46:
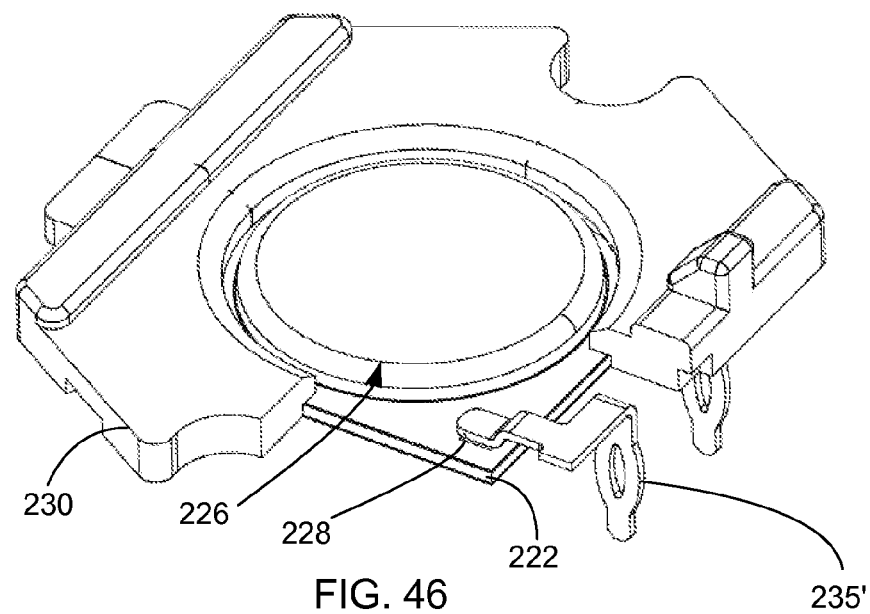
FIG. 46 illustrates a perspective view of a partial embodiment of an LED module that is similar to the module depicted in FIG. 44.
Figure 47:
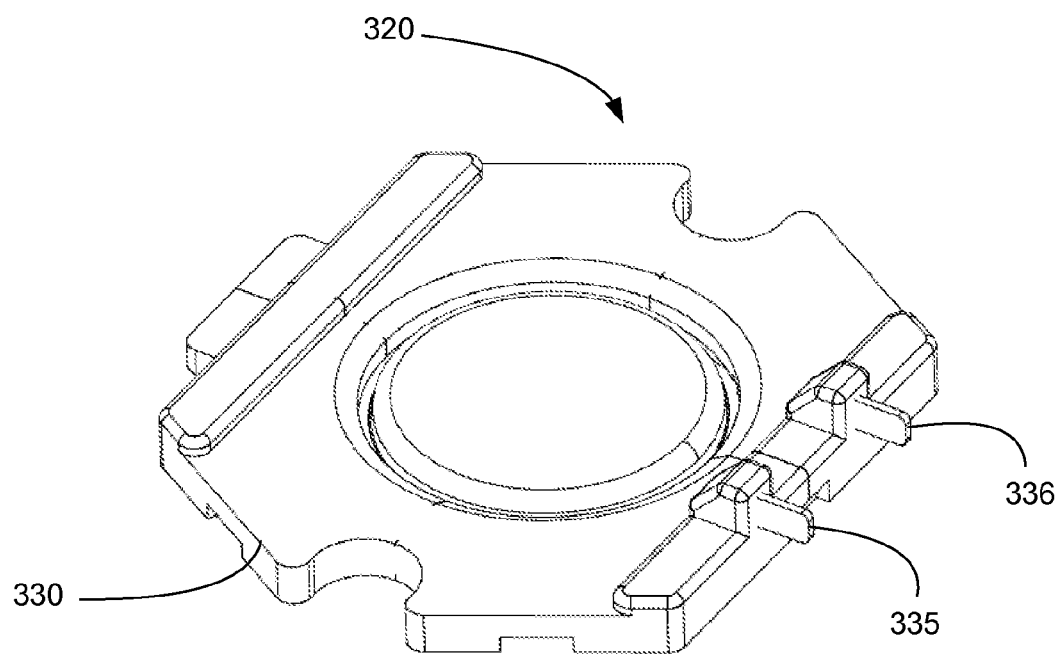
FIG. 47 illustrates a perspective view of an embodiment of another embodiment of an LED module.
Figure 48:
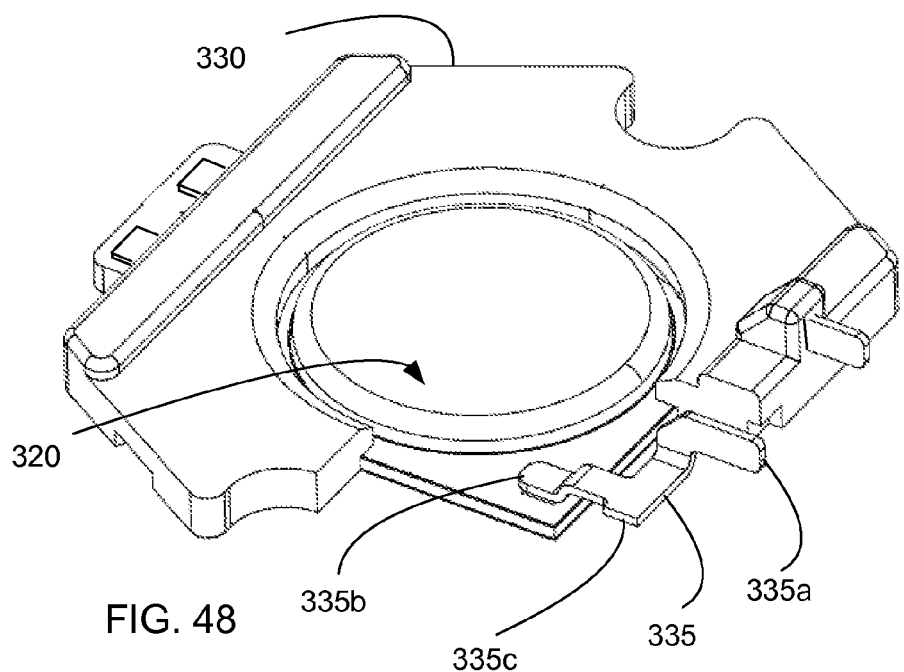
FIG. 48 illustrates a perspective view of an embodiment of an LED module with a portion of a holder removed.
Figure 49:
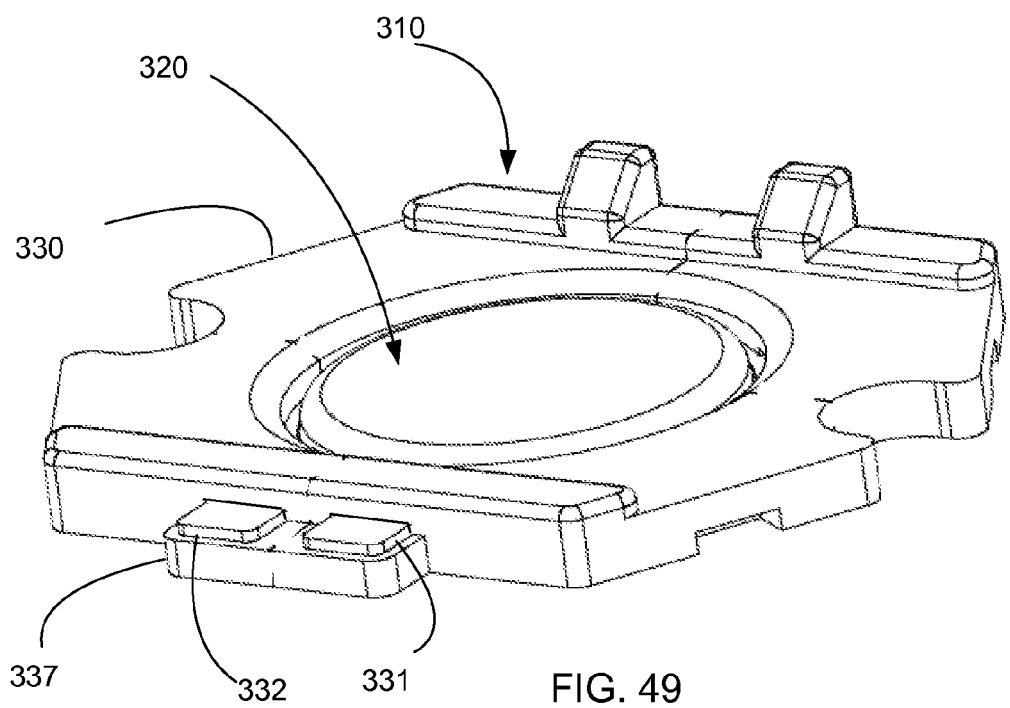
FIG. 49 illustrates a perspective view of the embodiment of the LED module depicted in FIG. 48.
Figure 50:
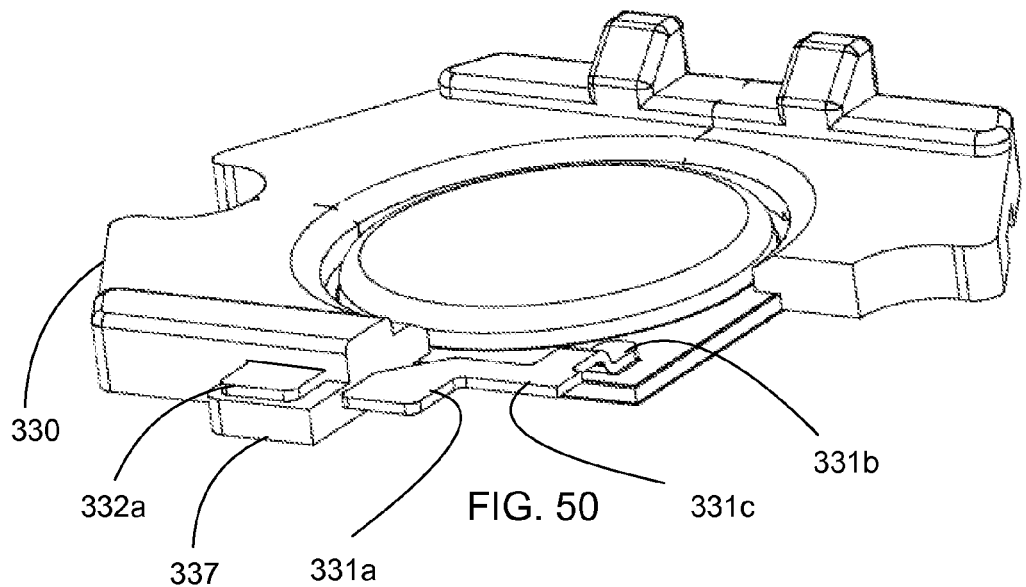
FIG. 50 illustrates a perspective view of the embodiment depicted in FIG. 49 with a portion of a holder removed.
Figure 51:
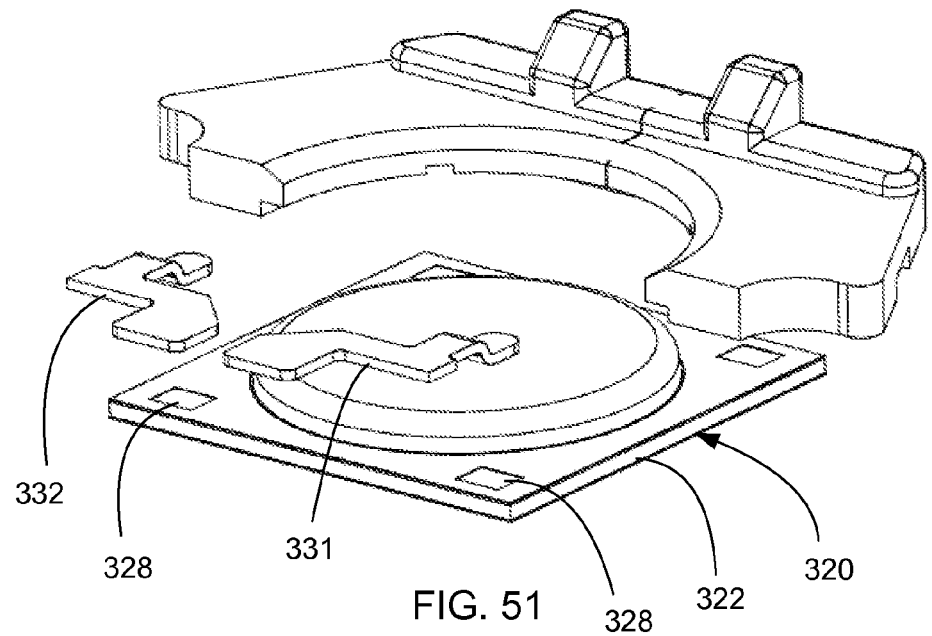
FIG. 51 illustrates a partially exploded perspective view of an embodiment of a LED module with a portion of the holder removed.

As can be further appreciated, the terminals can be configured to be mounted on a circuit board with convention terminal tail configurations. For example, the terminals could include an eye-of-the-needle tail 235d, as depicted in FIG. 46, or with through-hole solder attached tails such as depicted in FIG. 52. It should be noted that FIGS. 46 and 47 illustrate an embodiment with just one pair of contacts (either vertical contacts or through-hole tails). As noted elsewhere, some other number of contacts can be used.

As can be further appreciated, the terminals can be configured in a desired manner. For example, as depicted in FIG. 47, the terminals can be configured to be press-fit into a resulting package. This has the potential to allow for a very low-cost receptacle (e.g., two plated vias) that is incorporated into a substrate such as a circuit board or MID plate while avoiding the need for hand soldering. And if the application did use a receiving substrate then terminals such as depicted in FIG. 47 could be provided so that they are positioned close together so as to allow for a simple low-cost connector to be mated to the terminals.

Figure 54:
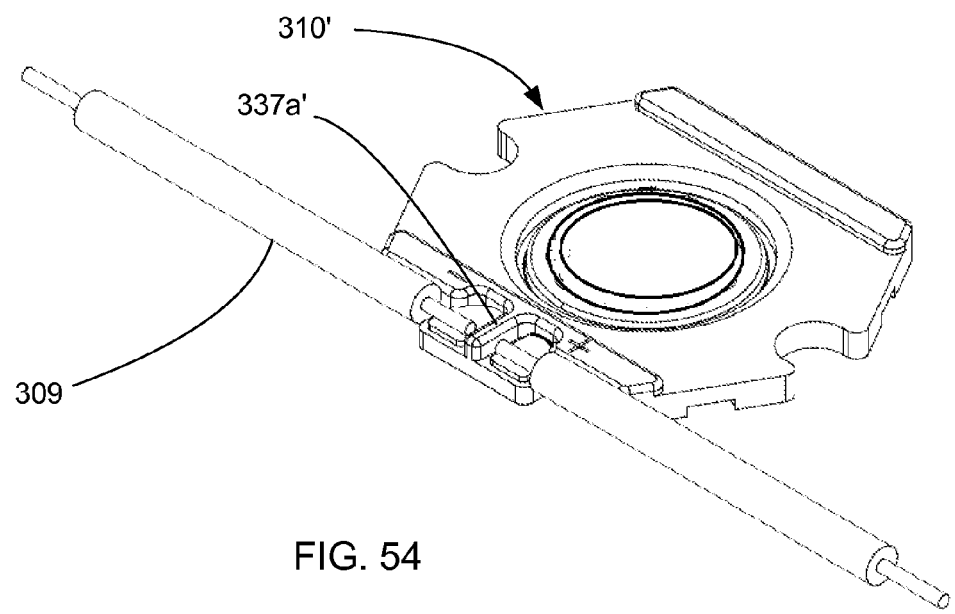
FIG. 54 illustrates a perspective view of an embodiment of an LED module soldered to two conductors.
Figure 55:
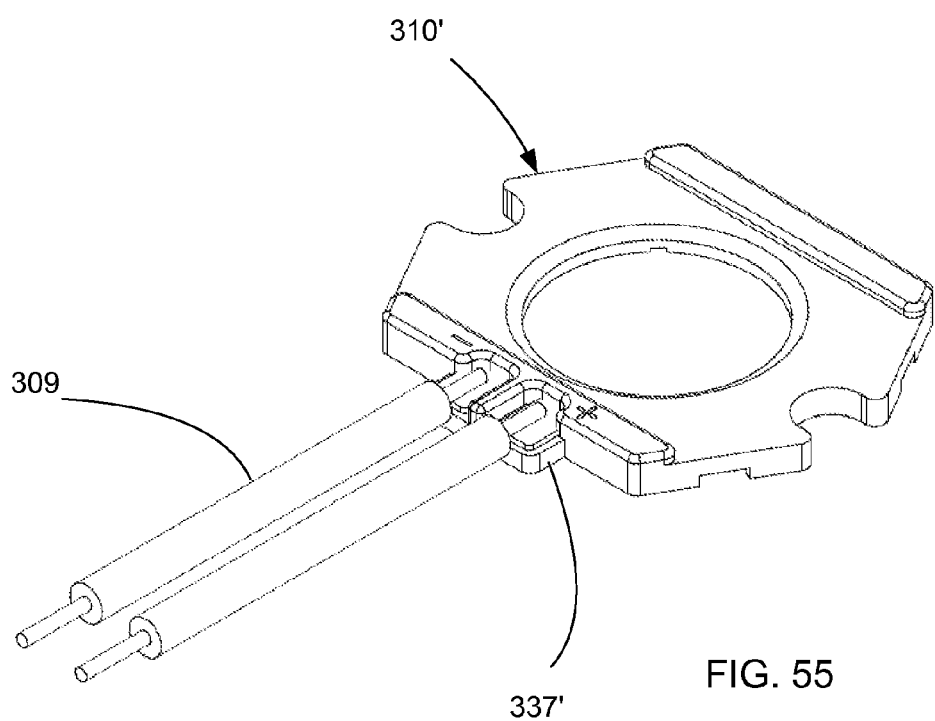
FIG. 55 illustrates a perspective view of another embodiment of an LED module soldered to two conductors.

If hand soldering was desired for process reasons, then the embodiment depicted in FIGS. 48-51 and 54-55 would allow for a safe soldering of a wire to the LED module. As can be appreciated, the terminals 331, 332 are configured so that contacts 331a, 332b are positioned on an optional shelf 337 that is provided in base 330 and that would help protect the area below the terminals from being influenced by the forming of a solder connection. The terminals 331, 332 include pads, such as pad 331b, that are soldered to contacts 328 on a plate 322 of LED array 320. The wires, as illustrated in FIGS. 54 and 55, can be aligned as desired and a shelf 337' can include a wall 337a' between the two solder connections to improve manufacturing.

Figure 56:
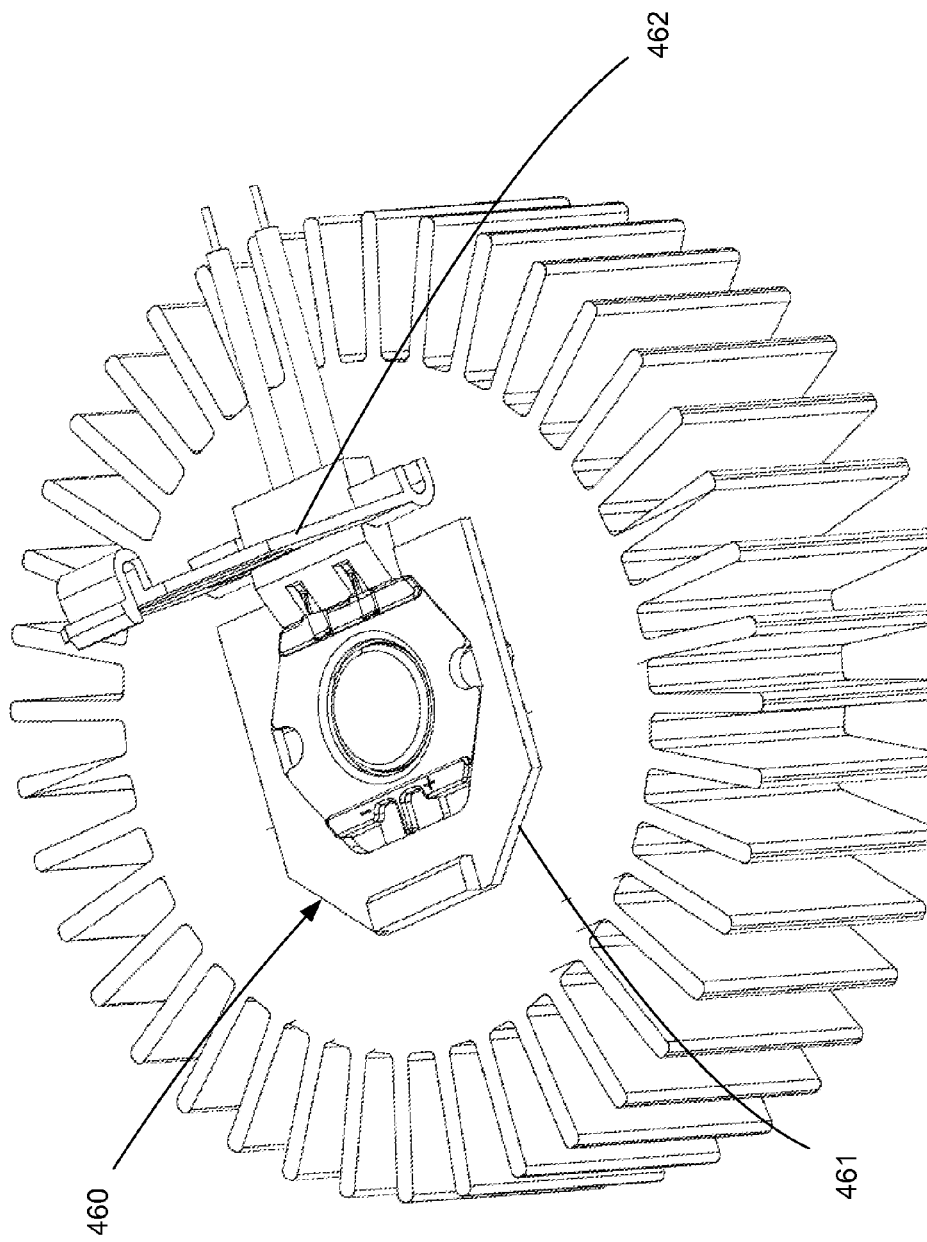
FIG. 56 illustrates a perspective view of an embodiment of a LED assembly with a cover in an open position.
Figure 57:
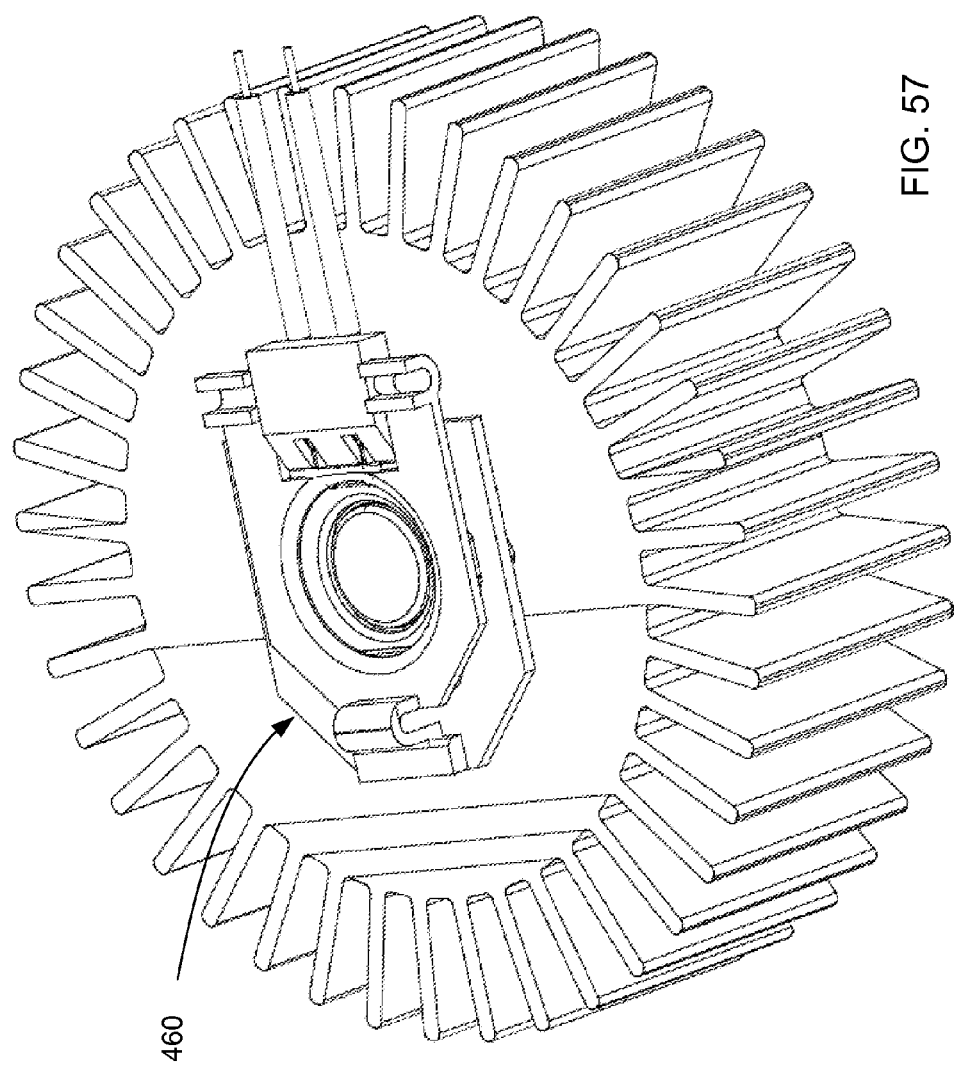
FIG. 57 illustrates a perspective view of an embodiment of a LED assembly with a cover in a closed position.

FIGS. 56 and 57 illustrate features an embodiment that provides for a LED system 460 that can accept an LED module without the need for fasteners to secure the LED module in place. A frame 461 is provided with an aperture and a receptacle (which can be similar to the receptacle depicted in FIG. 36) and the LED module is placed in the aperture. If the frame 461 is mounted on a heat sink, the LED module can have a thermal connection between the LED module and the heat sink that provides low thermal resistance (less than 3 C/W and preferably less than 2 C/W). As can be appreciated, the frame 461 could be mounted on or integrated into a circuit board. A cover 462 is translateably supported by the frame 461. When the cover 462 is translated into a close position it acts to secure the LED module against a heat sink. For example, as depicted, the cover 462 has a first end coupled to the frame 461 in a pivotal manner and the second end snaps into engagement with the frame 461 when the cover 462 is pivoted into the closed position.

Figure 58:
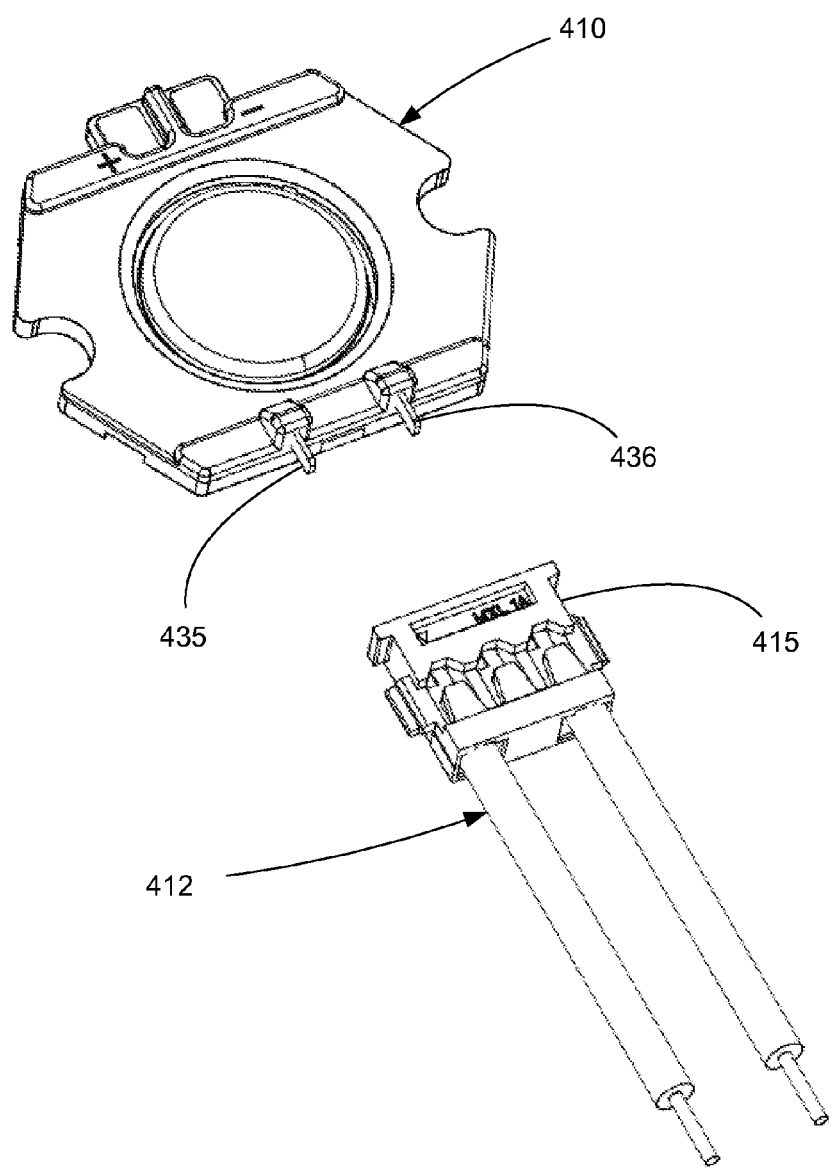
FIG. 58 illustrates a perspective view of an embodiment of a LED module before being mated to a mating connector.
Figure 59:
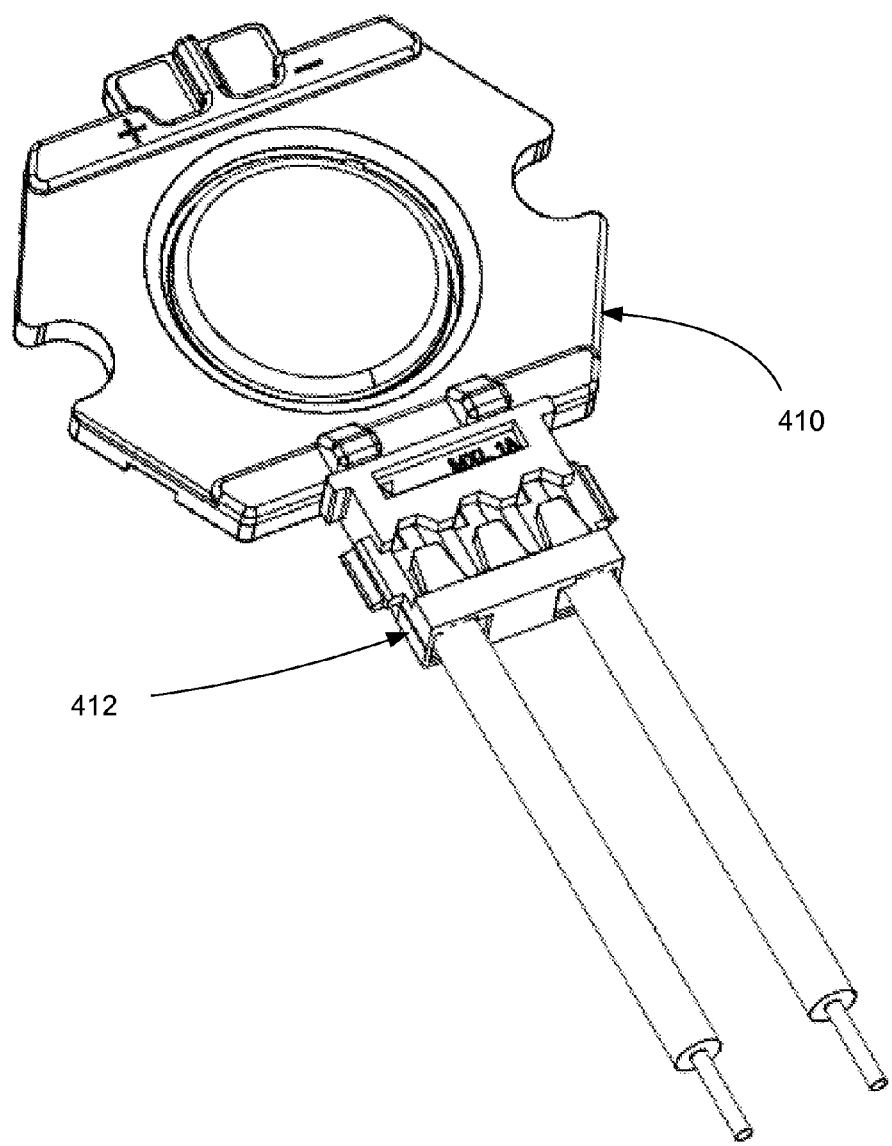
FIG. 59 illustrates a perspective view of an embodiment of a LED module after being mated to a mating connector.

FIGS. 58-59 illustrate an embodiment of an LED module 410 configured to be coupled to a mating connector 412. As can be appreciated, a LED system can have one or more features that allow a mating connector to be releasably coupled to the LED module 410 while the terminals 435, 436 supported by the LED module engage contacts in the mating connector. Such a configuration is especially suited to situations where a power source is configured to power multiple LED modules as several mating connectors can be wired in parallel or series (as is appropriate for the selected power source).

Figure 60:
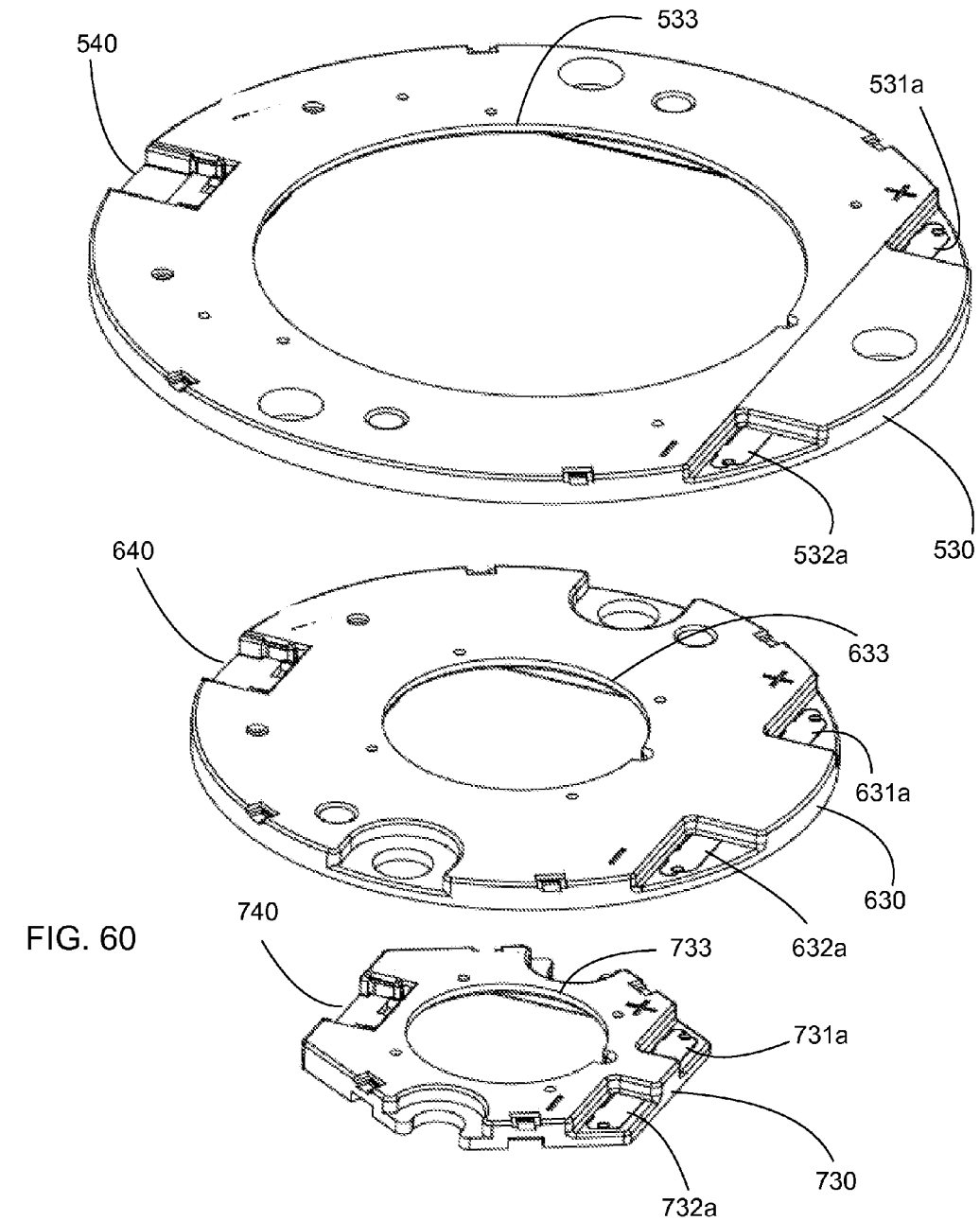
FIG. 60 illustrates a perspective view of embodiments of a holder.

Looking at FIGS. 60-74, alternative embodiments of holder are depicted. In FIG. 60, three sizes of holder embodiments are depicted, holder 530 configured to engage a larger LED array, holder 630 configured to engage a medium sized LED array and holder 730 is configured to provide a package that is substantially the same as a convention star package. As can be appreciated, the depicted holders allow for electrical connection on a top side of the LED array while providing electrical connections that are suitable for the desired application.

As depicted, holder 530, which provides an aperture 533 in a base 530a that includes an outer edge 530b, includes an integrated connector 540 and two solder contacts 531a, 532a. Similarly, holder 630 provides an aperture 633 and includes an integrated connector 640 and to solder contacts 631a and 632a. In addition, holder 730 provides an aperture 733 and includes an integrated connector 740 along with solder contacts 731a, 732a.

As can be appreciated, each of the depicted holders includes a wall between the solder contacts. This, as previously discussed, help ensure a reliable solder connection while minimizing the change of shorting between the two solder contacts. Of course, the solder contacts can be omitted and power can be provided to the holder via the integrated connector. In that regard, it should be noted that the same size integrated connector can be used for all three sizes.

Figure 61:
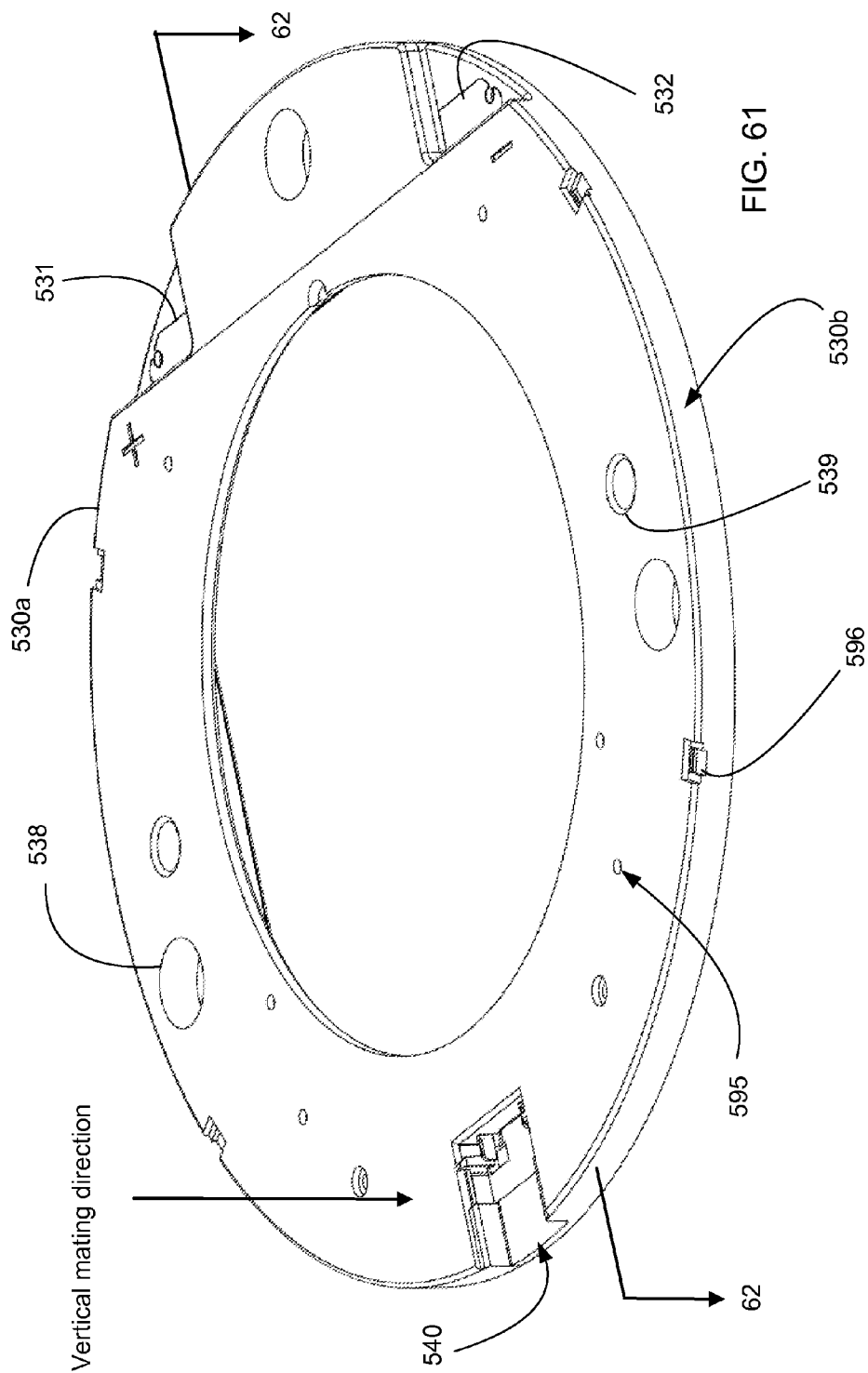
FIG. 61 illustrates a perspective view of an embodiment of a holder.
Figure 62:
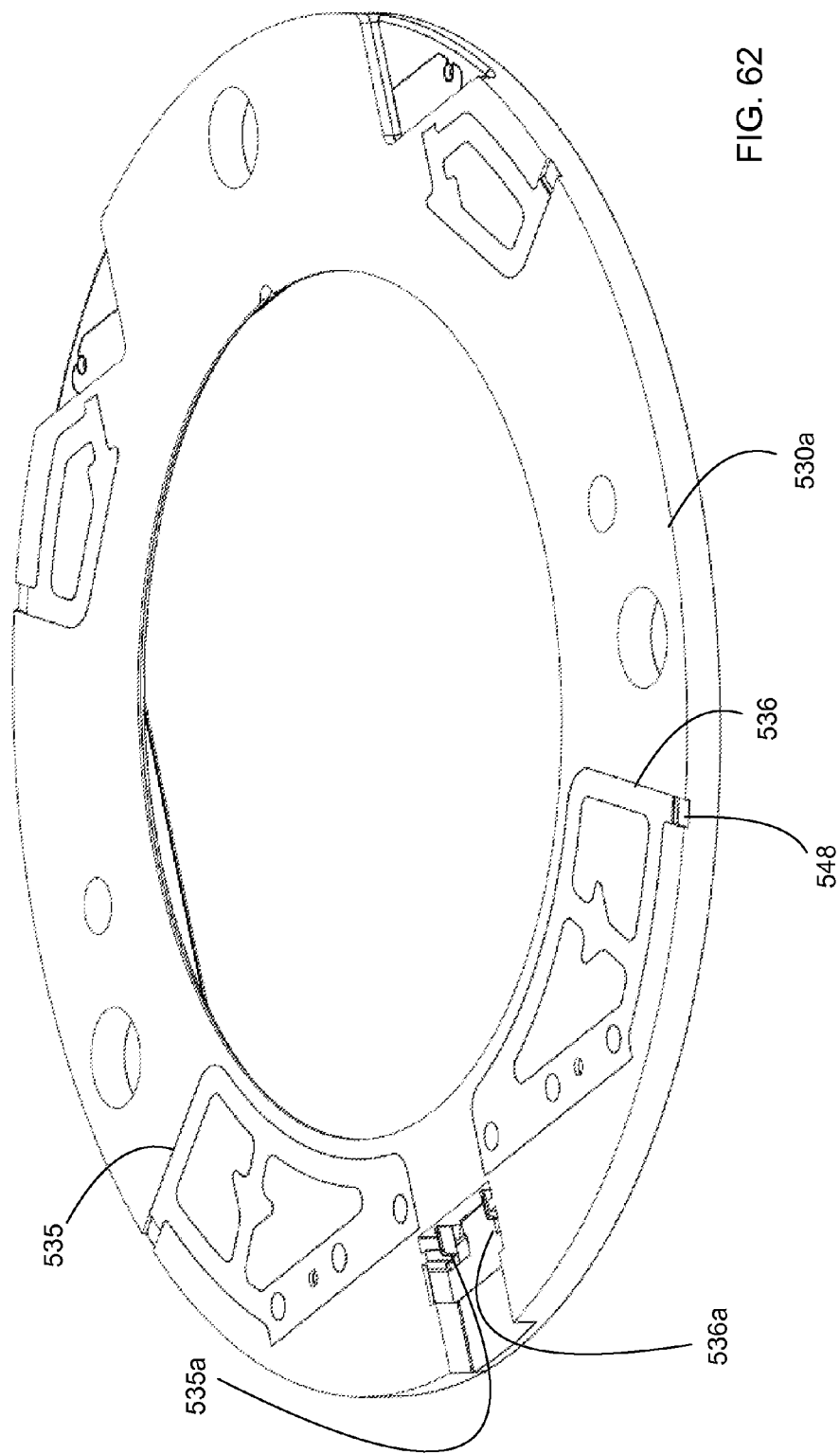
FIG. 62 illustrates a perspective view of the embodiment depicted in FIG. 61, taken along line 62-62.
Figure 63:
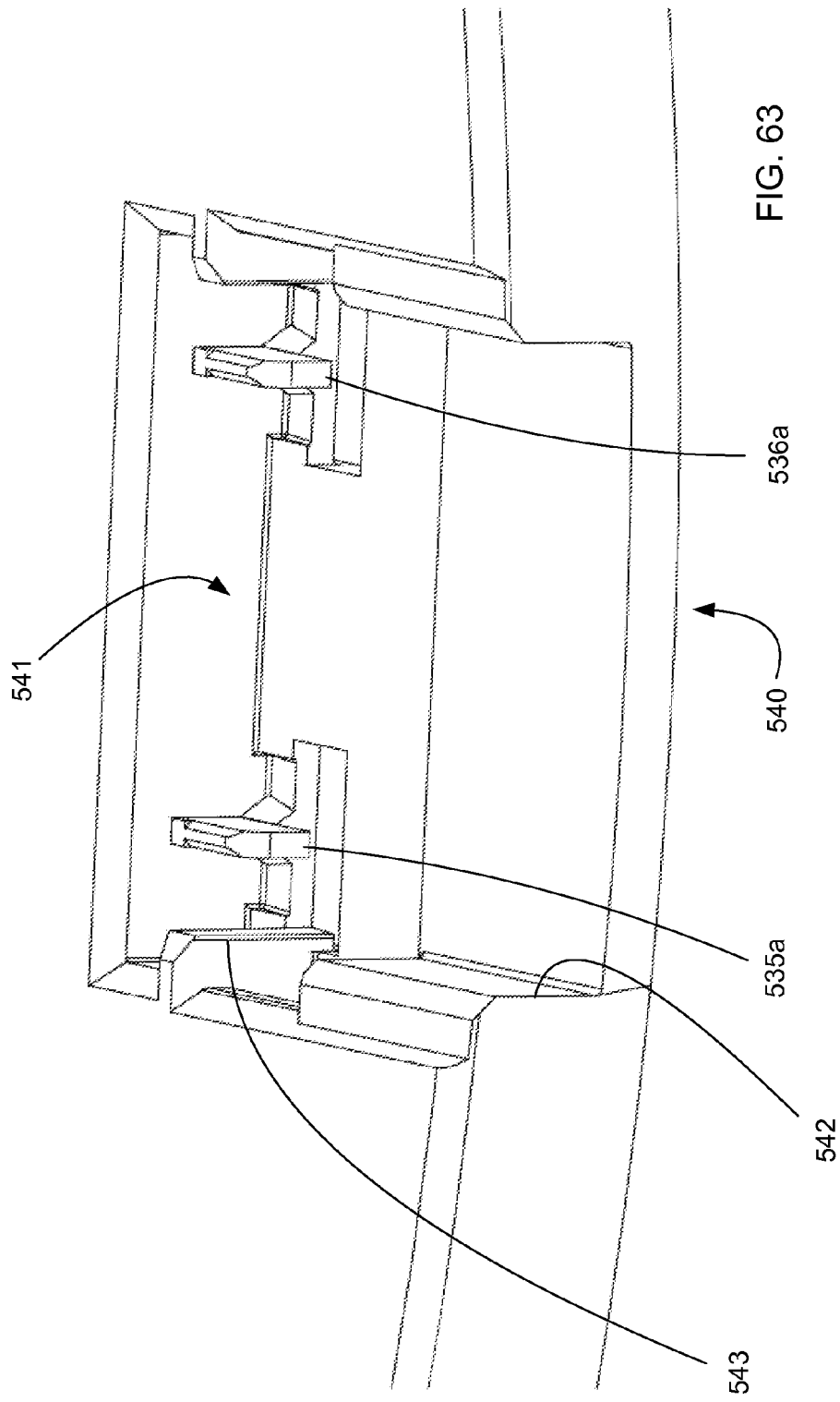
FIG. 63 illustrates a perspective view of an embodiment of an integrated connector.
Figure 64:
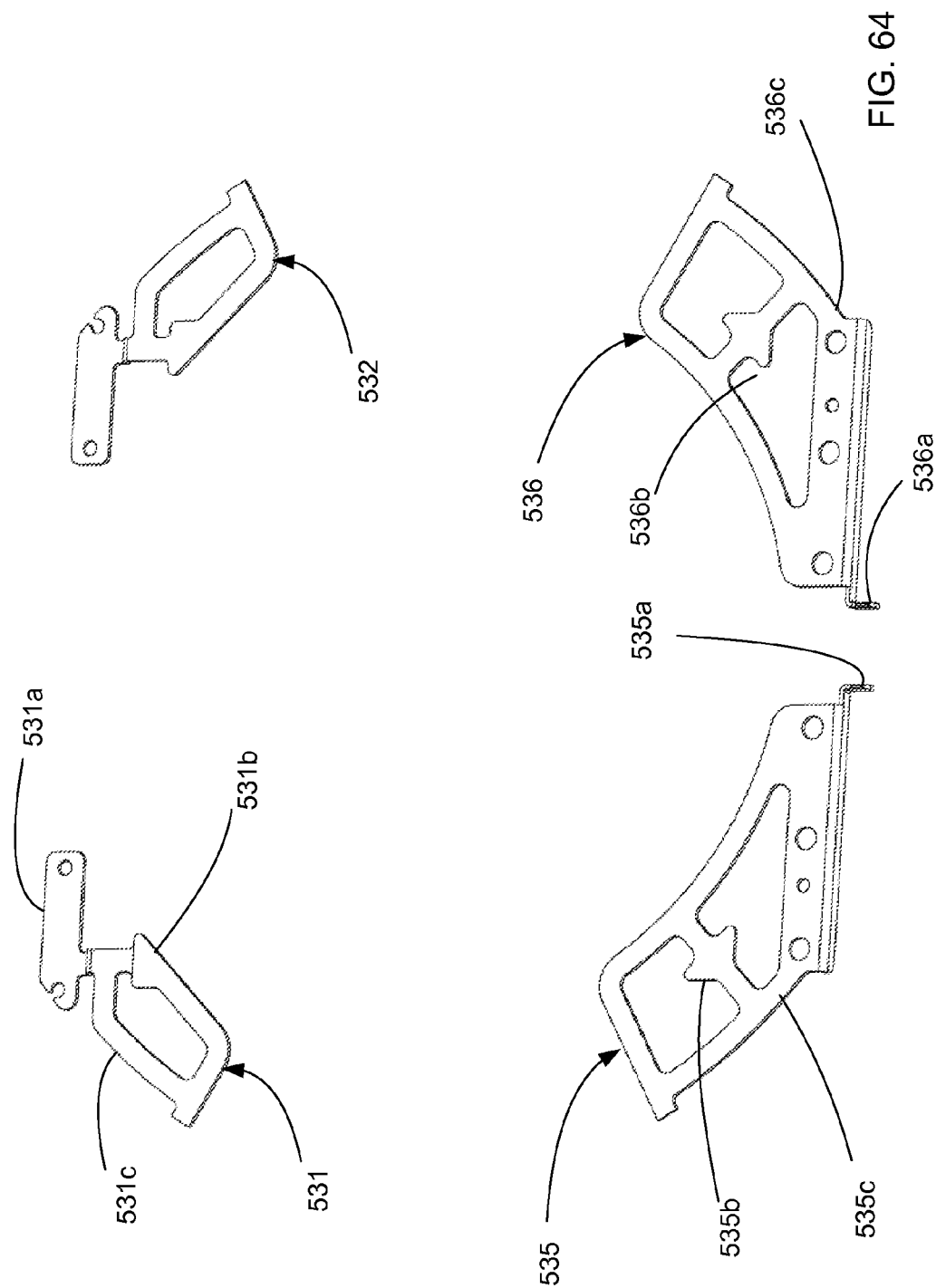
FIG. 64 illustrates a perspective view of an embodiment of terminals suitable for use in a holder.
Figure 66:
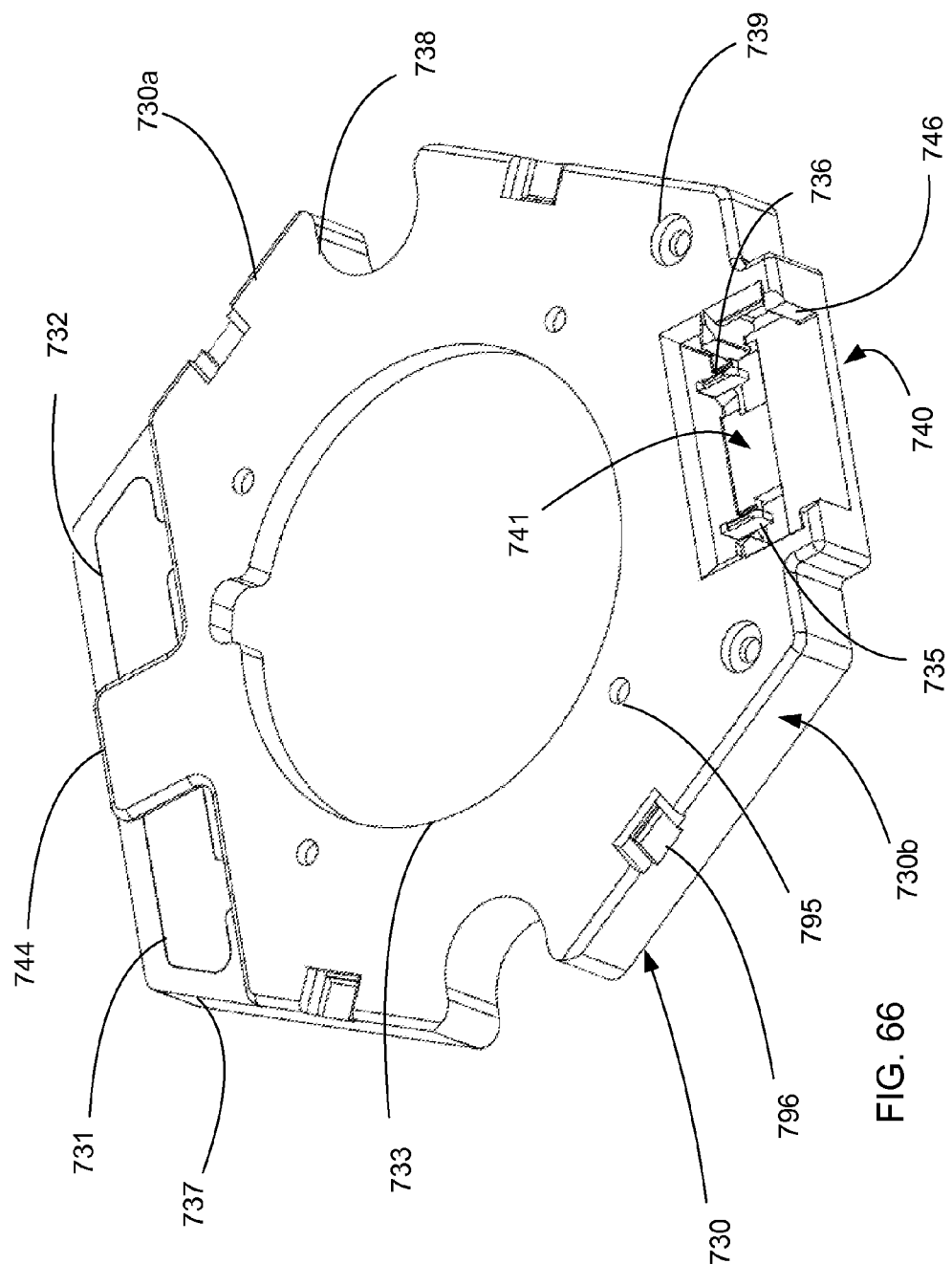
FIG. 66 illustrates a perspective view of an embodiment of a holder.
Figure 67:
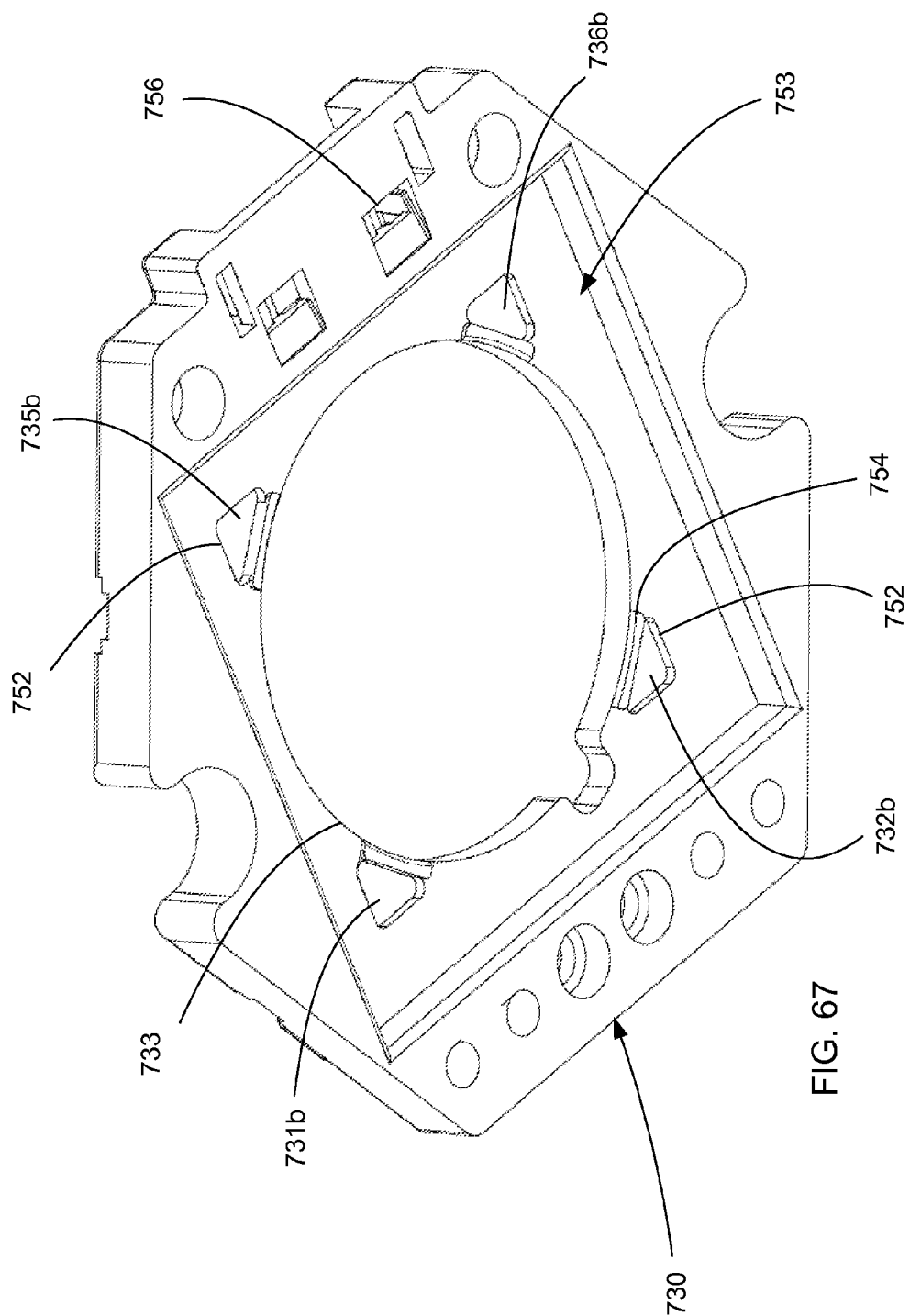
FIG. 67 illustrates another perspective view of an embodiment of the holder depicted in FIG. 66.
Figure 68:
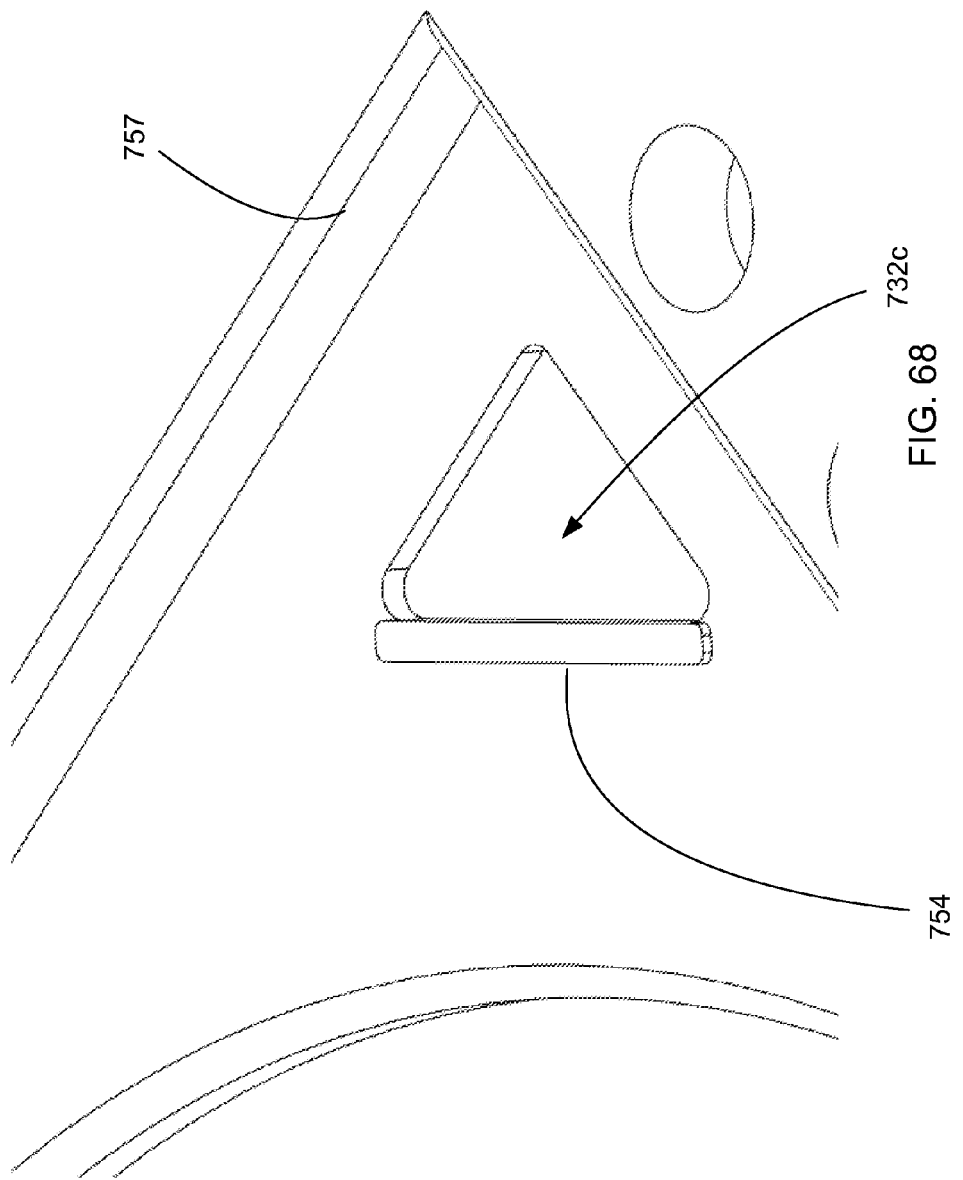
FIG. 68 illustrates a perspective enlarged view of an embodiment of a pad as depicted in FIG. 67.
Figure 69:
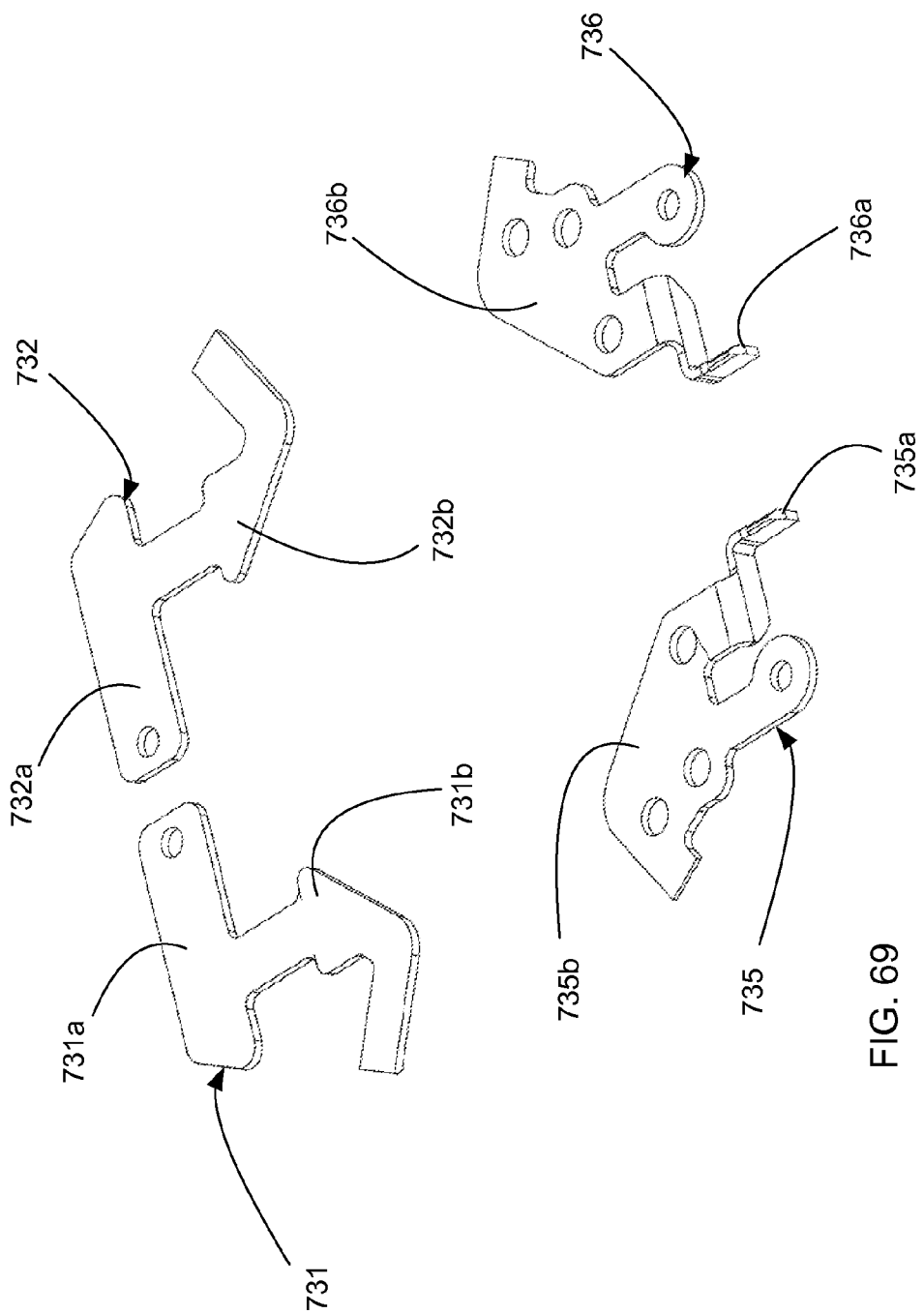
FIG. 69 illustrates a perspective view of an embodiment of a terminals suitable for use in a holder.
Figure 70:
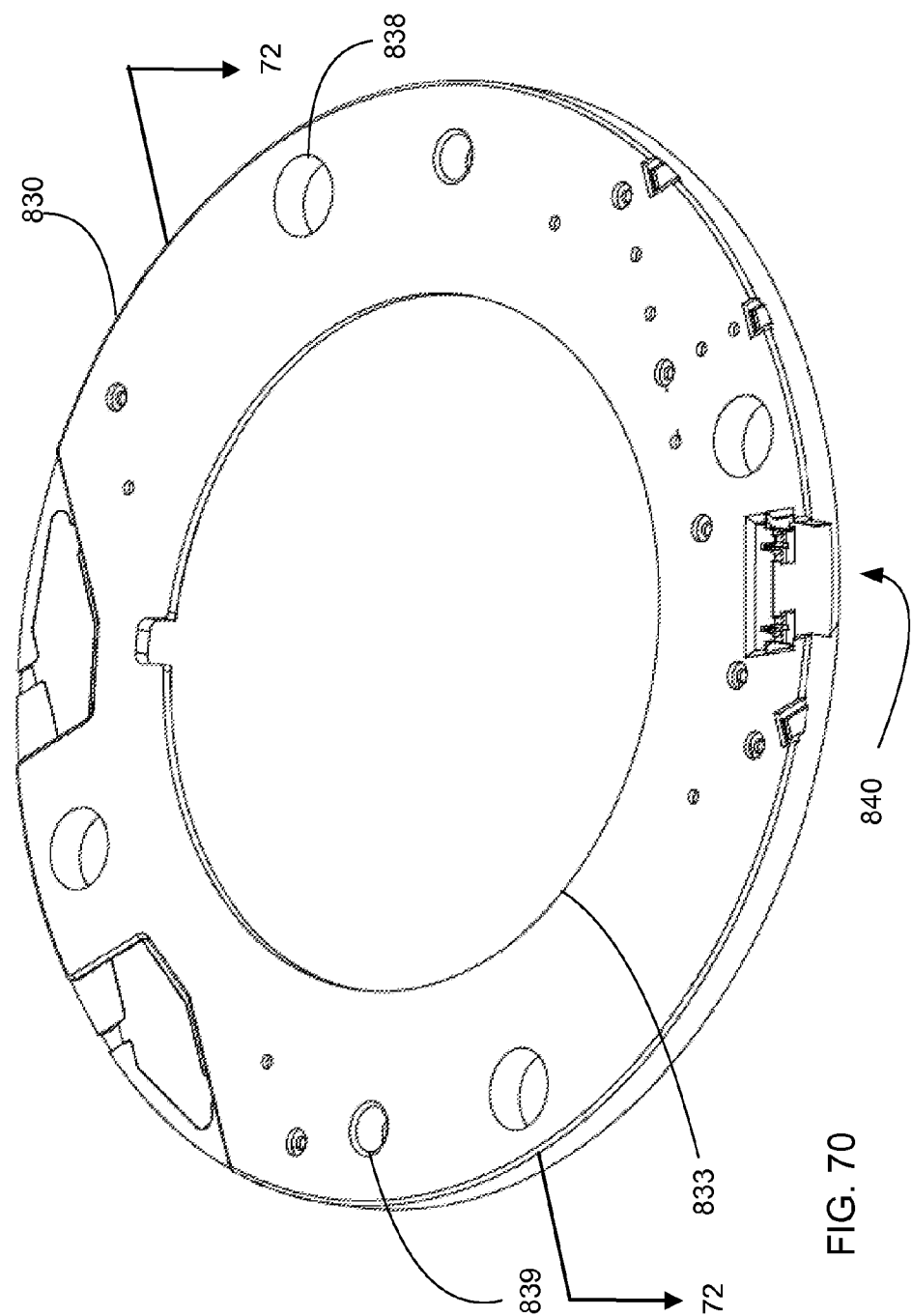
FIG. 70 illustrates a perspective view of an embodiment of a holder.
Figure 71:
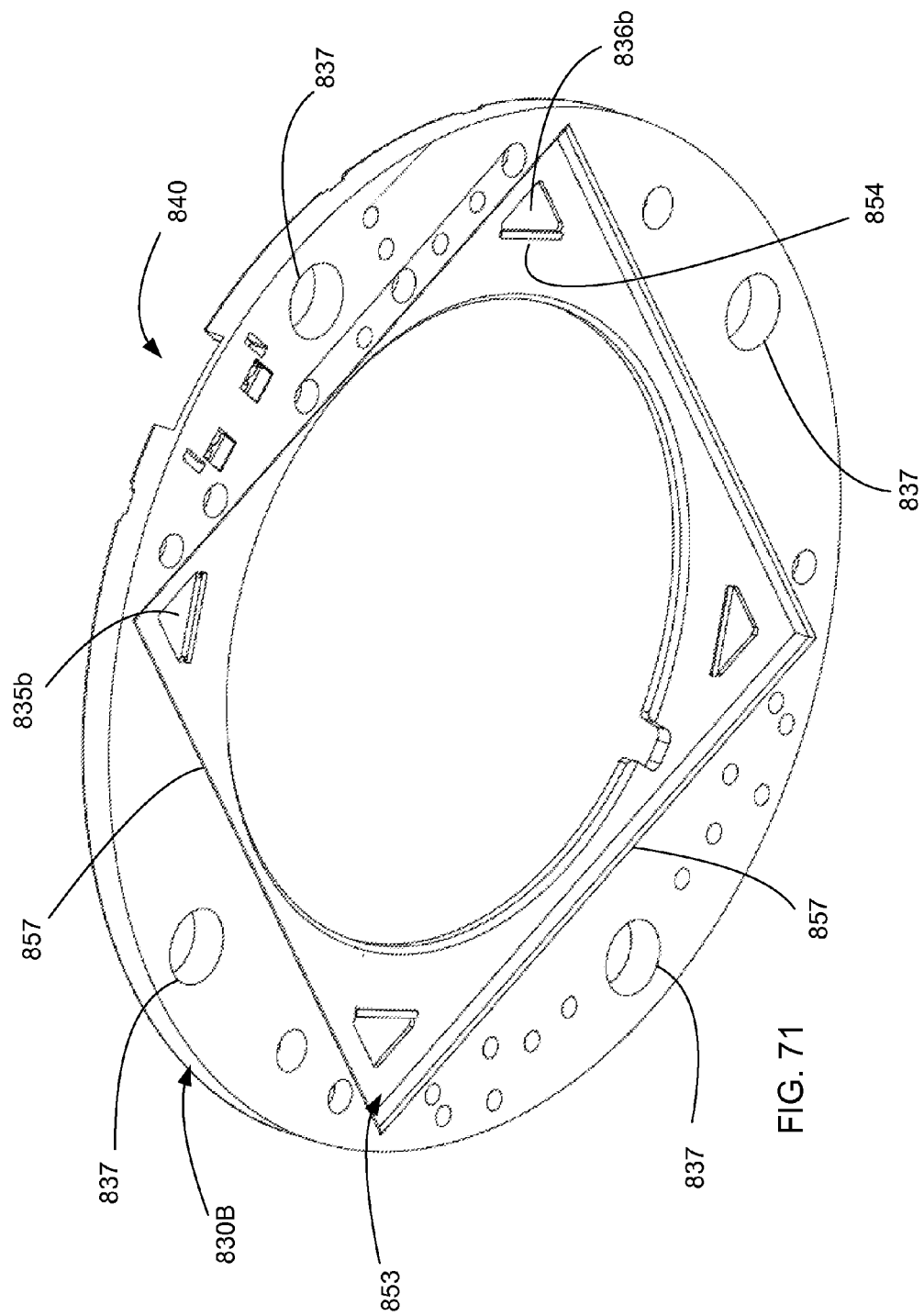
FIG. 71 illustrates another perspective view of an embodiment of the holder depicted in FIG. 70.
Figure 72:
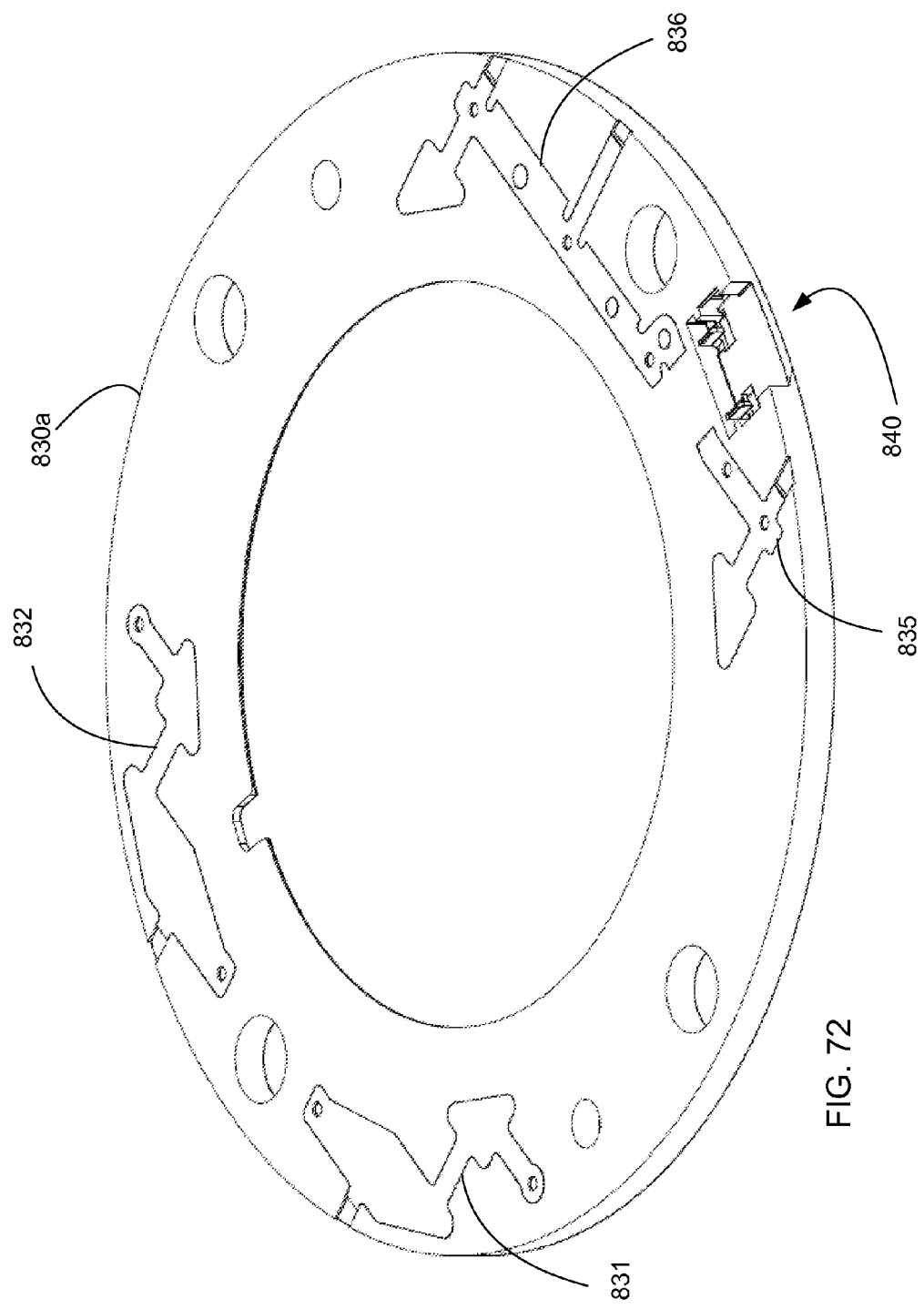
FIG. 72 illustrates a perspective view of a cross-section of the embodiment depicted in FIG. 70, taken along line 72-72.
Figure 73:
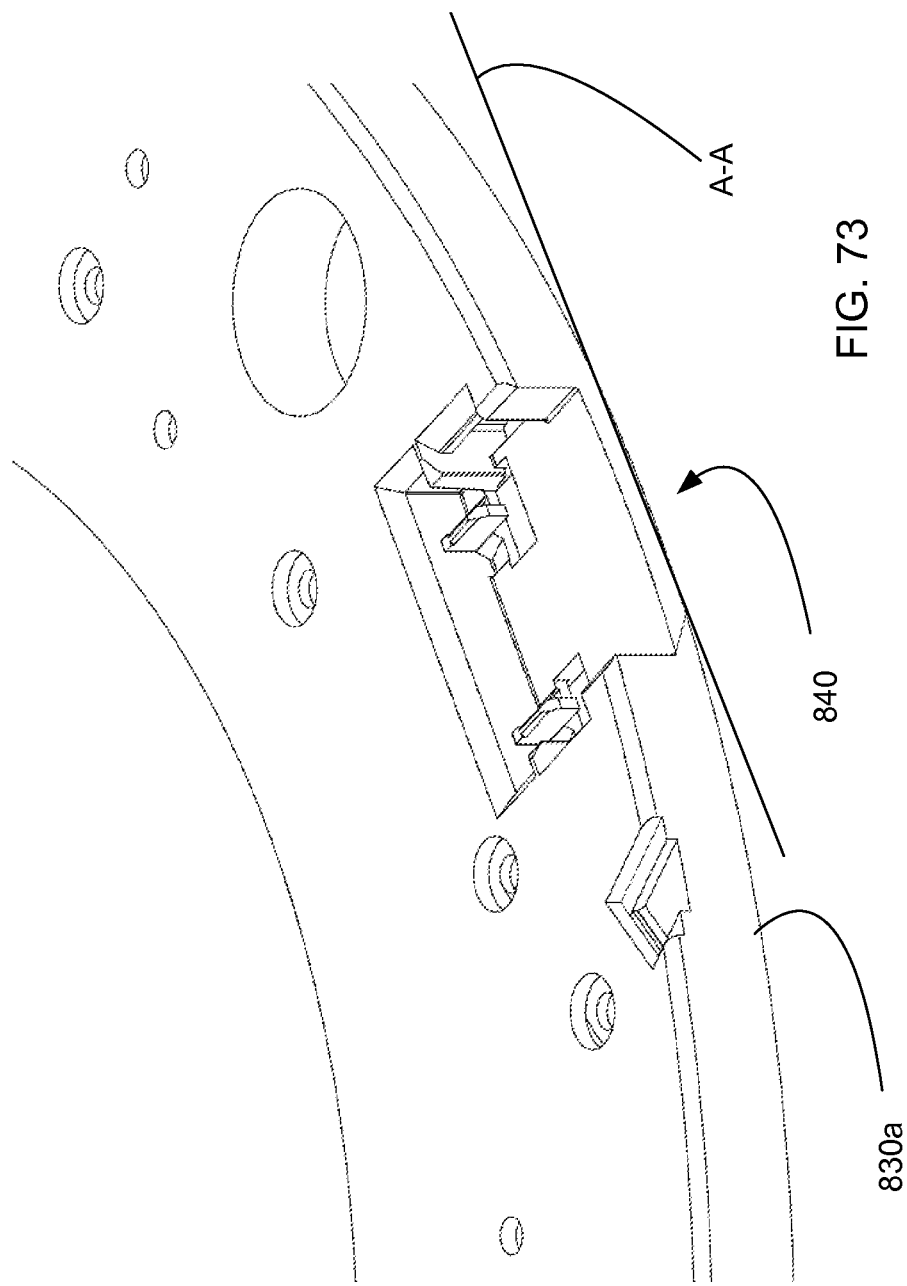
FIG. 73 illustrates a perspective view of an embodiment of an integrated connector.
Figure 74:
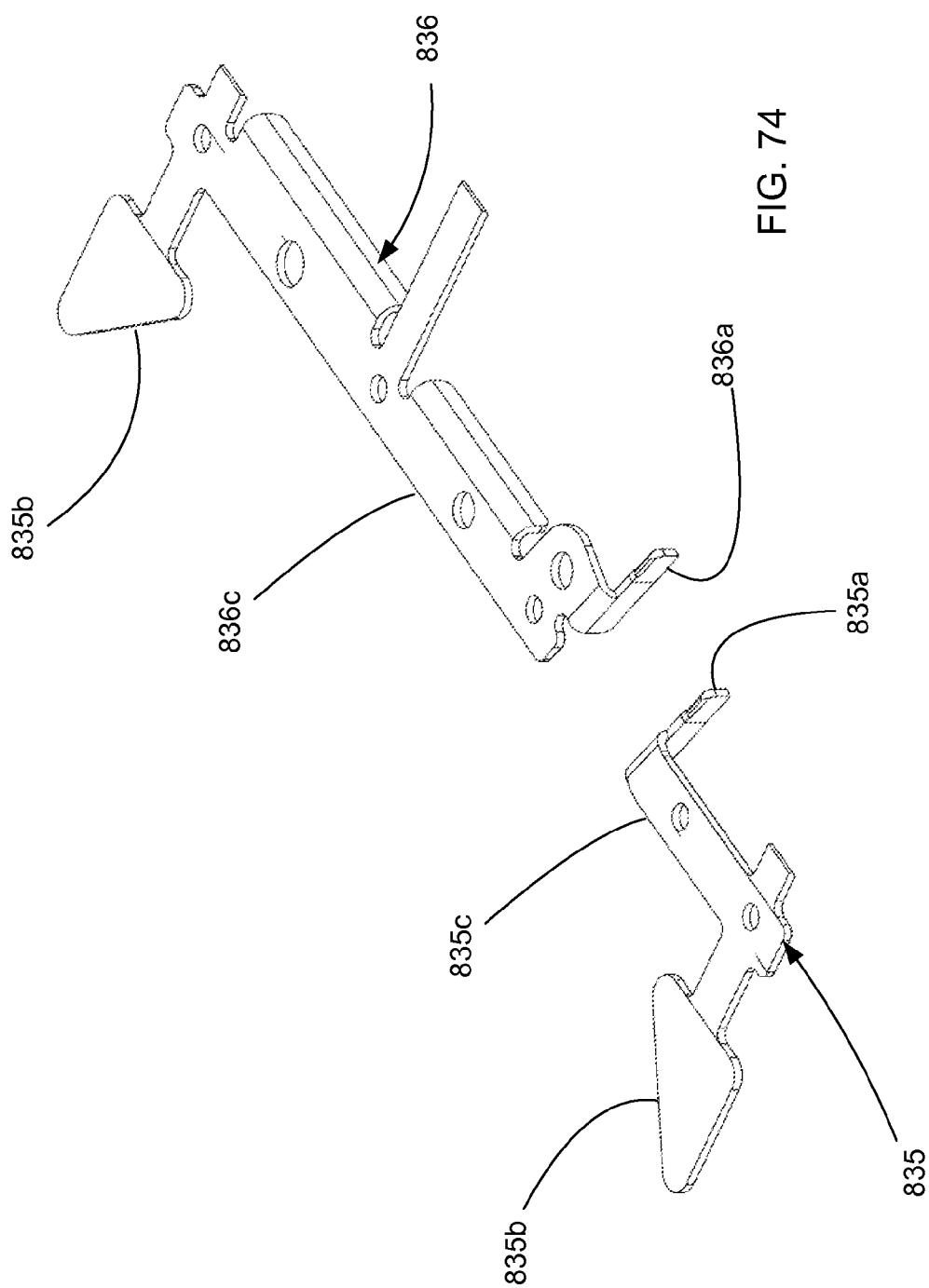
FIG. 74 illustrates a perspective view of an embodiment of terminals suitable for use with the integrate connector depicted in FIG. 73.

As can be appreciated from FIG. 61, the depicted embodiments allow for vertical translation of a mating connector directly into the integrated connector 540 of holder 530. It should be noted, however, that alternative embodiments could also have an embodiment that allows for horizontal translation (such as is depicted in FIGS. 58-59). One benefit of allowing for vertical translation of the mating connector is that it allows the resultant LED module to be utilized in packaging situations where it would not otherwise be possible to easily accommodate an LED module. As can be appreciated, the holders depicted in FIGS. 60 and 70 can be soldered directly to a corresponding LED array and then the entire assembly can be attached with any desirable fastener. As depicted, for example, a simple screw attach method is shown. Alternatively, a lip could be clamped down with a separate locking mechanism. In other embodiments, a magnet could be used to attaching the LED module. As can be appreciated, the embodiments depicted in FIGS. 60 and 70 allow the LED module to be installed onto a supporting fixture and then allows for vertical installation of the power source (e.g., the conductors that provide the power). Of course, the depicted design also provides a very low profile, allowing a holder that is less than 2 mm thick. If the holder is formed of a desirable material, it can even be highly reflective so as to aid in light extraction of the resulting assembly.

As can be appreciated from FIGS. 62-65, one benefit of the depicted configuration is to have the terminals with a support structure (e.g., the body) of the terminals that is in a different vertical height compared to the contact. Terminals 535, 536 each have vertical contacts 535a, 536a, pads 535b, 536b and terminal bodies 535c, 536c. Terminals 531, 532 are similarly configured, with terminal 531, for example, including solder contact 531a, a pad 532b and a body 531c that connects the pad 532b to the solder contact 531a. The terminals 535 and 536, for example, have vertical contacts 535a, 536a that are at a different vertical height than a terminal body 535c, 536c. Pads 535b, 536b can be at the same vertical height as the terminal body 535c, 536c. Thus, if desired, both the terminal body 535c, 536c and the pads 535b, 536b (as depicted) can be at a different vertical level than the contacts and in an embodiment, as illustrated in FIG. 65, the contacts can be positioned below the terminal body and pad. As can be appreciated, the pads are adjacent the aperture 533 while the contacts are adjacent and/or exposed near the outer edge 530b.

It has been determined that this is a more efficient packaging and positioning configuration of the terminals in the holder and helps allow the resulting holder to maintain a lower profile. It should be noted, however, that while two pairs of terminals are provided in certain of the depicted embodiments there is no requirement that two pairs of terminals be used. If desired, for example and as discussed above, just the terminals 531, 532 could be provided. In another embodiment just the terminals 535, 536 could be provided. The benefit of providing both pairs of terminals is that the cost of the assembly is only slightly increased but a more flexible holder is provided that can reduce inventory.

The integrated connector 540 includes two walls 542 that help define a recess 541. Two vertical contacts 535a, 536a project into the recess and allow for vertical translation engagement with a mating connector. It should be noted that other terminal configuration are possible but if a vertical contact is being used then the contacts are configured to engage a mating connector via a vertical translation between the mating connector and the integrated connector 540. To help further improve alignment a vertical wall 543 that extends into the recess can be provided and the vertical wall 543 can be used to control the location of a mating connector.

On additional feature that has been determined to be valuable can be appreciated from FIG. 61, where at least one terminal aperture 595 is provided for each terminal The terminal aperture 595 allow a removable support member (not shown) to support the terminal in position prior to forming of the base in an insert molding operation. Then, once the terminal is supported by the base 630a (which can be an insulative, highly reflective material if desired), the support member is removed and only the terminal aperture is left. The use of the support member allows the terminals to be supported in at least two locations during insert molding (side terminal aperture 596 also allows a tab to be removed and the tab could be used to support the terminal prior to insert molding) and has been determined to provide desirable orientation functionality while avoiding the need to have a second side terminal aperture (likely such a second side terminal aperture would be needed in the aperture that is directly aligned with the LED array). Furthermore, the support member can be positioned so as to extend perpendicular to the terminal, which allows for additional positional control of the terminal during the insert molding process. As can be appreciated, lower terminal apertures can be provided on either side of the terminal so that the terminal can be supported as desired.

While only the holders are depicted in FIGS. 60-74, the LED array such as LED array 120 or 20 (discussed above) can be positioned in the corresponding holder and a thermal layer may be placed on the LED array to help ensure there is acceptable thermal coupling to a supporting surface, as noted previously while discussing the other embodiments of the holders. Thus, certain beneficial features discussed above with respect to LED modules can also be incorporated into the holders depicted in FIGS. 60-74 when the holders are joined with an LED array so as to form a LED module.

As can be appreciated from the embodiments depicted in FIGS. 60-74, a plurality of embodiments are provided that offer a holder with a circular opening that is configure to receive a circular shaped LED emitter. One such embodiment is depicted in FIG. 66-69. Specifically, holder 730 includes a base 730a that has an outer edge 730b that supports terminals 731, 732, 735 and 736. The terminals 731 and 732 are configured so that contacts 731a, 732a (which are examples of horizontal contacts) are positioned on a shelf 737 and are separated by a wall 744 while terminals 735, 736 are configured so that contacts 735a, 736a (which may be vertical contacts) are positioned so as to extend in a recess 741 of integrated connector 740. Naturally, other configurations other than vertical or horizontal contacts are suitable and these features, while beneficial, are not intended to be limiting unless otherwise noted. To further improve retention of a mating connector, integrated connector 740 includes a shoulder 746 (which is depicted as being on two sides but could also be provided on just one side) that helps ensure the mating connector is securely retained in the integrated connector 740.

The holder 730 includes the aperture 733 and has optional fastener apertures 738 that can be used to secure the holder into an installed position (if it is desired to attach the resultant LED module with a fastener). The holder 730 further includes a terminal aperture 795 and a side terminal aperture 796 associated with each terminal To improve solder attach to a LED array (such as LED array 20, 120 or any other desirable LED array), the terminals include pads 731b, 732b, 735b and 736b that are each positioned in a terminal notch 752. A solder wall 754 can be positioned between the pad 731b, 732b, 735b and 736b and the aperture 733 so as to help shield the LED from any solder that might otherwise spray on the LED during a reflow operation. As can be appreciated, therefore, the pads are adjacent the aperture 633 while the contacts are adjacent and/or exposed near the outer edge 630b.

It has been determined to be beneficial to have the circular opening aligned with the LED emitter. It has been determined that one way to accomplish this is to have the recess 753 defined by wall 757 sized so as to accommodate a substantial variation in the location of the LED emitter on the plate. In that way, the LED emitter can still be centered with the aperture (such as aperture 633) while not requiring more costly controls to also align the LED emitter with an edge of the plate. For example, a 1 mm or greater clearance can be provided. This can allow for a manufacturing process that is less costly as it may be easier to align the LED emitter and the corresponding contacts on the surface of the LED array compared to each other versus aligning the location of the LED emitter with respect to an edge of the plate (particularly if the edges of the plate are formed later).

As can be appreciated, another benefit of some of the embodiments depicted is that in a traditional LED array design the substrate is large enough to allow for contacts that can be readily connected to power sources. The holder, however, allows for the use of smaller substrates (e.g., plates) to support the LED emitter while providing connectivity with an attaching power source with a less costly holder. Furthermore, as the holder can be configured with an integrated connector it provides substantial cost savings. The ability to solder the LED array directly to the holder provides a one-piece package that can be easily assembled in a fixture or other application. The spaced apart pads, along with the solder dam allows for improved performance in a simple to use system. In addition, the ability to provide a vertical connection allows for greater flexibility in how the LED module is packaged. Thus, unlike previous holders, the depicted one-piece LED modules simplify the use of LED arrays while providing a robust design.

It should be noted that in certain applications the holder can be formed of a resin that is resistance changing colors during a reflow operation. Such a resin allows the holder and LED array to pass through a reflow operation without causing substantial discoloration to the holder.

Some of the depicted holders provide an optic window (an volume extending from a surface of the holder upward at an angle) that is not obstructed by the holder. It should be noted that the terminals can be configured so as to have their contacts be positioned outside of the optic window. This allows for easier packaging when making a connection to the contacts. It also provides for great flexibility in packaging the optic. As noted above, the holder can also provide attachment points (such as apertures 739) for securing an optic to the holder.

FIGS. 70-74 illustrate an embodiment of a holder 830 that includes a number of the features previously discussed and also include some additional features. Specifically, holder 830 includes an aperture 833, fastener apertures 838 and optic apertures 839 provided in a base 830a that has an outer edge 830b. The base 830a further includes an integrated connector 840 as well as a recess 853, which is defined by wall 857 and is designed to receive an LED array so that contacts on the LED array are aligned with pads (such as pads 835b, 836b) and the pads are protected from the aperture 833 by a corresponding solder wall 854. As can be appreciated, therefore, the pads are adjacent the aperture 833 while the contacts are adjacent and/or exposed near the outer edge 830b.

While the design of holder 830 is similar to the holder 530, one difference is that there are four fastener apertures so that the holder can be attached to a support surface at four locations. As can be appreciated, having the fastener apertures located on four corners provides good stress control but the fastener apertures tend to interfere with placement of the integrated connector 840. To compensate for that, the terminal 835 can be shorter than the terminal 836 so that the integrated connector 840 is offset with respect to the aperture 833. However, the integrated connector 840, as can be appreciated by FIG. 840, can still be configured so that it is aligned at a right angle with line A-A that is tangent to the holder circumference. This can be provided by having the contacts 835a, 836a parallel but angled while the terminal body 835c, 836c is configured in an offset arrangement that has 836c twice as long as 835c.

Figure 75:
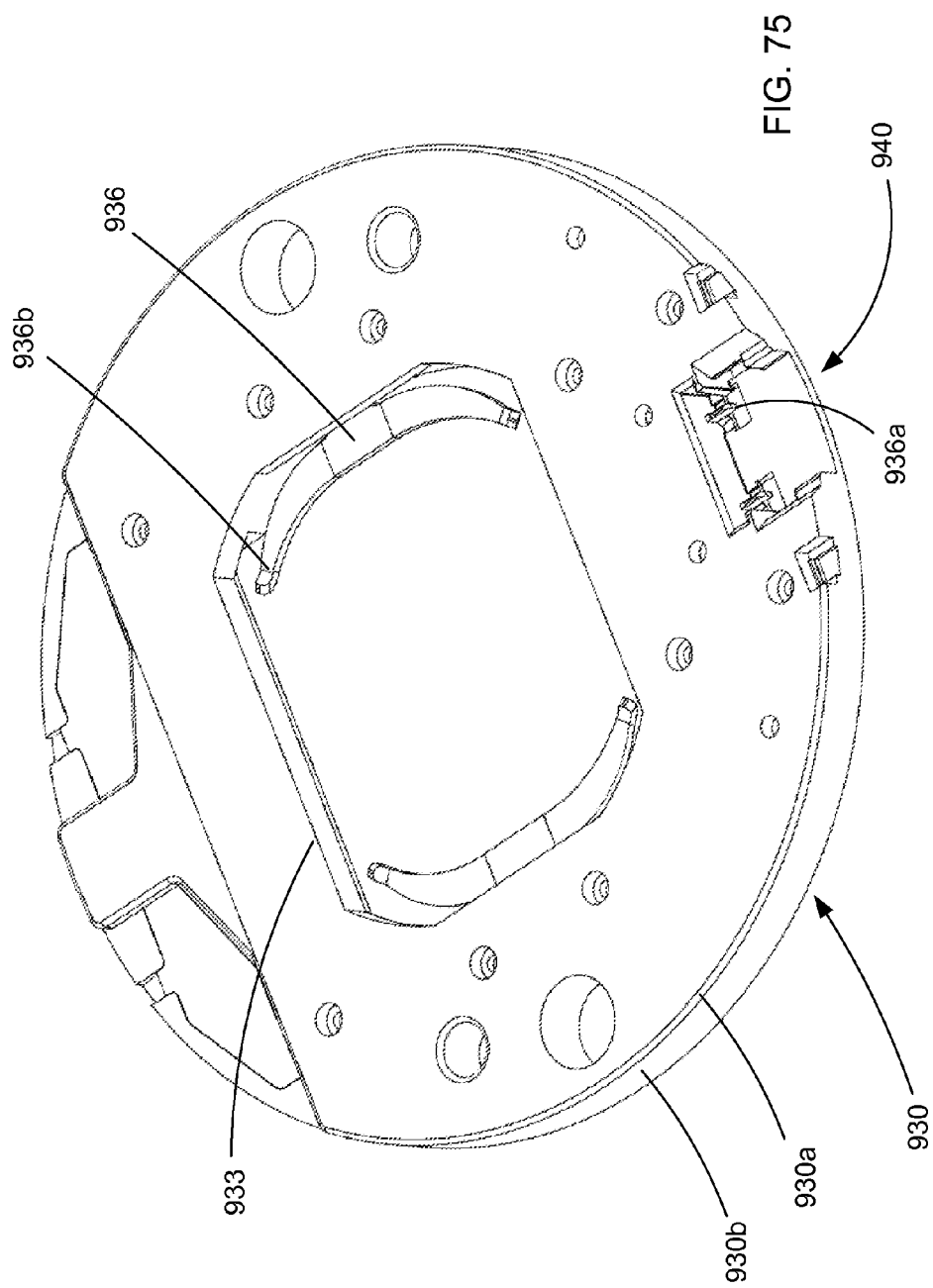
FIG. 75 illustrates a perspective view of an embodiment of a holder that does not require a solder attach to an LED array.
Figure 76:
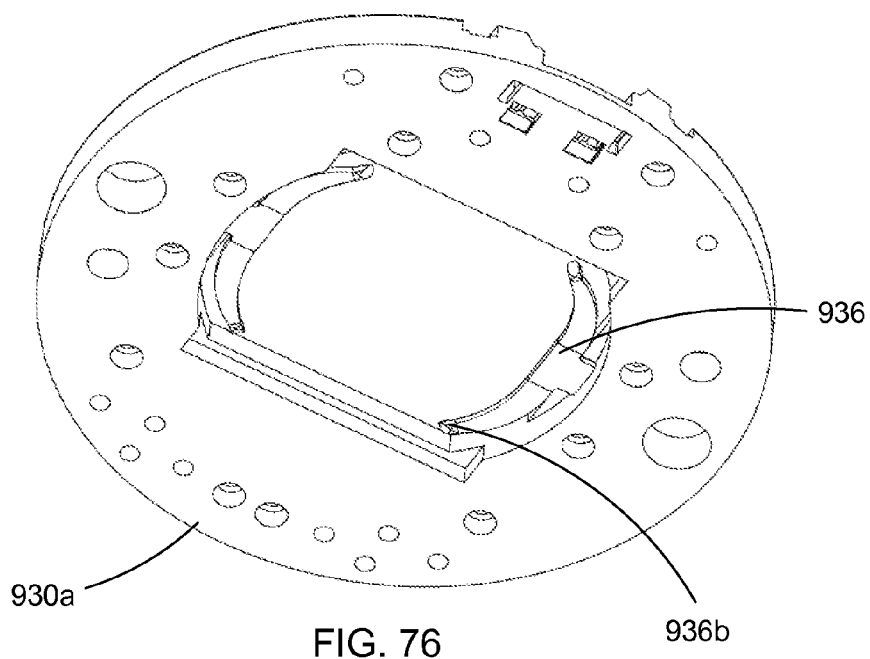
FIG. 76 illustrates another perspective view of the holder depicted in FIG. 75.
Figure 77:
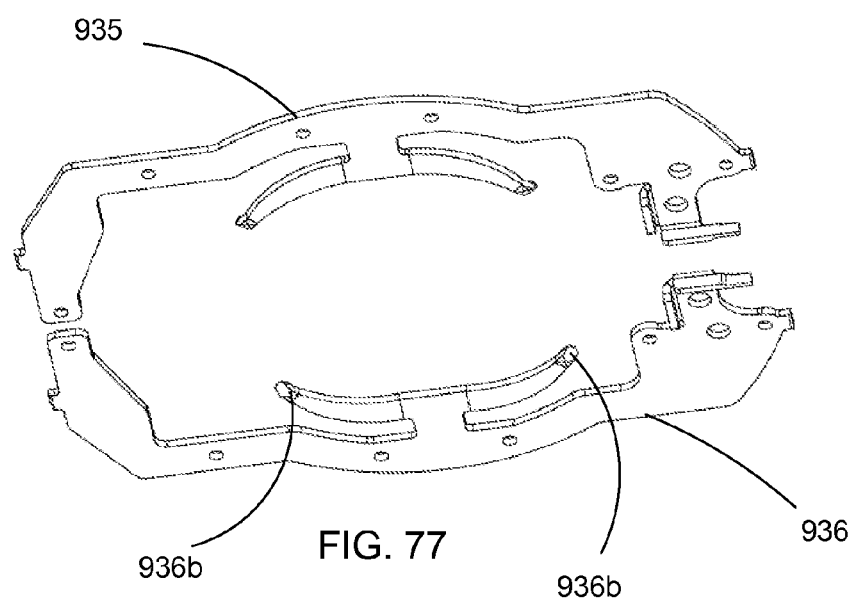
FIG. 77 illustrates a perspective view of an embodiment of terminals suitable for use with the holder depicted in FIG. 75.

FIG. 75 illustrates an embodiment of a holder 930 that includes a base 930a with an outer edge 930b and an aperture 933. The holder includes an integrated connector 940, as discussed above, and can be generally configured as discussed above with contacts, such as contact 936a, positioned therein. The holder 930 thus can include two terminals 935, 936 that are insert molded into the base, similar to how other embodiments can be formed. However, the terminals (such as terminal 936) are configured to be pressed against an LED array rather than soldered to surface contacts on the LED array and each terminal include at least one wing 936b that flexes when pressed against surface contacts of the LED array (thus providing a conventional pressure-based electrical connection). As depicted, two wings are provided for each terminal and the wings extend in opposite directions so as to provide, in operation, a balanced contact force between the terminals and the surface contacts of a corresponding LED array. As can be appreciated, the wings are positioned in the aperture and the terminals extend from one side of the holder to the other side (e.g., there is a single terminal) and provide two types of contacts. As in the other embodiments, however, the terminals need not provide multiple contacts and could be truncated if desired. One advantage of a holder as depicted in FIG. 75 is there is no need for a solder operation when attaching the holder to the LED array. The disadvantage is that the holder 930 is not joined to the LED array and it is possible that for certain applications the holder will need to be aligned with the LED array in a manual operation. For certain applications, however, the holder 930 may be desirable.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A holder, comprising:
a base that is insulative and includes an outer edge and an aperture;
a first terminal that includes a first pad and a first contact electrically connected together; and
a second terminal that includes a second pad and a second contact electrically connected together and electrically insulated from the first pad and first contact, wherein the base supports the first and second terminals and the first and second pads both provide a surface configured to be soldered to a surface contact of a corresponding LED array and wherein the first and second contacts are positioned in the recess so as to provide an integrated connector.

2. The holder of claim 1, further comprising a third terminal and a fourth terminal insert-molded in the base, the third and fourth terminal respectively including third and fourth contacts and third and fourth pads, wherein the third and fourth pads are configured to be soldered to surface contacts of the corresponding LED array and the third and fourth contacts extend away from the first and the second contacts.

3. The holder of claim 2, wherein the base includes a shelf and the third and fourth contacts are positioned on the shelf.

4. The holder of claim 3, wherein the first and second contacts are configured to engage a mating connector in a vertical direction and the third and fourth contacts are horizontal contacts.

5. The hold of claim 4, wherein the base is formed of a resin that is resistant to color change during reflow operation.

6. The holder of claim 1, wherein the base is formed of a resin that is resistant to color change during reflow operation.

7. An LED module, comprising:
- a holder that includes a base that is insulative and includes an outer edge and an aperture and a first recess, the holder further including a first terminal that includes a first pad and a first contact electrically connected together and the holder further including a second terminal that includes a second pad and a second contact electrically connected together and electrically insulated from the first pad and first contact, wherein the base supports the first and second terminals and the first and second contacts are positioned in the first recess so as to provide an integrated connector; and
- an LED array having a plate that supports an LED emitter and a first surface contact and a second surface contact provided on a first surface of the plate, the first surface contact being an anode and the second surface contact being a cathode, the first surface contact soldered to the first pad and the second surface contact being soldered to the second pad.

8. The LED module of claim 7, wherein the first and second terminals are insert molded into the base.

9. The LED module of claim 8, wherein the base includes a second recess and the plate is positioned in the second recess so that the LED emitter is aligned with the aperture.

10. A holder, comprising:
- a base that is insulative and includes an outer edge and an aperture;
- a first terminal that includes a first pad and a first contact electrically connected together; and
- a second terminal that includes a second pad and a second contact electrically connected together and electrically insulated from the first pad and first contact, wherein the base supports the first and second terminals and the first and second pads both provide a surface configured to be electrically and mechanically connected to a surface contact of a corresponding LED array and wherein the first and second contacts are positioned in the recess so as to provide an integrated connector.

11. The holder of claim 10, wherein the first and second contacts are configured to engage a mating connector in a vertical direction.

12. The holder of claim 10, wherein the first and second terminals are insert molded into the base.

\* \* \* \* \*